United States Patent
Bak et al.

(10) Patent No.: US 10,056,543 B2
(45) Date of Patent: Aug. 21, 2018

(54) MAGNETORESISTIVE RANDOM ACCESS MEMORY DEVICE HAVING MAGNETIC TUNNEL JUNCTION AND METHOD OF MANUFACTURING THE SAME

(71) Applicants: Jung-Hoon Bak, Suwon-si (KR); Myoung-Su Son, Seoul (KR); Jae-Chul Shim, Hwaseong-si (KR); Gwan-Hyeob Koh, Seoul (KR); Yoon-Jong Song, Hwaseong-si (KR)

(72) Inventors: Jung-Hoon Bak, Suwon-si (KR); Myoung-Su Son, Seoul (KR); Jae-Chul Shim, Hwaseong-si (KR); Gwan-Hyeob Koh, Seoul (KR); Yoon-Jong Song, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 48 days.

(21) Appl. No.: 15/146,355

(22) Filed: May 4, 2016

(65) Prior Publication Data
US 2017/0054070 A1    Feb. 23, 2017

(30) Foreign Application Priority Data
Aug. 19, 2015 (KR) .................. 10-2015-0116550

(51) Int. Cl.
H01L 21/00 (2006.01)
H01L 43/02 (2006.01)
H01L 43/08 (2006.01)
H01L 43/10 (2006.01)
H01L 43/12 (2006.01)

(52) U.S. Cl.
CPC .............. *H01L 43/02* (2013.01); *H01L 43/08* (2013.01); *H01L 43/10* (2013.01); *H01L 43/12* (2013.01)

(58) Field of Classification Search
CPC ......... H01L 43/02; H01L 43/08; H01L 43/10; H01L 43/12
USPC ............................................. 438/3
See application file for complete search history.

(56) References Cited

U.S. PATENT DOCUMENTS

| | | |
|---|---|---|
| 6,783,995 B2 | 8/2004 | Hineman et al. |
| 6,812,040 B2 | 11/2004 | Kyler et al. |
| 6,977,181 B1 | 12/2005 | Raberg |
| 7,253,009 B2 | 8/2007 | Bangert |
| 7,723,128 B2 | 5/2010 | Wang et al. |
| 8,772,888 B2 | 7/2014 | Jung et al. |
| 8,802,451 B2 | 8/2014 | Malmhall et al. |
| 8,847,338 B2 | 9/2014 | Assefa et al. |
| 2002/0182755 A1 | 12/2002 | Lee |
| 2003/0170919 A1* | 9/2003 | Song ................. H01L 27/11507 438/3 |

(Continued)

*Primary Examiner* — Duy T Nguyen
(74) *Attorney, Agent, or Firm* — Myers Bigel, P.A.

(57) ABSTRACT

In a method of manufacturing an MRAM device, a memory unit including a lower electrode, an MTJ structure and an upper electrode sequentially stacked is formed on a substrate. A protective layer structure including a capping layer, a sacrificial layer and an etch stop layer sequentially stacked is formed on the substrate to cover the memory unit. An insulating interlayer is formed on the protective layer structure. The insulating interlayer is formed to form an opening exposing the protective layer structure. The exposed protective layer structure is partially removed to expose the upper electrode. A wiring is formed on the exposed upper electrode to fill the opening.

19 Claims, 57 Drawing Sheets

(56) References Cited

U.S. PATENT DOCUMENTS

| | | |
|---|---|---|
| 2006/0138576 A1 | 6/2006 | Galdis |
| 2007/0172964 A1 | 7/2007 | Yen et al. |
| 2013/0032775 A1* | 2/2013 | Satoh .................. H01L 45/04 257/1 |
| 2014/0042567 A1* | 2/2014 | Jung .................... H01L 43/08 257/421 |

* cited by examiner

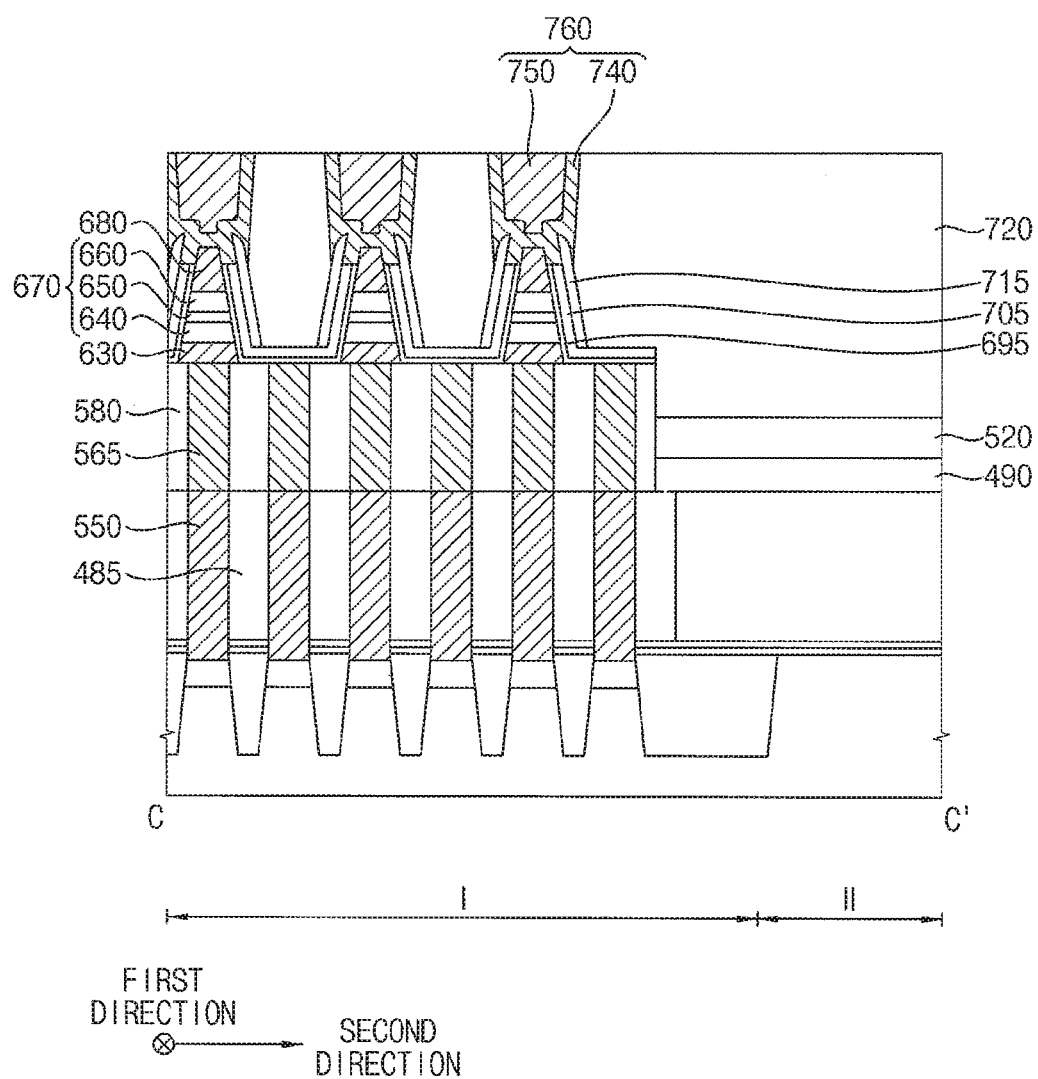

MAGNETORESISTIVE RANDOM ACCESS MEMORY DEVICE HAVING MAGNETIC TUNNEL JUNCTION AND METHOD OF MANUFACTURING THE SAME

CROSS-REFERENCE TO RELATED APPLICATION

This application claims priority under 35 USC § 119 to Korean Patent Application No. 10-2015-0116550, filed on Aug. 19, 2015 in the Korean Intellectual Property Office (KIPO), the contents of which are incorporated by reference herein in their entirety.

BACKGROUND

1. Field

Example embodiments relate to semiconductor devices and methods of manufacturing the same. More particularly, example embodiments relate to magnetoresistive random access memory (MRAM) devices and methods of manufacturing the same.

2. Description of the Related Art

When an MRAM device is manufactured, a lower electrode, a magnetic tunnel junction (MTJ) pattern and an upper electrode may be sequentially formed, and an upper wiring may be formed that is electrically connected to the upper electrode. A capping layer may be formed to cover a plurality of structures, each of which includes the lower electrode, the MTJ pattern and the upper electrode. An insulating interlayer may be formed on the capping layer, and a chemical mechanical polishing (CMP) process may be performed to expose a top surface of the upper electrode of each of the structures. During the CMP process, a portion of the structures may be over etched so that the upper electrodes may be removed. If this occurs, the MTJ patterns thereunder may be electrically short-circuited.

SUMMARY

Example embodiments provide an MRAM device having good characteristics and methods of manufacturing such a device.

According to example embodiments, there is provided a method of manufacturing an MRAM device. In the method, a memory unit including a lower electrode, a magnetic tunnel junction (MTJ) structure and an upper electrode sequentially stacked may be formed on a substrate. A protective layer structure including a capping layer, a sacrificial layer and an etch stop layer sequentially stacked may be formed on the substrate to cover the memory unit. An insulating interlayer may be formed on the protective layer structure. The insulating interlayer may be formed to form an opening exposing the protective layer structure. The exposed protective layer structure may be partially removed to expose the upper electrode. A wiring may be formed in the opening on the exposed upper electrode.

In example embodiments, before forming the insulating interlayer on the protective layer structure, the etch stop layer may be partially removed to expose a portion of the sacrificial layer. When the insulating interlayer is formed on the protective layer structure, the insulating interlayer may be formed on the exposed portion of the sacrificial layer. When the insulating interlayer is partially removed to form the opening exposing the protective layer structure, the opening may be formed to expose the exposed portion of the sacrificial layer.

In example embodiments, when the etch stop layer is partially removed to expose the portion of the sacrificial layer, an anisotropic etching process may be performed on the etch stop layer, so that portions of the etch stop layer except for a portion of the etch stop layer on a sidewall of the memory unit may be removed to expose the portion of the sacrificial layer, the exposed portion of the sacrificial layer being on a top surface of the memory unit.

In example embodiments, when the exposed protective layer structure is partially removed to expose the upper electrode, the exposed portion of the sacrificial layer may be removed to expose a portion of the capping layer. The exposed portion of the capping layer may be removed to expose the upper electrode.

In example embodiments, the sacrificial layer may include a material having etching selectivity with respect to both the capping layer and the etch stop layer. When the exposed portion of the sacrificial layer is removed to expose the portion of the capping layer, the etch stop layer and the capping layer may not be removed.

In example embodiments, when the insulating interlayer is partially removed to form the opening exposing the protective layer structure, a dry etching process may be performed. When the exposed portion of the sacrificial layer is removed to expose the portion of the capping layer, a wet etching process may be performed. When the exposed portion of the capping layer is removed to expose the upper electrode, a wet etching process may be performed.

In example embodiments, when the exposed portion of the sacrificial layer is removed to expose the portion of the capping layer, a portion of the sacrificial layer on a sidewall of the memory unit may be removed to expose a portion of the capping layer on the sidewall of the memory unit.

In example embodiments, when the insulating interlayer is partially removed to form the opening exposing the protective layer structure, the opening may be formed to expose the exposed portion of the sacrificial layer and at least a portion of the etch stop layer on a sidewall of the memory unit.

In example embodiments, when the insulating interlayer is partially removed to form the opening exposing the protective layer structure, the opening may be formed to expose a portion of the etch stop layer on a top surface of the memory unit.

In example embodiments, the capping layer may have a thickness less than that of the etch stop layer.

In example embodiments, the capping layer and the etch stop layer may have substantially the same material.

In example embodiments, the capping layer and the etch stop layer may include silicon nitride.

In example embodiments, the capping layer and the etch stop layer may include different materials from each other.

In example embodiments, the capping layer and the etch stop layer may include a metal oxide and silicon nitride, respectively.

In example embodiments, the sacrificial layer and the insulating interlayer may include silicon oxide.

In example embodiments, the sacrificial layer may include TEOS or ALD oxide, and the insulating interlayer may include HDP oxide.

In example embodiments, when the memory unit is formed on the substrate, a lower electrode layer, an MTJ structure layer and an upper electrode layer may be sequentially formed on the substrate. The upper electrode layer may be patterned to form the upper electrode. The MTJ structure layer and the lower electrode layer may be patterned using the upper electrode as an etching mask to form the MTJ structure and the lower electrode, respectively.

In example embodiments, the upper electrode may have a width that gradually increases from a top toward a bottom thereof, wherein the bottom is closer to the substrate than the top.

In example embodiments, a vertical cross-section of the upper electrode may have a shape of a trapezoid.

In example embodiments, a vertical cross-section of the upper electrode may have a shape similar to a triangle.

In example embodiments, when the wiring is formed on the exposed upper electrode to fill the opening, a barrier layer may be formed on the exposed upper electrode, a sidewall of the opening and the insulating interlayer. A metal layer may be formed on the barrier layer to fill the opening. The metal layer and the barrier layer may be planarized until a top surface of the insulating interlayer is exposed.

In example embodiments, before forming the memory unit on the substrate, a word line may be formed on the substrate. First and second impurity regions may be formed at upper portions of the substrate adjacent to the word line. A source line may be formed to be electrically connected to the first impurity region. A contact plug may be formed to be electrically connected to the second impurity region. The memory unit may be formed to be electrically connected to the memory unit, and the wiring serves as a bit line.

In example embodiments, a conductive pad may be formed on the contact plug, and the memory unit may electrically contact the conductive pad.

According to example embodiments, there is provided a method of manufacturing an MRAM device. In the method, a first structure including a magnetic tunnel junction (MTJ) structure and an upper electrode sequentially stacked may be formed on a substrate. A layer structure including first, second and third layers sequentially stacked may be formed on the substrate to cover the first structure. The third layer of the layer structure may be partially removed to form a third layer pattern exposing a portion of the second layer. An insulating interlayer may be formed on the layer structure. The insulating interlayer may be partially removed to form an opening exposing at least the exposed portion of the second layer. The exposed portion of the second layer may be removed to expose a portion of the first layer. The exposed portion of the first layer may be at least partially removed to expose the upper electrode. A bit line may be formed on the exposed upper electrode.

In example embodiments, an etching selectivity of the second layer with respect to the first layer may be greater than an etching selectivity of the second layer with respect to the insulating interlayer.

In example embodiments, the first and third layers may include silicon nitride, and the second layer and the insulating interlayer may include silicon oxide.

In example embodiments, an etching selectivity of the second layer with respect to the third layer may be greater than an etching selectivity of the second layer with respect to the insulating interlayer.

In example embodiments, when the insulating interlayer is partially removed to form the opening exposing at least the exposed portion of the second layer, the opening may be formed to expose a sidewall of the third layer pattern.

In example embodiments, when the first structure is formed on the substrate, a lower electrode may be formed beneath the MTJ structure.

In example embodiments, before forming the first structure on the substrate, a word line may be formed on the substrate. An impurity region may be formed at an upper portion of the substrate adjacent to the word line. A contact plug may be formed to be electrically connected to the impurity region. The first structure may be electrically connected to the contact plug.

According to example embodiments, there is provided an MRAM device. The MRAM device may include a memory unit including a lower electrode, a magnetic tunnel junction (MTJ) structure and a lower electrode sequentially stacked on top of a substrate, a protective pattern structure including first, second and third layer patterns sequentially stacked on a sidewall of the memory unit, and a wiring on the upper electrode. An uppermost surface of the second layer pattern may be lower than a top surface of the upper electrode, and an uppermost surface of the third layer pattern may be higher than the top surface of the upper electrode.

In example embodiments, an uppermost surface of the first layer pattern may be higher than a bottom surface of the upper electrode.

In example embodiments, the uppermost surface of the second layer pattern may be higher than a bottom surface of the upper electrode.

In example embodiments, an uppermost surface of the first layer pattern may be lower than the top surface of the upper electrode.

In example embodiments, an uppermost surface of the first layer pattern may be substantially coplanar with the uppermost surface of the second layer pattern.

In example embodiments, the upper electrode may have a width that gradually increases from a top toward a bottom thereof.

In example embodiments, a vertical cross-section of the upper electrode may have a shape of a trapezoid.

In example embodiments, a vertical cross-section of the upper electrode may have a shape similar to a triangle.

In example embodiments, the second layer pattern may include a material having an etching selectivity with respect to each of the first and third layer patterns.

In example embodiments, the second layer pattern may include silicon oxide, and the first and third layer patterns may include silicon nitride.

In example embodiments, the second layer pattern may include silicon oxide, the first layer pattern may include a metal oxide, and the third layer pattern may include silicon nitride.

In example embodiments, the wiring may include a metal pattern and a barrier pattern covering a bottom and a sidewall of the metal pattern.

In example embodiments, the barrier pattern may cover an upper portion of the third layer pattern.

In example embodiments, the barrier pattern may cover a top surface and a portion of a sidewall of the upper electrode.

In example embodiments, the MRAM device may further include a word line on the substrate, first and second impurity regions at upper portions of the substrate adjacent to the word line, a source line electrically connected to the first impurity region, and a contact plug electrically connecting the second impurity region to the memory unit. The wiring may be a bit line.

According to example embodiments, there is provided an MRAM device. The MRAM device may include a first insulating interlayer containing a contact plug therein on a substrate, a memory unit including a lower electrode, a magnetic tunnel junction (MTJ) structure and an upper that are electrode sequentially stacked on the first insulating interlayer and being electrically connected to the contact plug, a protective pattern structure covering at least a sidewall of the memory unit and including a capping pattern, an insulation pattern and an etch stop pattern that are sequentially stacked on the first insulating interlayer, a second insulating interlayer on the protective pattern structure, and a wiring extending through the second insulating interlayer and the protective pattern structure to contact a top surface of the upper electrode. The insulation pattern may include a material having an etching selectivity with respect to both of the capping pattern and the etch stop pattern.

In example embodiments, the insulation pattern may include silicon oxide, the capping pattern may include silicon nitride or a metal oxide, and the etch stop pattern may include silicon nitride.

In example embodiments, the protective pattern structure may cover a portion of a top surface of the upper electrode.

According to example embodiments, there is provided an MRAM device. The MRAM device may include a memory unit including a lower electrode, a magnetic tunnel junction (MTJ) structure and an upper electrode that are sequentially stacked on a substrate, a protective pattern structure including a capping pattern and an etch stop pattern that are sequentially stacked on a sidewall of the memory unit, and a wiring on the upper electrode. An air gap may be formed between the capping pattern and the etch stop pattern.

In example embodiments, an uppermost surface of the capping pattern may be higher than a bottom of the upper electrode and lower than an uppermost surface of the upper electrode. An uppermost surface of the etch stop pattern may be higher than the uppermost surface of the upper electrode.

In example embodiments, a top of the air gap may be substantially coplanar with the uppermost surface of the capping pattern.

In example embodiments, the MRAM device may further include an insulating interlayer containing a contact plug therein on the substrate. The memory unit may be formed on the insulating interlayer and electrically connected to the contact plug.

In example embodiments, the capping pattern may be formed on the insulating interlayer. The MRAM device may further include an insulation pattern between a portion of the capping pattern on the insulating interlayer and a bottom of the etch stop pattern.

In example embodiments, the wiring may penetrate through the insulation pattern and the capping pattern, and may contact a top surface of the insulating interlayer.

In example embodiments, the wiring may cover a sidewall of the etch stop pattern.

In the method of manufacture the MRAM device in accordance with example embodiments, the protective layer structure including the capping layer, the sacrificial layer and the etch stop layer sequentially stacked may be formed to cover the top surface and the sidewall of the memory unit including the lower electrode, the MTJ structure and the upper electrode, the second insulating interlayer on the protective layer structure and the protective layer structure may be partially removed to form the opening exposing the upper electrode layer, and the wiring may be formed to fill the opening. Thus, a planarization process, for example, a CMP process may not be performed in order to expose the upper electrode, and thus, even if the wiring commonly contacting the top surfaces of the plurality of memory units is formed, the upper electrodes of ones of the memory units, for example, the upper electrodes of ones of the memory units disposed at outermost positions may not be etched to be damaged. Accordingly, the MTJ structures under the upper electrodes, respectively, may not be electrically short. Additionally, even if the upper electrode and the MTJ structure may not be exactly aligned with each other, since the wiring may be formed after forming the opening exposing the upper electrode, the alignment margin for aligning the upper electrode and the MTJ structure may be increased.

According to example embodiments, a method of manufacturing an MRAM device, comprises: forming a first insulating interlayer on a substrate; forming a contact plug that penetrates the first insulating interlayer; forming a memory unit on the contact plug, the MRAM device comprising a lower electrode, a magnetic tunnel junction (MTJ) on top of the lower electrode, and an upper electrode on top of the MTJ; forming a capping layer on top of the memory unit; forming a sacrificial layer on top of the capping layer; forming an etch stop layer on top of the sacrificial layer; removing a portion of the etch stop layer that is on top of the memory unit; removing a portion of the sacrificial layer that is on top of the memory unit; removing a portion of the capping layer that is on top of the memory unit; and forming a wiring structure on the upper electrode.

In example embodiments, top surface of the etch stop layer extends higher above the substrate than does a top surface of the capping layer and a top surface of the sacrificial layer.

In example embodiments, the method further includes removing a portion of the sacrificial layer that extends along a first sidewall of the memory unit to form an air gap between a portion of the capping layer that extends along the first sidewall of the memory unit and a portion of the etch stop layer that extends along the first sidewall of the memory unit.

In example embodiments, the etch stop layer is directly on the sacrificial layer and the sacrificial layer is directly on the capping layer.

In example embodiments, the capping layer has a first thickness that is less than a second thickness of the sacrificial layer and less than a third thickness of the etch stop layer.

In example embodiments, the sacrificial layer comprises an oxide layer.

In example embodiments, removing the portion of the etch stop layer that is on top of the memory unit comprises performing an anisotropic etching process on the etch stop layer.

In example embodiments, the method further comprises forming an insulating interlayer on the etch stop layer and the sacrificial layer after removing the portion of the etch stop layer that is on top of the memory unit; and partially removing the insulating interlayer to form an opening exposing a top surface of the sacrificial layer.

In example embodiments, the sacrificial layer has etching selectivity with respect to both the capping layer and the etch stop layer.

BRIEF DESCRIPTION OF THE DRAWINGS

Example embodiments will be more clearly understood from the following detailed description taken in conjunction with the accompanying drawings. FIGS. 1 to 74 represent non-limiting, example embodiments as described herein.

FIGS. 1 to 7 are cross-sectional views illustrating stages of a method of manufacturing an MRAM device in accordance with example embodiments;

FIGS. 23 to 74 are cross-sectional views and plan views illustrating stages of a method of manufacturing an MRAM device in accordance with example embodiments.

DESCRIPTION OF EMBODIMENTS

Figure 1:
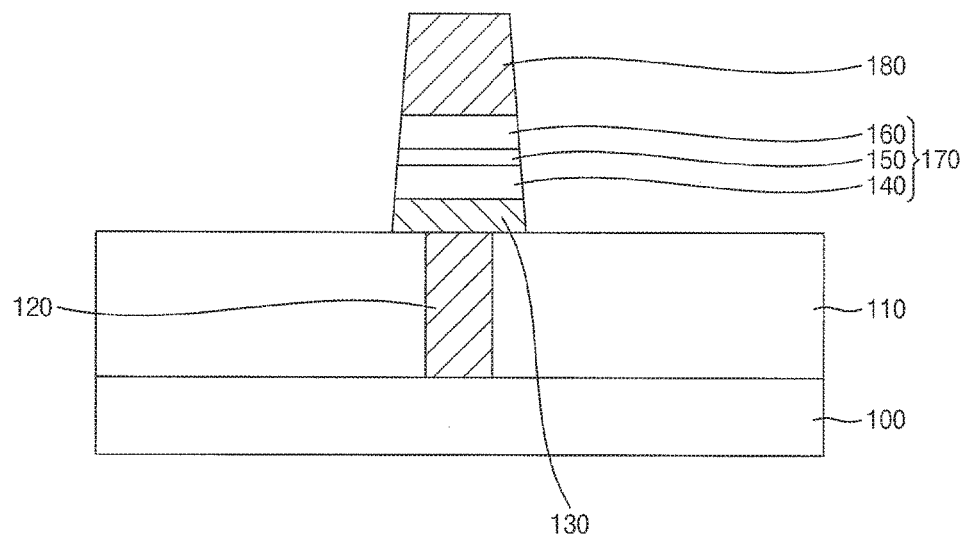

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 7 are cross-sectional views illustrating stages of a method of manufacturing an MRAM device in accordance with example embodiments.

Referring to FIG. 1, a first insulating interlayer 110 may be formed on a substrate 100, and a contact plug 120 may be formed through the first insulating interlayer 110 to contact a top surface of the substrate 100.

The substrate 100 may include a semiconductor material, e.g., silicon, germanium, silicon-germanium, or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

Various types of elements (not shown), e.g., word lines, transistors, diodes, source/drain layers, source lines, wirings, etc. may be formed on the substrate 100.

The first insulating interlayer 110 may be formed on the substrate 100 to cover the elements (e.g., the word lines, transistors, diodes, source/drain layers, source lines, wirings, etc.). The first insulating interlayer 110 may be formed of an oxide, e.g., silicon oxide.

The contact plug 120 may be formed by forming a first opening through the first insulating interlayer 110 to expose a top surface of the substrate 100, forming a conductive layer on the exposed top surface of the substrate 100 and the first insulating interlayer 110 to fill the first opening, and planarizing an upper portion of the conductive layer until a top surface of the first insulating interlayer 110 is exposed. The conductive layer may be formed of a metal, e.g., tungsten, titanium, tantalum, etc., a metal nitride, e.g., tungsten nitride, titanium nitride, tantalum nitride, etc., or doped polysilicon or another conductive material.

A memory unit including a lower electrode 130, a magnetic tunnel junction (MTJ) structure 170, and an upper electrode 180 that are sequentially stacked may be formed on and contacting a top surface of the contact plug 120. The memory unit may also extend onto the first insulating interlayer 110. In an example embodiment, the MTJ structure 170 may include a fixed layer pattern structure 140, a tunnel barrier layer pattern 150 and a free layer pattern 160 that are sequentially stacked.

Particularly, a lower electrode layer, an MTJ structure layer that includes a fixed layer structure, a tunnel barrier layer and a free layer that are sequentially stacked, and an upper electrode layer may be sequentially formed on the first insulating interlayer 110 and the contact plug 120 The upper electrode layer may be patterned by a photolithography process to form the upper electrode 180. The MTJ structure layer including the sequentially stacked fixed layer structure, the tunnel barrier layer and the free layer, and the lower electrode layer may be sequentially patterned using the upper electrode 180 as an etching mask by a dry etching process to form the memory unit including the lower electrode 130 and the MTJ structure 170 including the fixed layer pattern structure 140, the tunnel barrier layer pattern 150 and the free layer pattern 160 sequentially stacked.

The lower and upper electrode layers may be formed of, e.g., a metal and/or a metal nitride.

A barrier layer (not shown) may be further formed on the lower electrode layer, and abnormal growth of metal included in the fixed layer structure that is subsequently formed may be reduced or prevented. The barrier layer may be formed of an amorphous metal or a metal nitride, e.g., tantalum, tantalum nitride, titanium, titanium nitride, etc.

In an example embodiment, the fixed layer structure may include a pinning layer, a lower ferromagnetic layer, an anti-ferromagnetic coupling spacer layer and an upper ferromagnetic layer.

The pinning layer may be formed of, e.g., FeMn, IrMn, PtMn, MnO, MnS, MnTe, $MnF_2$, $FeF_2$, $FeCl_2$, FeO, $CoCl_2$, CoO, $NiCl_2$, NiO, and/or Cr. The lower and upper ferromagnetic layers may be formed of, e.g., Fe, Ni, and/or Co. The anti-ferromagnetic coupling spacer layer may be formed of, e.g., Ru, Ir, and/or Rh.

The tunnel barrier layer may be formed of, e.g., aluminum oxide or magnesium oxide.

The free layer may be formed of, e.g., Fe, Ni, and/or Co.

The dry etching process using the upper electrode 180 as an etching mask may include a plasma reactive etching process or a sputtering process. The plasma reactive etching process may be performed using an etching gas including a fluorine-containing gas and ammonia gas, and a reaction gas including oxygen for reducing or preventing consumption of the upper electrode 180.

In example embodiments, the memory unit may have a width that gradually increases from a top toward a bottom thereof, and particularly, the upper electrode 180 may have a width gradually increasing from a top toward a bottom thereof. In an example embodiment, a vertical cross-section of the upper electrode 180 may have a trapezoidal shape.

The compositions of the MTJ structure 170 and/or the memory unit, and processes for forming the MTJ structure 170 and/or the memory unit may not be limited to the examples described above, and various modifications may be possible.

FIG. 1 shows that a width of the bottom of the memory unit is greater than a width of the top surface of the contact plug 120, however, the inventive concepts are not limited thereto. For example, in other embodiments the width of the bottom of the memory unit may be substantially equal to width of the top surface of the contact plug 120. In still other embodiments, a conductive pad (not shown) may be formed between the contact plug 120 and the memory unit.

Figure 2:
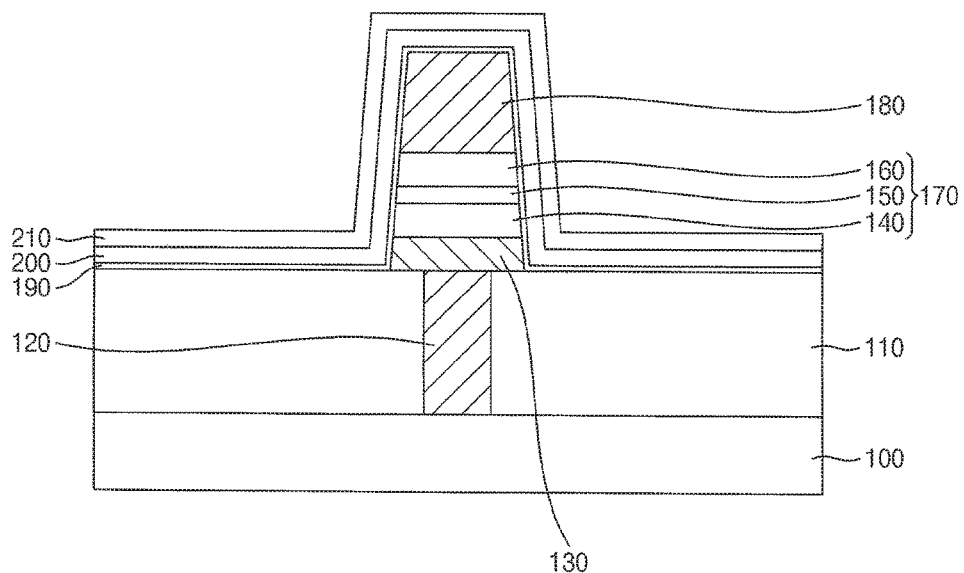

Referring to FIG. 2, a protective layer structure may be formed on the first insulating interlayer 110 to cover the memory unit.

In example embodiments, the protective layer structure may include a capping layer 190, a sacrificial layer 200 and an etch stop layer 210 that are sequentially stacked.

The capping layer 190 may comprise a nitride, e.g., silicon nitride, the sacrificial layer 200 may comprise a material having an etching selectivity with respect to the capping layer 190 and the etch stop layer 210, e.g., silicon oxide, and the etch stop layer 210 may comprise a material having an etching selectivity with respect to a second insulating interlayer 220 (refer to FIG. 4) that is formed during a subsequent processing step, e.g., silicon nitride.

The sacrificial layer 200 may be at least partially removed by an etching process that is subsequently performed, and thus may include an oxide, which may be soft enough to be easily removed, e.g., tetra ethyl ortho silicate (TEOS). In some example embodiments, the capping layer 190 may be formed of a metal oxide, e.g., aluminum oxide, instead of silicon nitride.

In example embodiments, the capping layer 190 may have a thickness that is less than the thicknesses of the sacrificial layer 200 and the etch stop layer 210, so as to be easily removed by the subsequently performed etching process.

Figure 3:
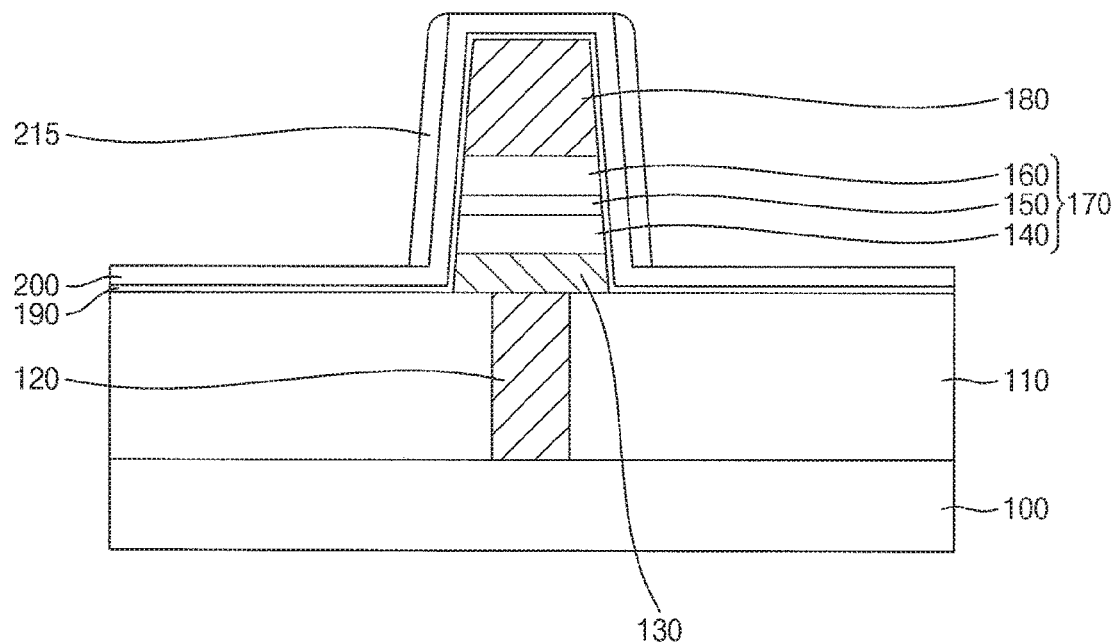

Referring to FIG. 3, a portion of the etch stop layer 210 on a top surface of the memory unit may be removed to partially expose the sacrificial layer 200.

In example embodiments, an anisotropic etching process may be performed on the etch stop layer 210 to remove the portion of the etch stop layer 210 that is on the top surface of the memory unit, as well as portions of the etch stop layer 210 that are on a top surface of the first insulating interlayer 110 may be also removed. Thus, the etch stop layer 210 may remain only on a sidewall of the memory unit, which may be referred to as an etch stop pattern 215, hereinafter.

Since the etch stop pattern 215 may remain only on the sidewall of the memory unit, at least a portion of the sacrificial layer 200 on the top surface of the memory unit may be exposed.

Figure 4:
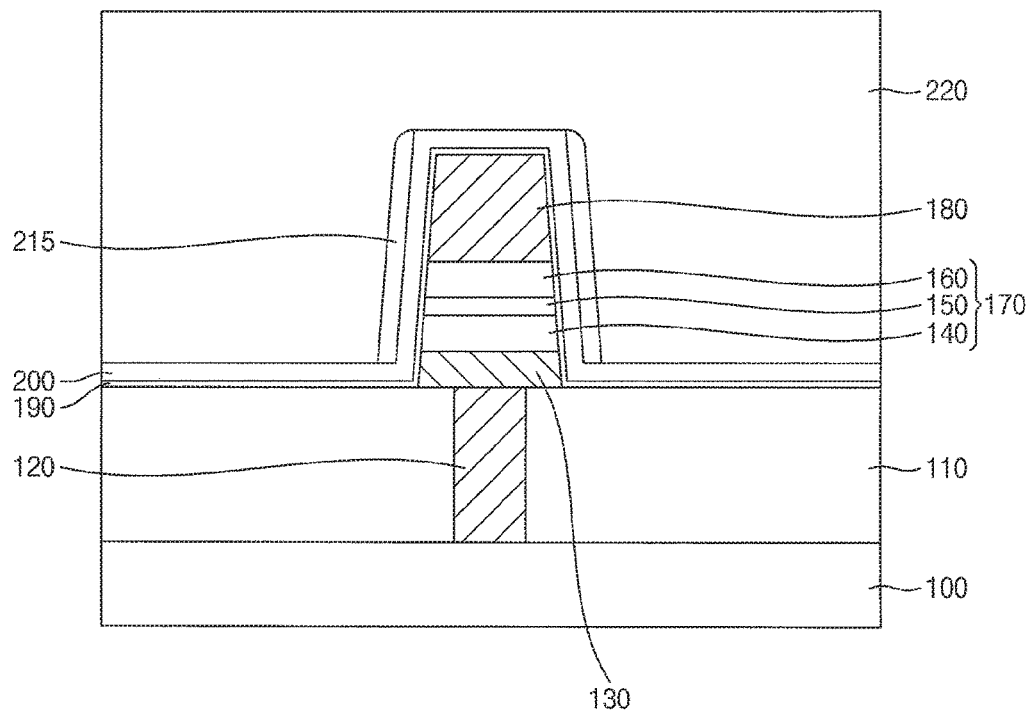

Referring to FIG. 4, the second insulating interlayer 220 may be formed on the protective layer structure.

In example embodiments, the second insulating interlayer 220 may have a top surface that extends higher above the substrate 100 than does the exposed portion of the sacrificial layer 200. The second insulating interlayer 220 may be an oxide, e.g., silicon oxide. In an example embodiment, the second insulating interlayer 220 may be an oxide, which may be harder than the sacrificial layer 200, e.g., high density plasma (HDP) oxide.

Figure 5:
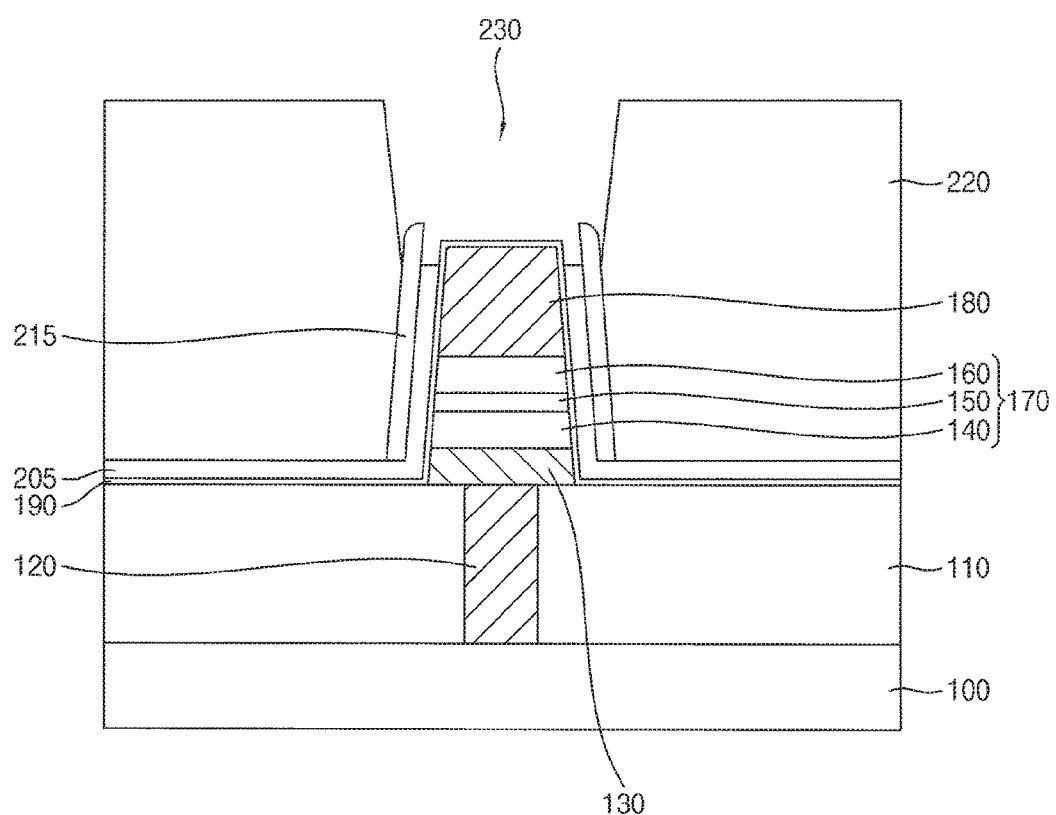

Referring to FIG. 5, a second opening 230 may be formed through the second insulating interlayer 220 to partially expose the protective layer structure.

In example embodiments, a dry etching process may be used to partially remove the second insulating interlayer 220 so that the portion of the sacrificial layer 200 exposed by the anisotropic etching process illustrated with reference to FIG. 3 may be removed. A wet etching process may be further performed on the exposed portion of the sacrificial layer 200 to expose the capping layer 190 thereunder. Thus, the sacrificial layer 200 may be transformed into a sacrificial pattern 205. The sacrificial pattern 205 may include an insulating material, e.g., oxide, and thus may be also referred to as an insulation pattern.

By the dry etching process, at least the portion of the sacrificial layer 200 on the top surface of the memory unit may be exposed, and by the wet etching process, a portion of the capping layer 190 on the top surface of the memory unit may be exposed.

In example embodiments, the dry etching process may expose both a portion of the sacrificial layer 200 that is on the top surface of the memory unit and also a portion of the etch stop pattern 215 on the sidewall of the memory unit The wet etching process may partially remove the sacrificial layer 200 to expose a portion of the capping layer 190 on the sidewall of the memory unit. However, a portion of the sacrificial layer 200 that is below a bottom of the upper electrode 180 may not be removed, and thus an uppermost surface of the sacrificial pattern 205 may be higher above the substrate 100 than is the bottom of the upper electrode 180. The etch stop pattern 215 may include a material having etching selectivity with respect to the second insulating interlayer 220, e.g., silicon nitride, and thus, even if the etch stop pattern 215 may be partially exposed by the dry etching process, it may not be removed.

Alternatively, the second insulating interlayer 220 and the sacrificial layer 200 may be simultaneously removed using a dry etching process. Since the second insulating interlayer 220 and the sacrificial layer 200 may commonly include silicon oxide, they may both be removed by the same dry etching process.

The sacrificial layer 200 may include a material having an etching selectivity with respect to the capping layer 190 and the etch stop pattern 215, and thus the capping layer 190 and the etch stop pattern 215 may not be removed in the etching process.

Figure 6:
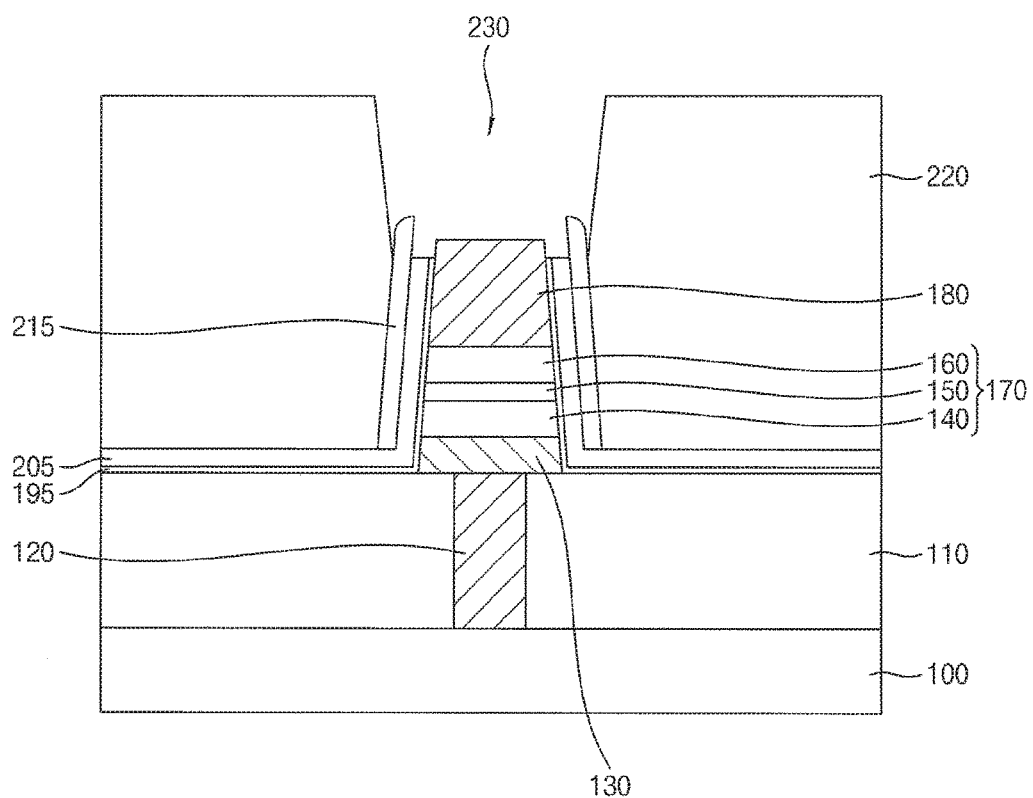

Referring to FIG. 6, the exposed portion of the capping layer 190 may be removed to expose the upper electrode 180, and thus the capping layer 190 may be transformed into a capping pattern 195.

In example embodiments, the exposed portion of the capping layer 190 may be removed by a wet etching process. Thus, a portion of the capping layer 190 that is not covered by the sacrificial pattern 205 may be removed.

In an example embodiment, a portion of the capping layer 190 on the top surface of the memory unit, i.e., a top surface of the upper electrode 180 may be removed, and thus the top surface of the upper electrode 180 may be exposed. In other embodiments, a portion of the capping layer 190 on the sidewall of the memory unit, i.e., a sidewall of the upper electrode 180 may be also removed, and thus not only the top surface of the upper electrode 180 but also an upper portion of the sidewall of the upper electrode 180 may be exposed. In an example embodiment, an uppermost surface of the capping pattern 195 formed by the etching process may be substantially coplanar with the uppermost surface of the sacrificial pattern 205.

The capping layer 190 may have a very small thickness, and thus may be removed in a short time. Accordingly, the upper electrode 180 under the capping layer 190 may not be damaged during the etching process. When the capping layer 190 includes silicon nitride as the etch stop pattern 215, the etch stop pattern 215 may also be partially removed. However, the thickness of the capping layer 190 is less than that of the etch stop pattern 215, and thus only small amount of the etch stop pattern 215 may be removed during the etching process that removes the portion of the capping layer 190 on the upper surface of the upper electrode 180. Accordingly, an uppermost surface of the etch stop pattern 215 may be higher above the substrate 100 than is the top surface of the upper electrode 180.

The capping pattern 195, the sacrificial pattern 205 and the etch stop pattern 215 that are sequentially stacked on the sidewall of the memory unit may form a protective pattern structure.

Figure 7:
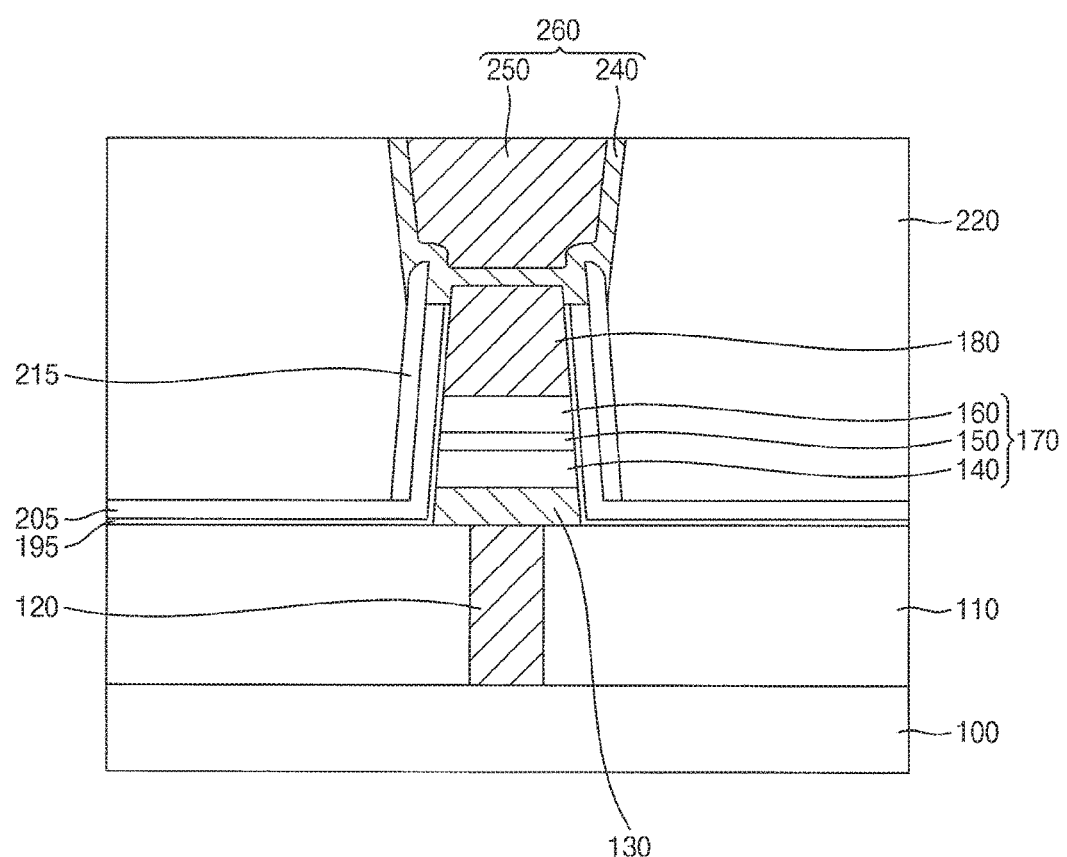

Referring to FIG. 7, a wiring 260 may be formed on the memory unit, i.e., on the upper electrode 180 to fill the second opening 230.

In example embodiments, a barrier layer may be formed on the upper electrode 180, a sidewall of the second opening 230 and the upper surface of the second insulating interlayer 220, a metal layer may be formed on the barrier layer to fill the second opening 230, and the metal layer and the barrier layer may then be planarized until a top surface of the second insulating interlayer 220 is exposed to form the wiring 260 including a barrier pattern 240 and a metal pattern 250. In example embodiments, the planarization process may be performed by a chemical mechanical polishing (CMP) process and/or an etch back process.

In example embodiments, not only the upper electrode 180 but also the protective pattern structure may be partially exposed by the second opening 230, and thus the wiring 260 may be formed to contact both of the upper electrode 180 and the protective pattern structure.

The barrier layer may be formed of a metal nitride, e.g., tantalum nitride, titanium nitride, etc., and/or a metal, e.g., tantalum, titanium, etc. The metal layer may be formed of a metal, e.g., tungsten, copper, aluminum, etc.

By the above processes, the MRAM device may be manufactured. The MRAM device may include a plurality of memory units, and the wiring 260 may be formed to commonly contact ones of the plurality of memory units. The wiring 260 may serve as a bit line.

As illustrated above, the protective layer structure including the sequentially stacked capping layer 190, the sacrificial layer 200 and the etch stop layer 210 may be formed to cover the top surface and the sidewall of the memory unit including the lower electrode 130, the MTJ structure 170 and the upper electrode 180, the second insulating interlayer 220 and the protective layer structure may be partially removed to form the second opening 230 exposing the upper electrode layer 180, and the wiring 260 may be formed to fill the second opening 230. Thus, a planarization process, for example, a CMP process may not be performed in order to expose the upper electrode 180, and thus, even if the wiring 260 commonly contacting the top surfaces of the plurality of memory units is formed, the upper electrodes 180 of ones of the memory units, for example, the upper electrodes 180 of ones of the memory units disposed at outermost positions may not be damaged. Accordingly, the MTJ structures 170 under the upper electrodes 180, respectively, may not be electrically short.

Before forming the second insulating interlayer 220 on the protective layer structure, the portion of the etch stop layer 210 on the top surface of the memory unit may be removed to partially expose the sacrificial layer 200. Thus, the second opening 230 through the second insulating layer that exposes the upper electrode 180 may be formed to expose not only a portion of the protective layer structure on the top surface of the memory unit but also a portion of the protective layer structure on the sidewall of the memory unit.

When the sacrificial layer 200 is exposed by the second opening 230, which may be formed by a dry etching process, even though the etch stop pattern 215 on the sidewall of the memory unit may be exposed by the second opening 230, the etch stop pattern 215 may include a material having etching selectivity with respect to the second insulating interlayer 220, and thus may not be removed by the dry etching process. Accordingly, even though the portion of the sacrificial layer 200 on the top surface of the memory unit may be removed by a wet etching process, a portion of the sacrificial layer 200 on the sidewall of the memory unit may be covered by the etch stop pattern 215 is not removed, and as a result, the sidewall of the memory unit may not be damaged. Thus, the second opening 230 may be formed to expose not only the top surface of the memory unit but also the etch stop pattern 215 on the sidewall of the memory unit, and the process margin for forming the second opening 230 may be increased.

Figure 8:
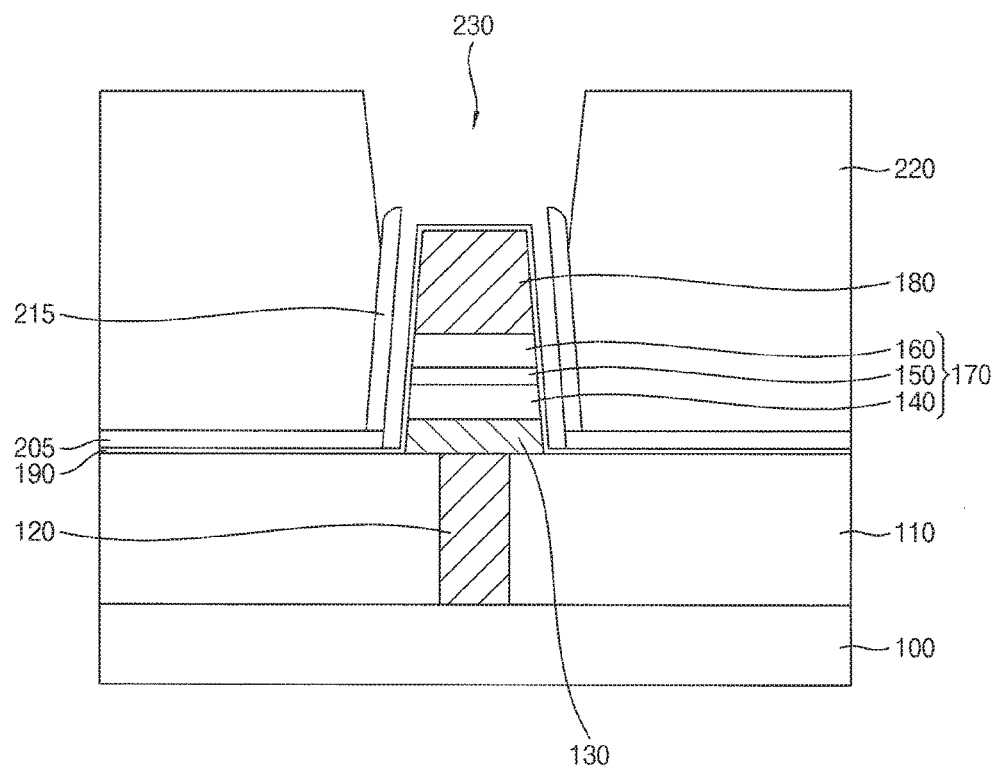
FIGS. 8 to 10 are cross-sectional views illustrating stages of a method of manufacturing an MRAM device in accordance with example embodiments.
Figure 9:
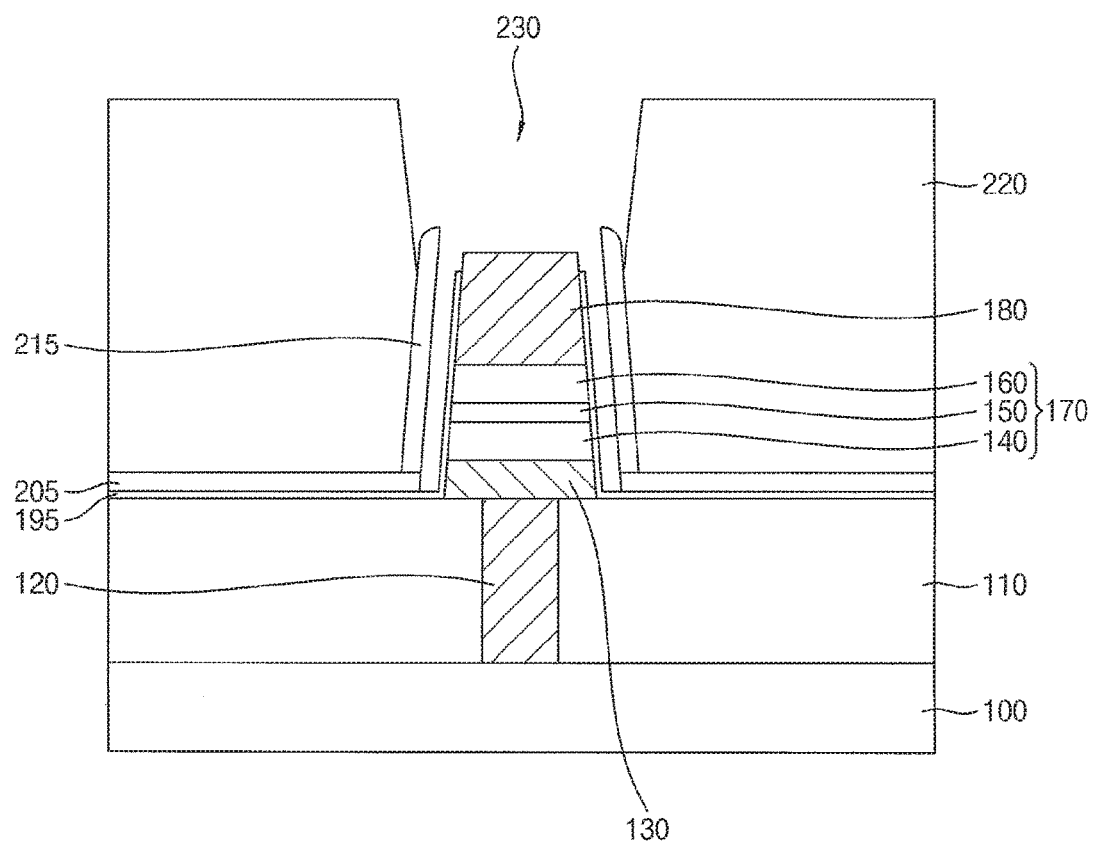
Figure 10:
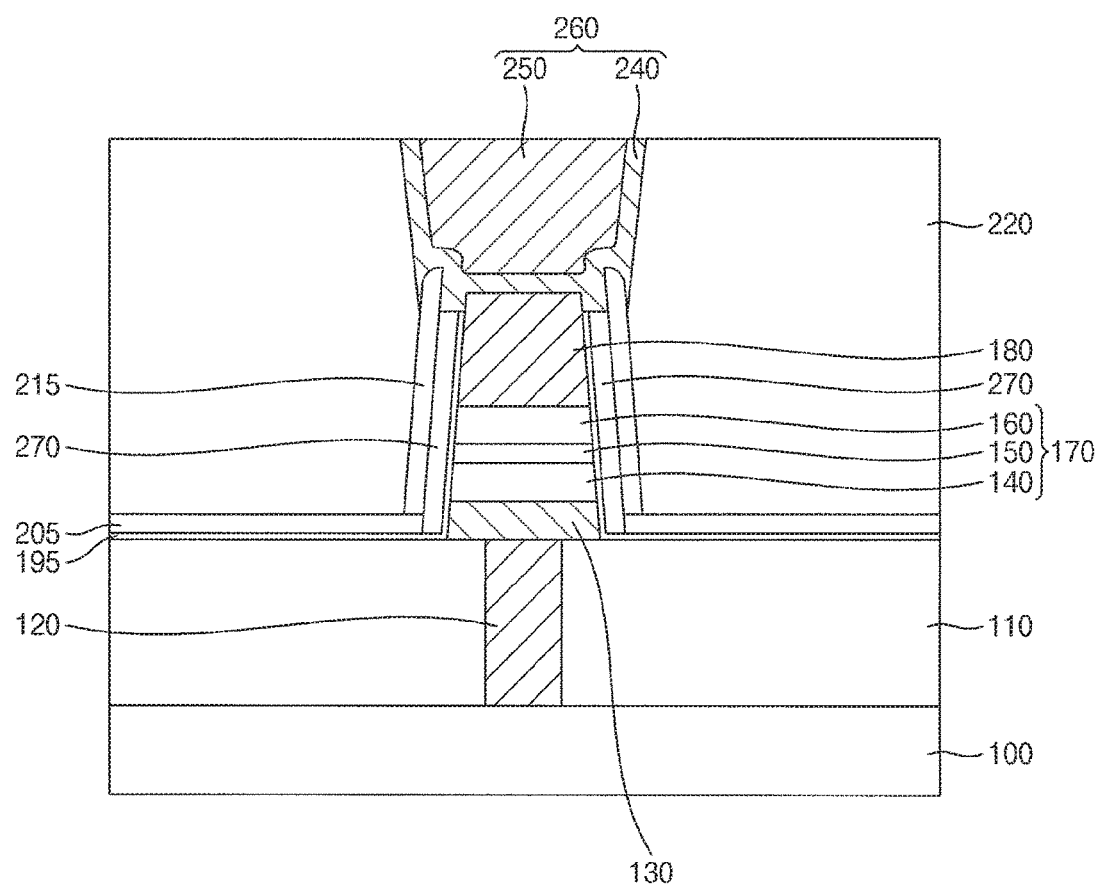

FIGS. 8 to 10 are cross-sectional views illustrating stages of a method of manufacturing an MRAM device in accordance with example embodiments. This method may include processes substantially the same as or similar to those illustrated with reference to FIGS. 1 to 7, and detailed descriptions thereon may be omitted herein.

First, processes substantially the same as or similar to those illustrated with reference to FIGS. 1 to 4 may be performed.

Referring to FIG. 8, a process substantially the same as or similar to that illustrated with reference to FIG. 5 may be performed to form the second opening 230.

However, unlike the process of FIG. 5, in the process of FIG. 8 all portions of the sacrificial layer 200 on the sidewall of the memory unit may be removed. Particularly, a dry etching process may be performed to partially remove the second insulating interlayer 220, so that a portion of the sacrificial layer 200 on the top surface of the memory unit is removed. Additionally, a wet etching process may be performed on the exposed portion of the sacrificial layer 200 to expose the capping layer 190 thereunder. Both the portion of the sacrificial layer 200 on the top surface of the memory unit and the entirety of the portion of the sacrificial layer 200 on the sidewall of the memory unit may be removed, and thus the sacrificial pattern 205 may remain only on the top surface of the first insulating interlayer 110.

As a result, a lower portion of the second opening 230, which may be formed by removing the second insulating interlayer 220 and the sacrificial layer 200, may be formed to be adjacent to a lower portion of the sidewall of the memory unit. Accordingly, not only a portion of the capping layer 190 on the top surface of the memory unit but also portions of the capping layer 190 that are on the sidewall of the memory unit may be exposed.

Referring to FIG. 9, a process substantially the same as or similar to that illustrated with reference to FIG. 6 may be performed.

Particularly, the exposed portion of the capping layer 190 on the top surface of the upper electrode 180 and/or on the upper portion of the sidewall of the upper electrode 180 may be removed by a wet etching process to form the capping pattern 195, and thus the top surface of the upper electrode 180 and/or the upper portion of the sidewall of the upper electrode 180 may be exposed. In other embodiments, the exposed portion of the capping layer 190 may be removed by a dry etching process.

In example embodiments, even though the whole portion of the capping layer 190 on the sidewall of the memory unit is exposed, there is a very small space between the portion of the capping layer 190 on the sidewall of the memory unit and the etch stop pattern 215, and thus the portion of the capping layer 190 on the sidewall of the memory unit may not be completely removed except for a portion of the capping layer 190 on the upper portion of the sidewall of the memory unit. In an example embodiment, an uppermost surface of the capping pattern 195 covering the sidewall of the memory unit may be higher above the substrate 100 than is a bottom of the upper electrode 180.

Referring to FIG. 10, a process substantially the same as or similar to that illustrated with reference to FIG. 7 may be performed.

Thus, the wiring 260 including the barrier pattern 240 and the metal pattern 250 may be formed on the upper electrode 180 and the protective pattern structure to fill the second opening 230. The wiring 260, i.e., the barrier pattern 240 may not fill a lower portion of the second opening 230 adjacent to the lower sidewall of the memory unit, and thus an air gap 270 may be formed. In an example embodiment, a top of the air gap 270 may be substantially coplanar with the uppermost surface of the capping pattern 195.

Figure 11:
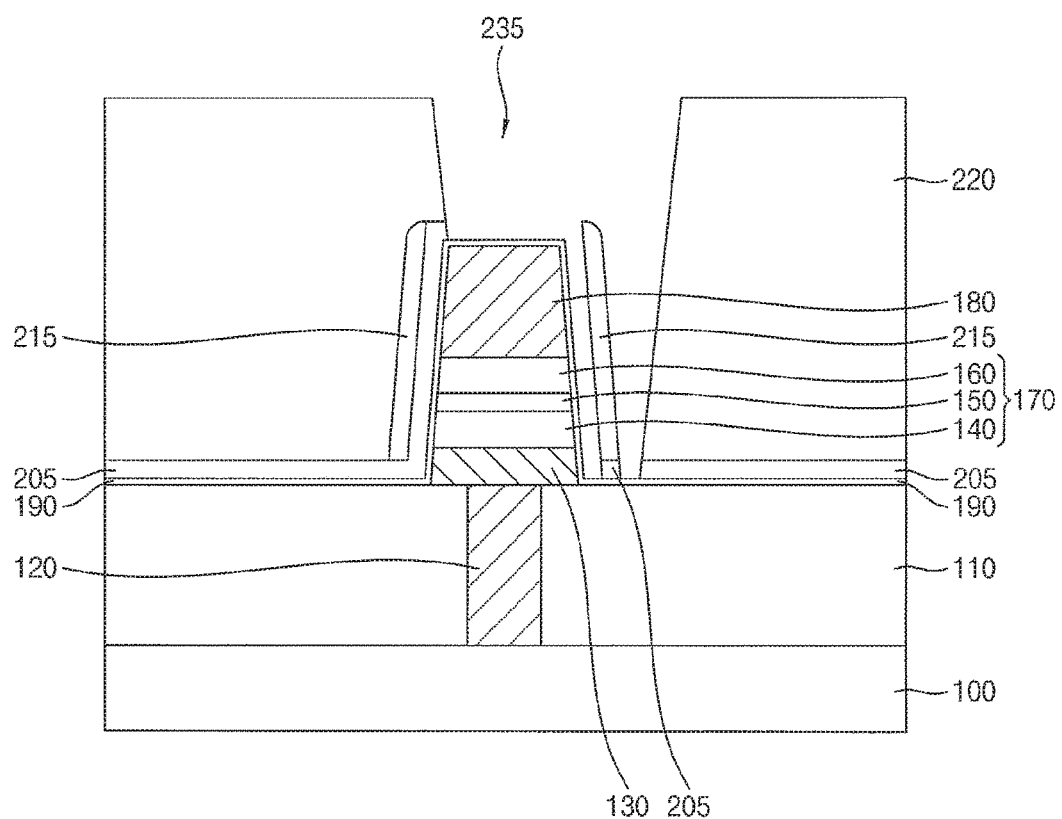
FIGS. 11 to 13 are cross-sectional views illustrating stages of a method of manufacturing an MRAM device in accordance with example embodiments.
Figure 12:
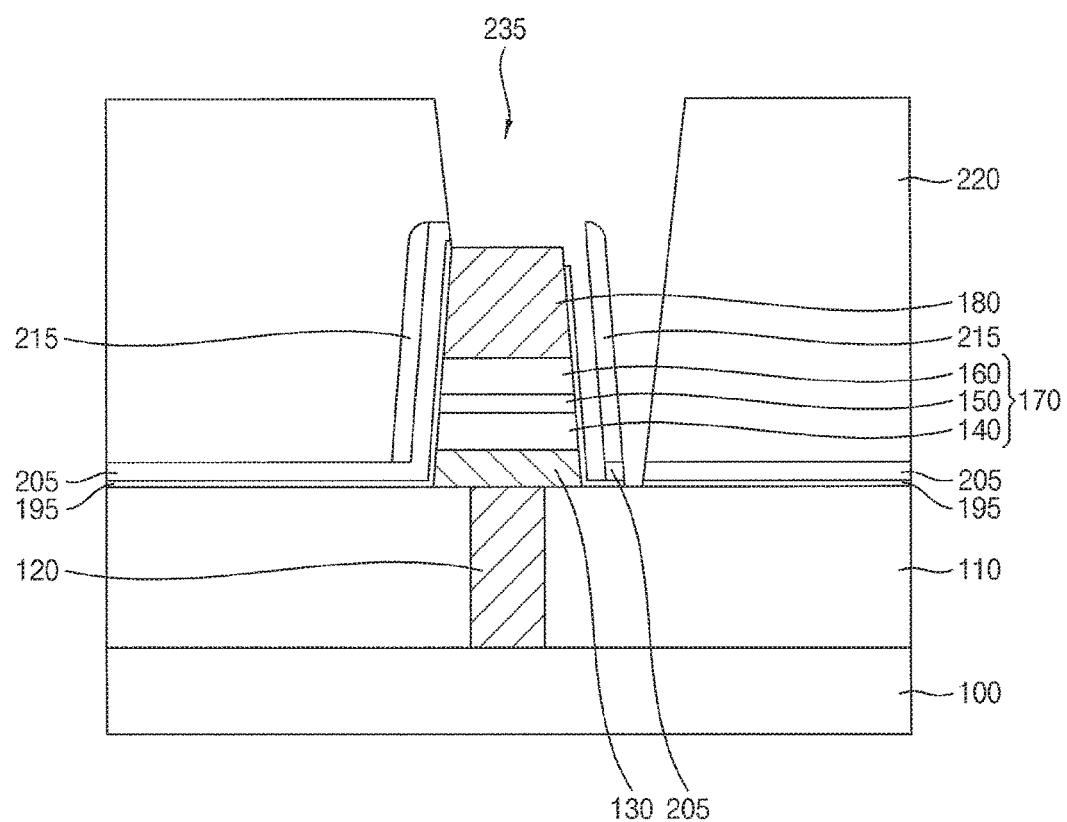
Figure 13:
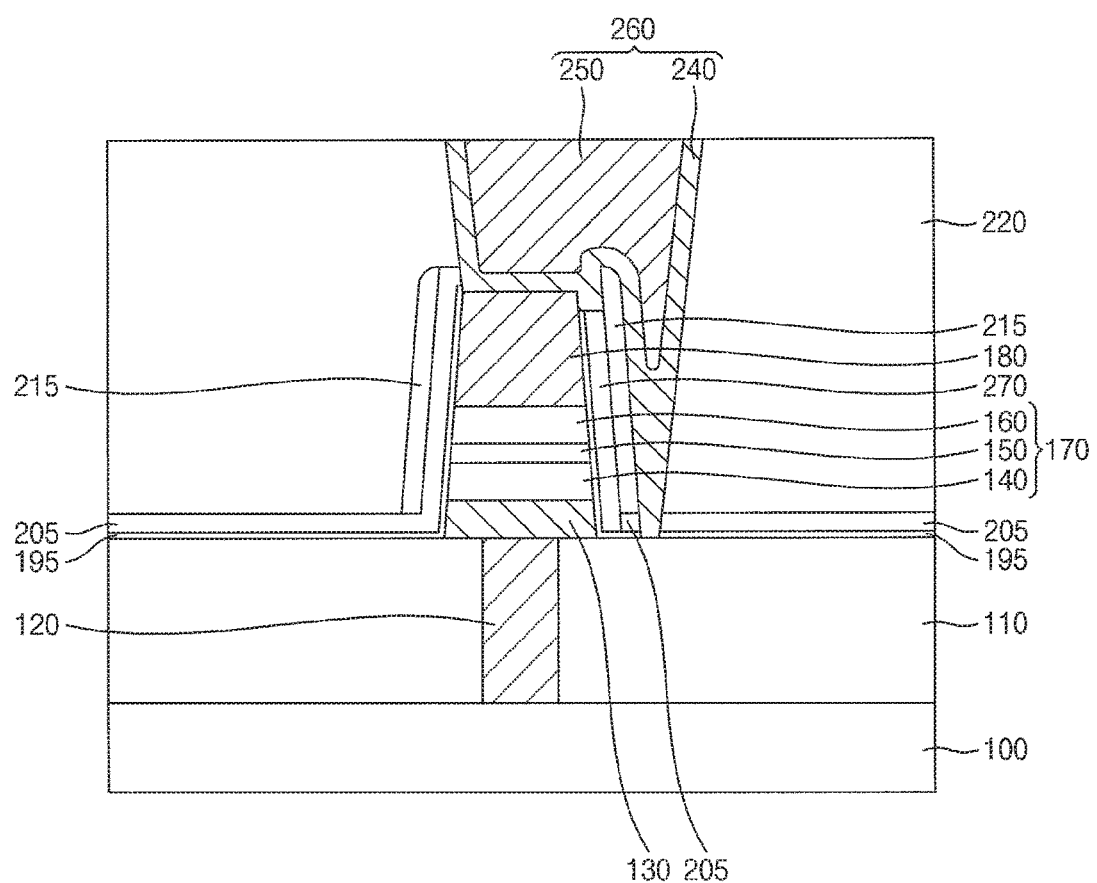

FIGS. 11 to 13 are cross-sectional views illustrating stages of a method of manufacturing an MRAM device in accordance with example embodiments. This method may include processes substantially the same as or similar to those illustrated with reference to FIGS. 1 to 7, and detailed descriptions thereon may be omitted herein.

First, processes substantially the same as or similar to those illustrated with reference to FIGS. 1 to 4 may be performed.

Referring to FIG. 11, a process similar to that illustrated with reference to FIG. 5 may be performed to form a third opening 235.

Unlike the second opening 230 of FIG. 5, the third opening 235 may expose not only a portion of the sacrificial layer 200 on the top surface of the memory unit, but also the etch stop pattern 215 on the sidewall of the memory unit, and further a portion of the sacrificial layer 200 on a portion of the top surface of the first insulating interlayer 110 adjacent to an outer sidewall of the etch stop pattern 215. Thus, portions of the sacrificial layer 200 on the top surface and the sidewall of the memory unit and on the top surface of the first insulating interlayer 110 may be removed.

The third opening 235 may be formed by mis-alignment when the second opening 230 may be formed by removing the portion of the sacrificial layer 200 on the top surface of the memory unit. However, in example embodiments, the etch stop pattern 215 may include a material having etching selectivity with respect to the second insulating interlayer 220 and/or the sacrificial layer 200, and thus may not be removed by the etching process for forming the third opening 235.

Accordingly, the third opening 235, which may be formed by partially removing the second insulating interlayer 220 and the sacrificial layer 200, may include a portion adjacent to the lower sidewall of the memory unit and a portion adjacent to the outer sidewall of the etch stop pattern 215. Thus, not only a portion of the capping layer 190 on the top surface of the memory unit but also a portion of the capping layer 190 on the sidewall of the memory unit may be exposed.

Referring to FIG. 12, a process substantially the same as or similar to that illustrated with reference to FIG. 6 may be performed.

Particularly, the exposed portion of the capping layer 190 on the top surface of the upper electrode 180 and/or the exposed portion of the capping layer 190 on the upper portion of the sidewall of the upper electrode 180 may be removed by a wet etching process to form the capping pattern 195, and thus the top surface of the upper electrode 180 and/or the upper portion of the sidewall of the upper electrode 180 may be exposed. Alternatively, the exposed portions of the capping layer 190 may be removed by a dry etching process.

In example embodiments, even though the portion of the capping layer 190 on the sidewall of the memory unit is exposed, there is a very small space between the portion of the capping layer 190 on the sidewall of the memory unit and the etch stop pattern 215, and thus the portion of the capping layer 190 on the sidewall of the memory unit may not be completely removed except for a portion of the capping layer 190 on the upper portion of the sidewall of the memory unit. In an example embodiment, an uppermost surface of the capping pattern 195 covering the sidewall of the memory unit may be higher above the substrate 100 than is a bottom of the upper electrode 180. However, the portion of the capping layer 190 on the top surface of the first insulating interlayer 110 exposed by the third opening 235 may be removed.

Referring to FIG. 13, a process substantially the same as or similar to that illustrated with reference to FIG. 7 may be performed.

Thus, the wiring 260 including the barrier pattern 240 and the metal pattern 250 may be formed on the upper electrode 180 and the protective pattern structure to fill the third opening 235. The wiring 260, i.e., the barrier pattern 240 may not fill a lower portion of the third opening 235 adjacent to the lower sidewall of the memory unit, and thus the air gap 270 may be formed. In an example embodiment, a top of the air gap 270 may be substantially coplanar with the uppermost surface of the capping pattern 195.

A lower portion of the wiring 260 may cover the outer sidewall of the etch stop pattern 215, and may contact a top surface of the first insulating interlayer 110.

Figure 14:
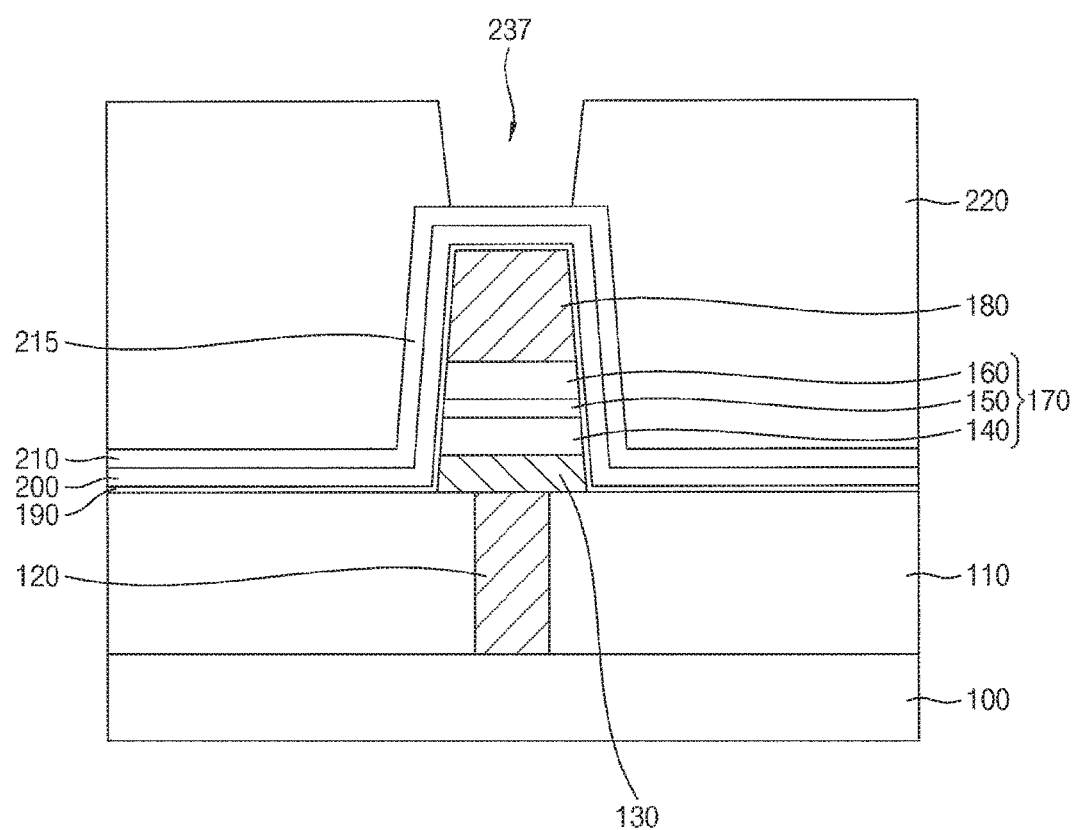
FIGS. 14 to 16 are cross-sectional views illustrating stages of a method of manufacturing an MRAM device in accordance with example embodiments.
Figure 15:
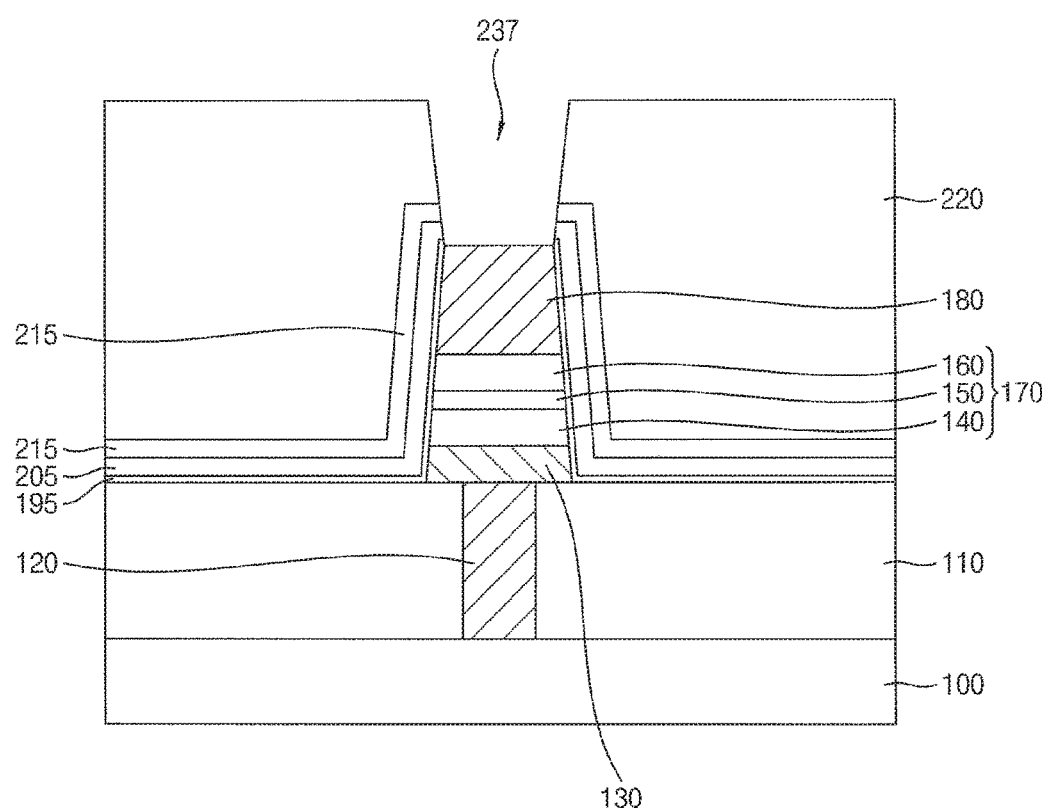
Figure 16:
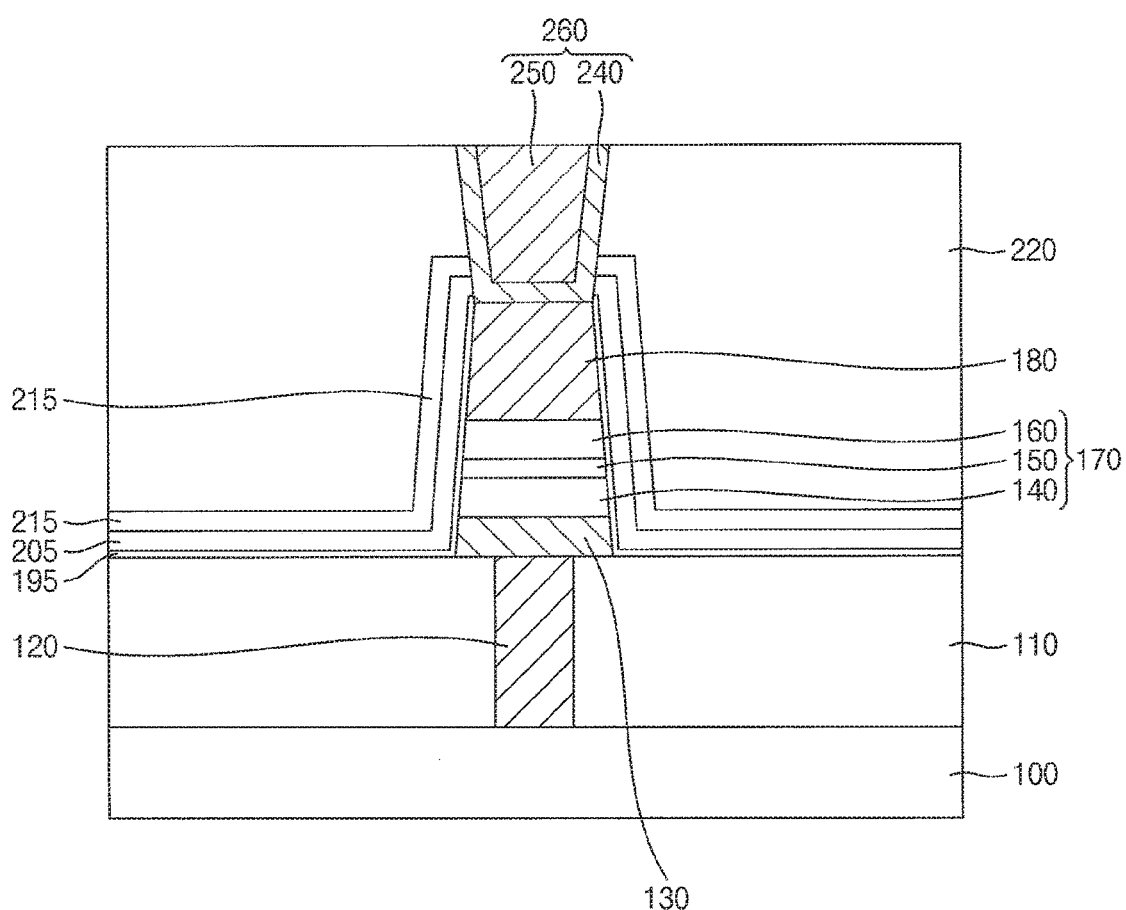
Figure 17:
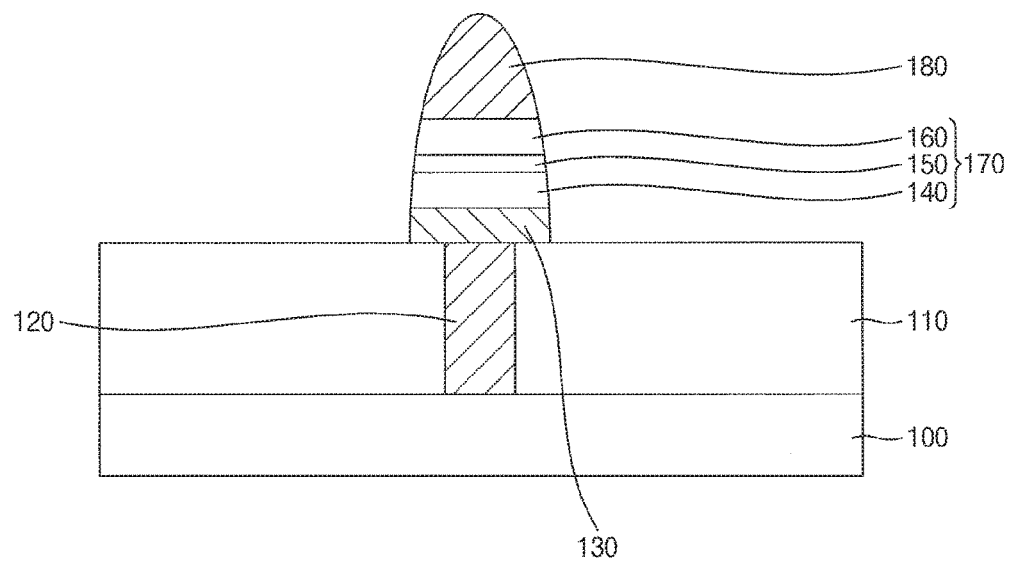
FIGS. 17 to 22 are cross-sectional views illustrating stages of a method of manufacturing an MRAM device in accordance with example embodiments.

FIGS. 14 to 16 are cross-sectional views illustrating stages of a method of manufacturing an MRAM device in accordance with example embodiments. This method may include processes substantially the same as or similar to those illustrated with reference to FIGS. 1 to 7, and detailed descriptions thereon are omitted herein.

First, processes substantially the same as or similar to those illustrated with reference to FIGS. 1, 2 and 4 may be performed.

Particularly, the first insulating interlayer 110 containing the contact plug 120 may be formed on the substrate 100, the memory unit may be formed to contact a top surface of the contact plug 120, and the protective layer structure may be formed to cover the memory unit. Without removing a portion of the etch stop layer 210 of the protective layer structure, the second insulating interlayer 220 may be formed on the protective layer structure.

The second insulating interlayer 220 may be partially removed to form a fourth opening 237 exposing a portion of the etch stop layer 210 on a top surface of the memory unit.

Referring to FIG. 15, a process similar to that illustrated with reference to FIG. 6 may be performed.

Particularly, the exposed portion of the etch stop layer 210 may be removed, and portions of the sacrificial layer 200 and the capping layer 190 thereunder may be sequentially removed to expose a top surface of the upper electrode 180.

Thus, the capping layer 190, the sacrificial layer 200 and the etch stop layer 210 may be transformed into the capping pattern 195, the sacrificial pattern 205 and the etch stop pattern 215, respectively.

The etch stop layer 210, the sacrificial layer 200 and the capping layer 190 may be removed by a dry etching process and/or a wet etching process.

Referring to FIG. 16, a process substantially the same as or similar to that illustrated with reference to FIG. 7 may be performed.

Thus, the wiring 260 including the barrier pattern 240 and the metal pattern 250 may be formed on the upper electrode 180 to fill the fourth opening 237.

In the method of manufacturing the MRAM device in accordance with the present embodiment, before forming the second insulating interlayer 220 on the protective layer structure, the process for partially removing the etch stop layer 210 to partially expose the sacrificial layer 200 may not be performed. Thus, if the fourth opening 237 exposes portions of the protective layer structure on the sidewall of the memory unit, the sidewall of the memory unit may be exposed by the process for sequentially removing the etch stop layer 210, the sacrificial layer 200 and the capping layer 190, and thus the MTJ structures 170 included in the memory unit may be electrically short. Accordingly, in the present embodiment, the fourth opening 237 may be formed to expose only the portion of the protective layer structure on the top surface of the memory unit.

FIGS. 17 to 22 are cross-sectional views illustrating stages of a method of manufacturing an MRAM device in accordance with example embodiments. This method may include processes substantially the same as or similar to those illustrated with reference to FIGS. 1 to 7, and detailed descriptions thereon are omitted herein.

First, a process substantially the same as or similar to that illustrated with reference to FIG. 1 may be performed.

However, when the memory unit is formed using the upper electrode 180 as an etching mask, the upper electrode 180 may be partially etched to have a vertical cross-section similar to a triangle or a portion of an ellipse.

Figure 18:
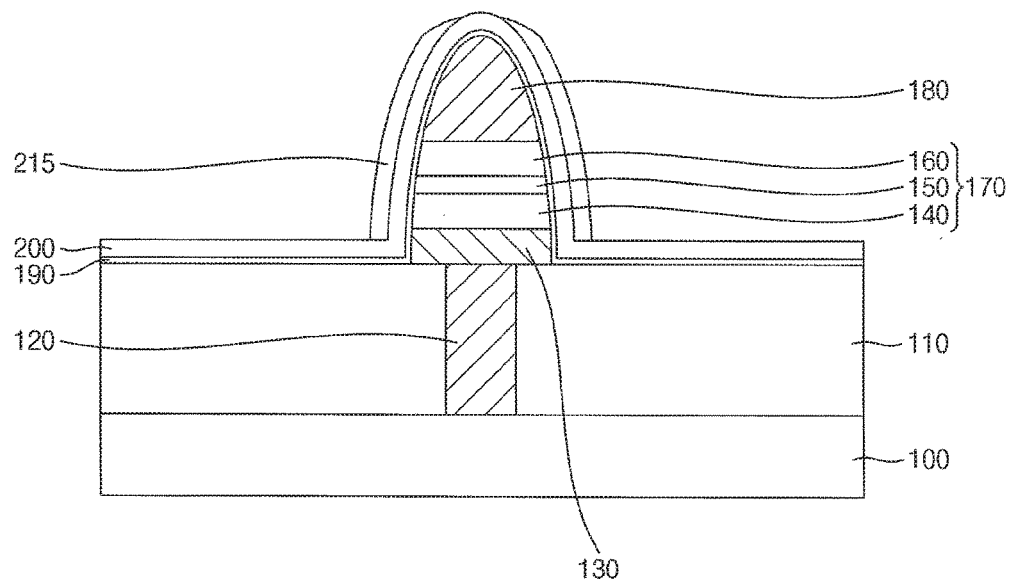

Referring to FIG. 18, processes substantially the same as or similar to those illustrated with reference to FIGS. 2 and 3 may be performed.

Thus, after forming the protective layer structure covering the memory unit, the etch stop layer 210 of the protective layer structure may be anisotropically etched to form the etch stop pattern 215, and a portion of the sacrificial layer 200 adjacent to an uppermost portion of the memory unit may be exposed.

Figure 19:
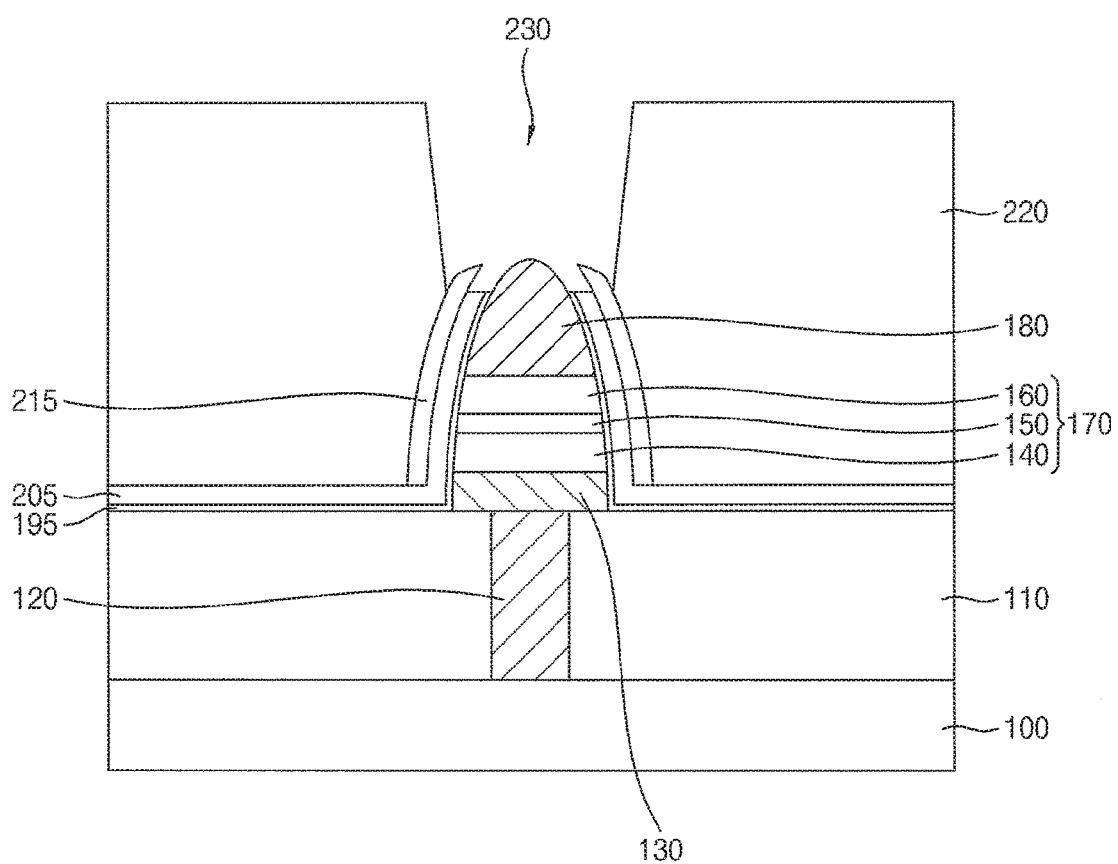

Referring to FIG. 19, processes substantially the same as or similar to those illustrated with reference to FIGS. 4 to 6 may be performed.

Particularly, the second insulating interlayer 220 may be formed on the protective layer structure, a portion of the second insulating interlayer 220 and the portion of the sacrificial layer 200 adjacent to the uppermost portion of the memory unit may be removed to form the second opening 230 exposing a portion of the capping layer 190 that covers the uppermost portion of the memory unit, and the exposed portion of the capping layer 190 may be removed.

Accordingly, the uppermost portion of the memory unit, i.e., the uppermost portion of the upper electrode 180 may be exposed.

Figure 20:
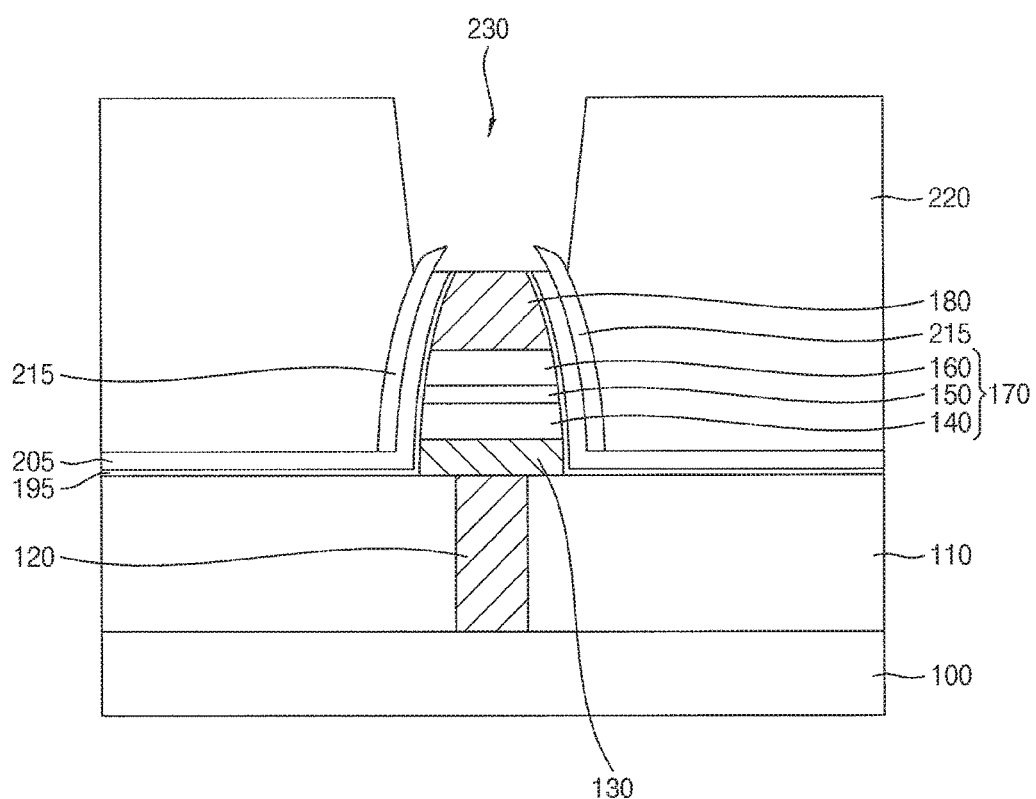

Referring to FIG. 20, when the exposed portion of the capping layer 190 is removed, the exposed uppermost portion of the upper electrode 180 may also be removed.

As the upper electrode 180 may have the cross-section of a triangular or partial elliptical shape, the uppermost portion of the upper electrode 180 may have a very small width, and thus may be removed during the removal of the portion of the capping layer 190. Particularly, when the capping layer 190 includes a metal oxide, e.g., aluminum oxide instead of silicon nitride, the capping layer 190 may be more easily removed when the upper electrode 180 including a metal is removed.

In an example embodiment, a top surface of the upper electrode 180 may be substantially coplanar with an uppermost surface of the capping pattern 195 and/or an uppermost surface of the sacrificial pattern 205, and the upper electrode 180 may have a cross-section of a trapezoid. Alternatively, the top surface of the upper electrode 180 may be higher above the substrate 100 than is the uppermost surface of the capping pattern 195 and/or the uppermost surface of the sacrificial pattern 205.

Figure 21:
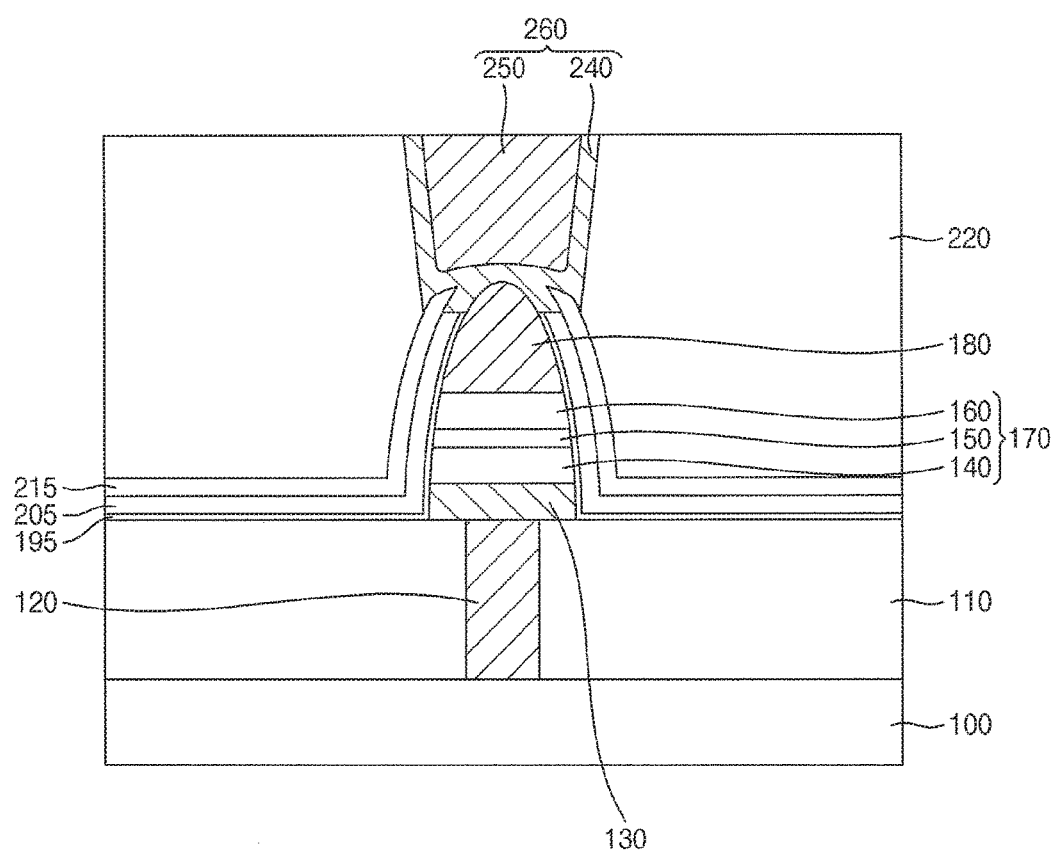
Figure 22:
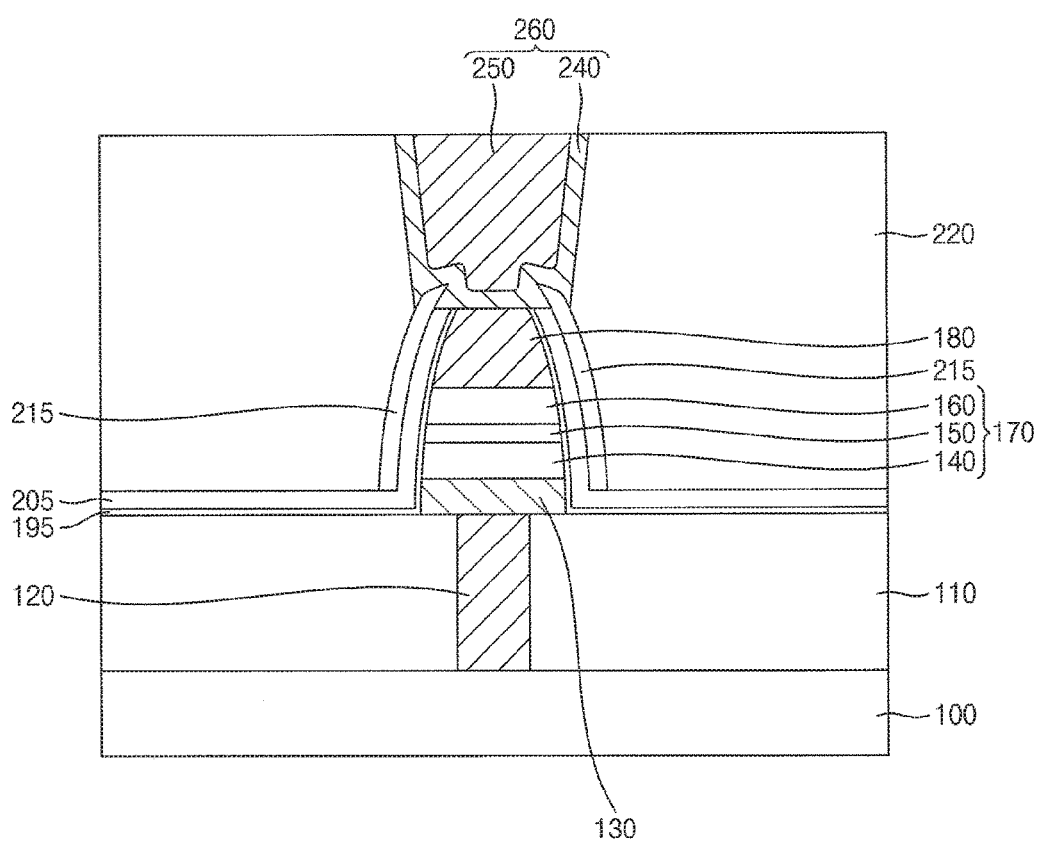

Referring to FIGS. 21 and 22, processes substantially the same as or similar to those illustrated with reference to FIGS. 19 and 20 may be performed, and a process substantially the same as or similar to that illustrated with reference to FIG. 7 may be performed to form the wiring 260 filling the second opening 230. Thus, the MRAM device may be manufactured.

Figure 23:
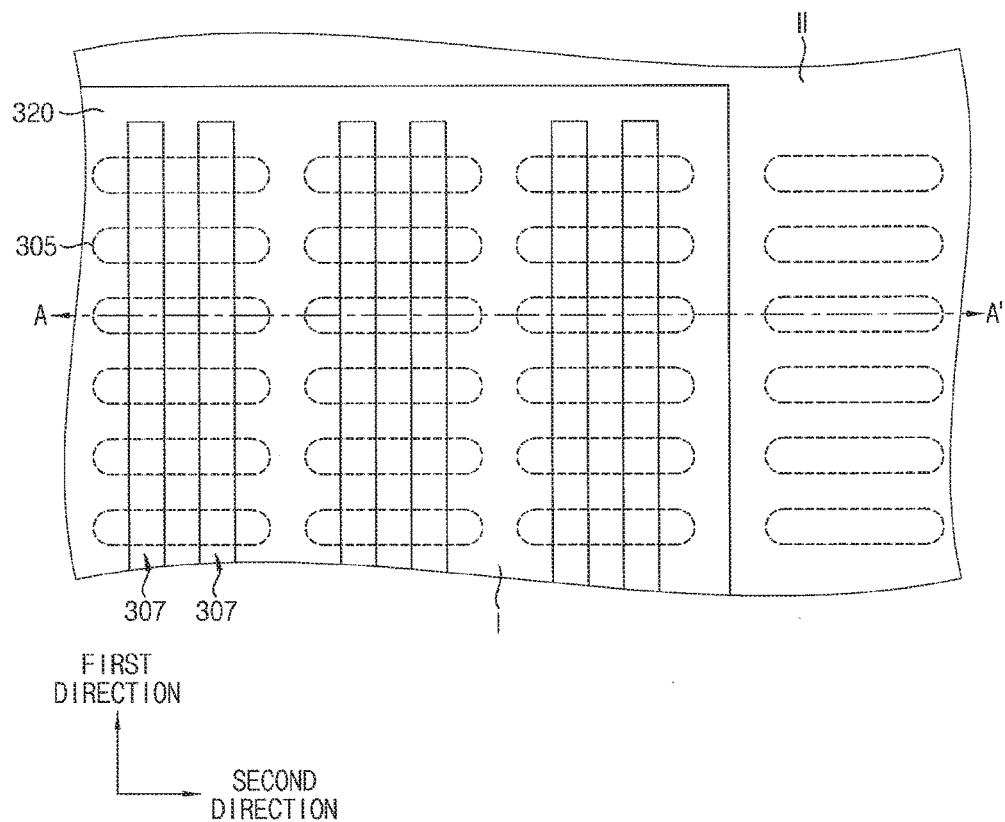

FIGS. 23 to 74 are cross-sectional views and plan views illustrating stages of a method of manufacturing an MRAM device in accordance with example embodiments. Particularly, FIGS. 24-25, 27, 29-30, 32-33, 35, 37, 39, 41-43, 46, 48-49, 52, 54, 56, 58-60, 62-65, 67, 69, 71, and 73-74 are vertical cross-sectional views of the MRAM device, FIGS. 44 and 50 are horizontal cross-sectional views of the MRAM device, and FIGS. 23, 26, 28, 31, 34, 36, 38, 40, 45, 47, 51, 53, 55, 57, 61, 66, 68, 70 and 72 are plan views of the MRAM device.

Figure 43:
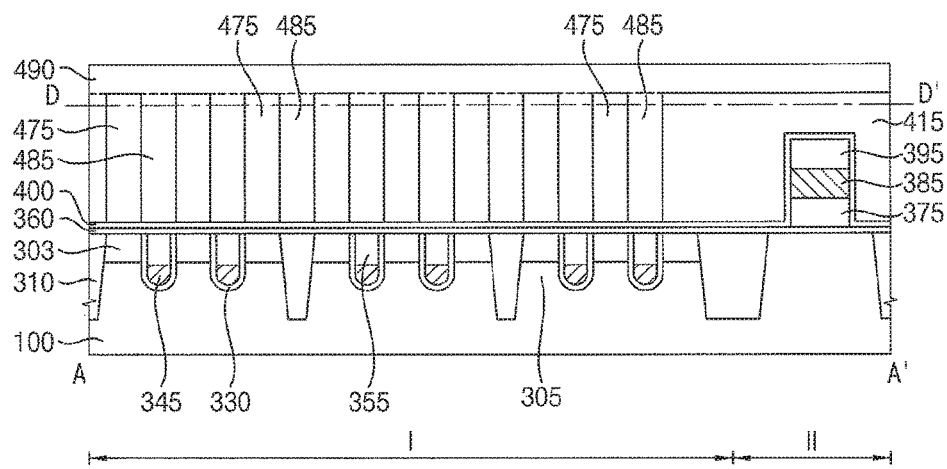
Figure 44:
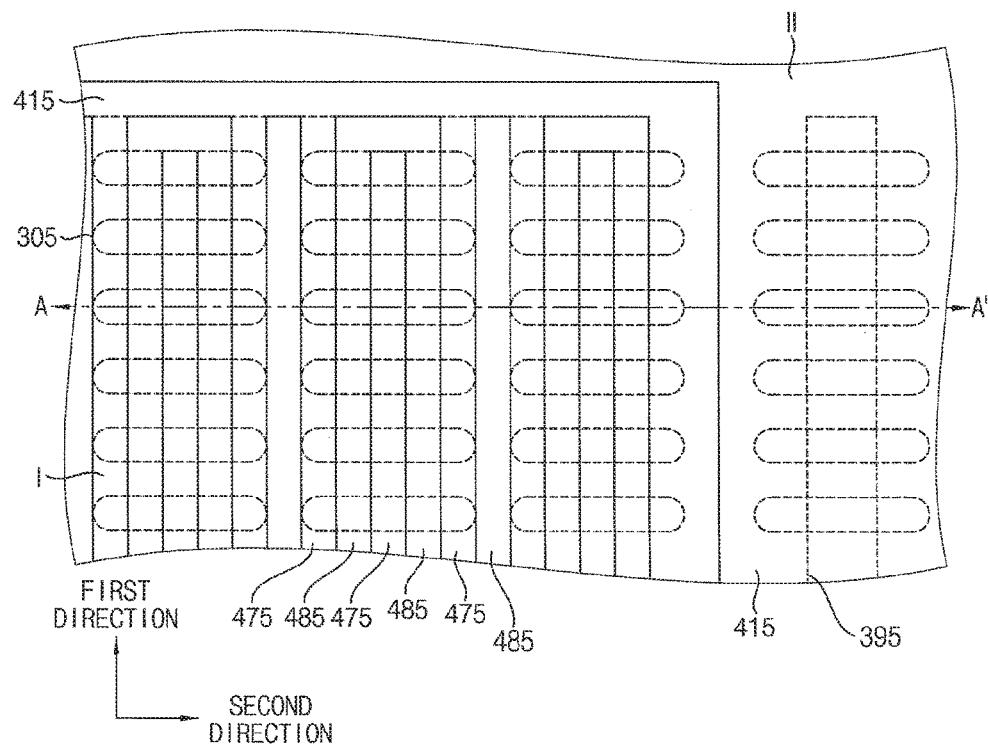
Figure 49:
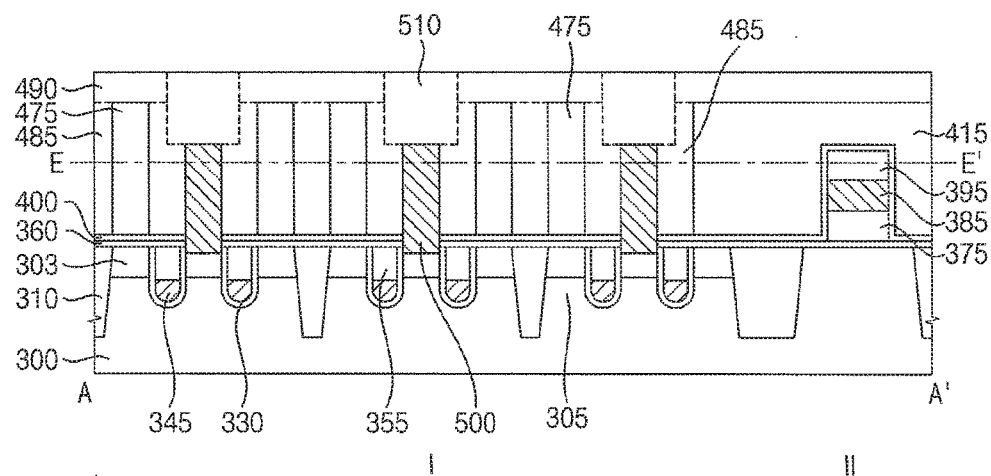
Figure 50:
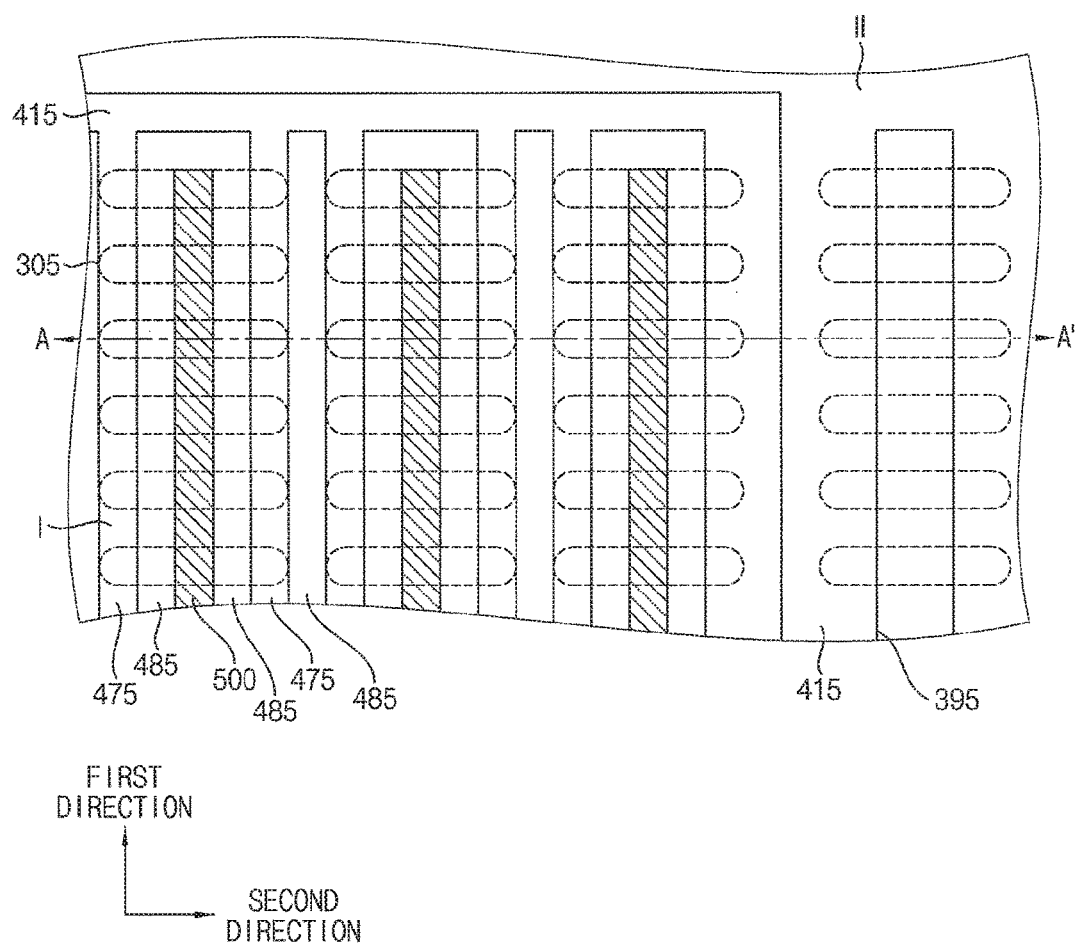
Figure 60:
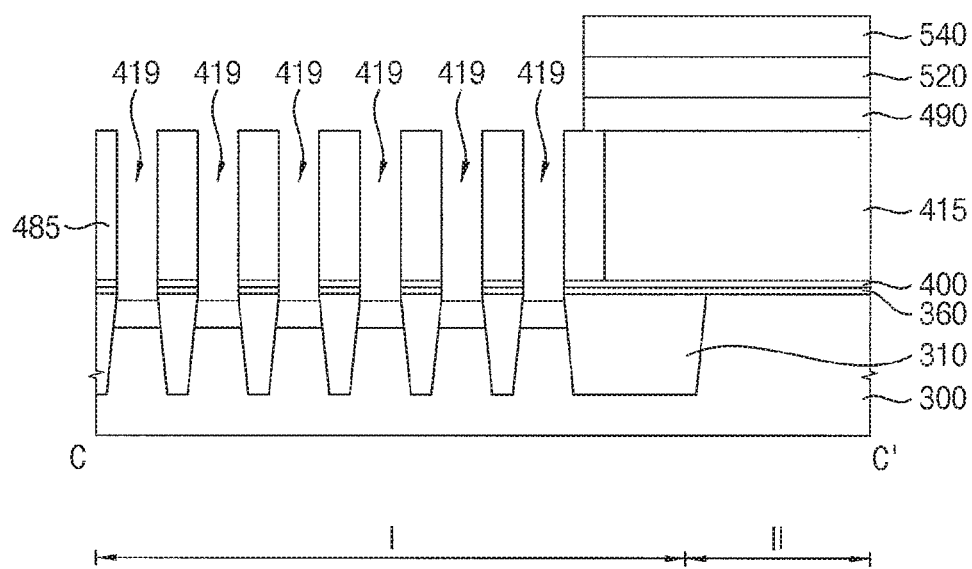
Figure 61:
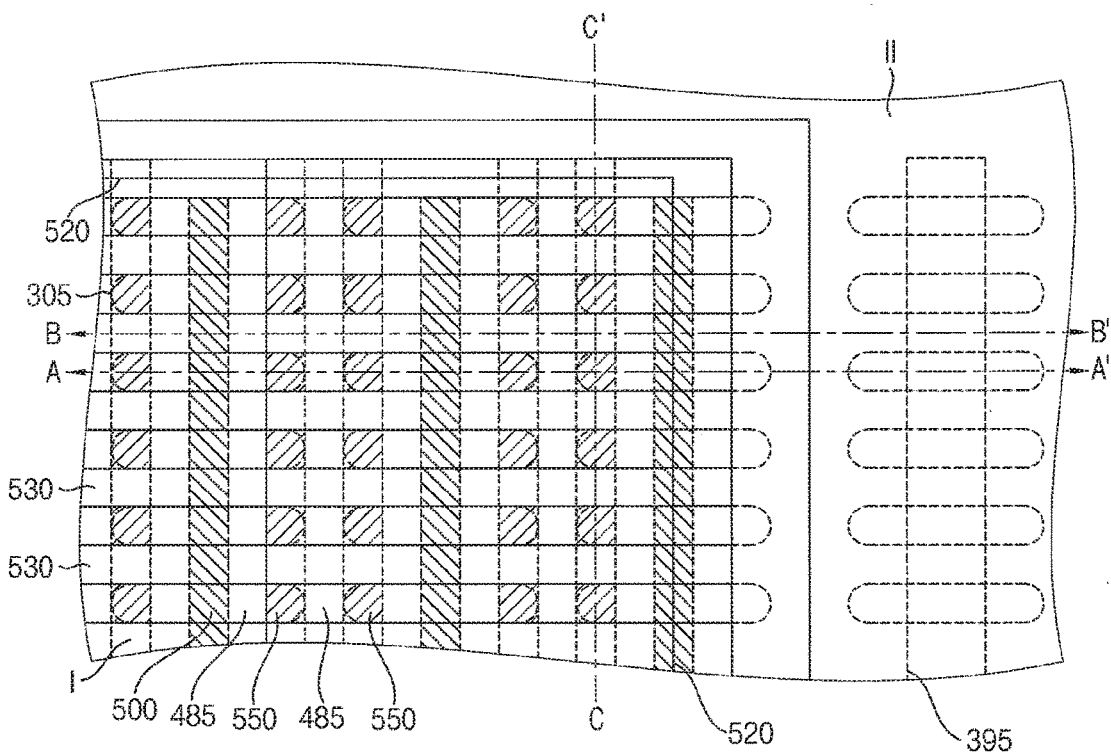
Figure 62:
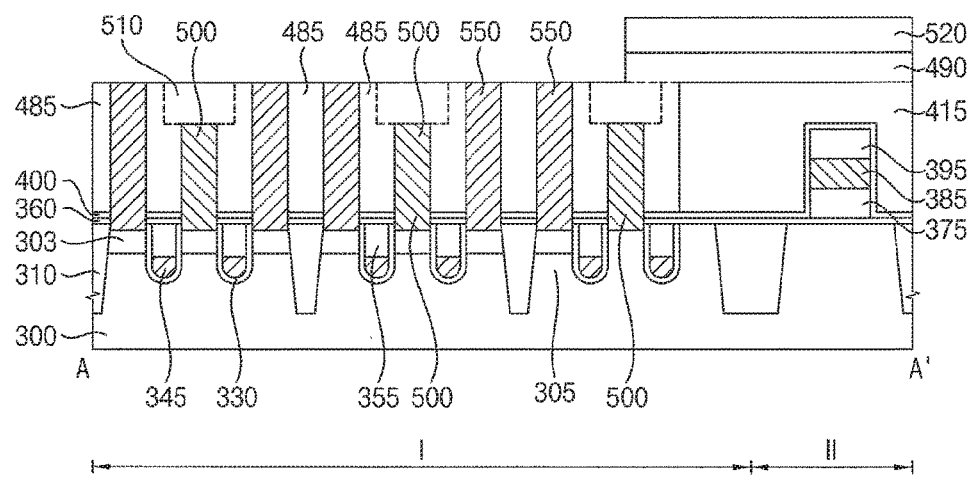
Figure 63:
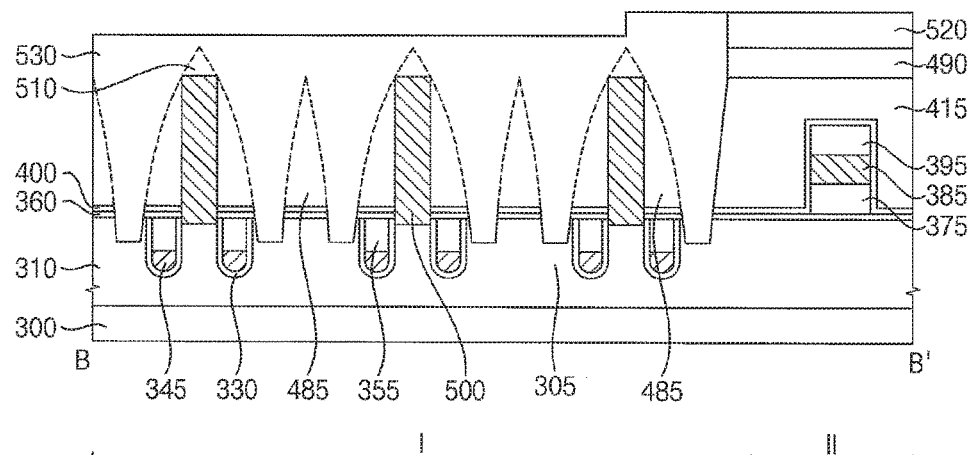
Figure 64:
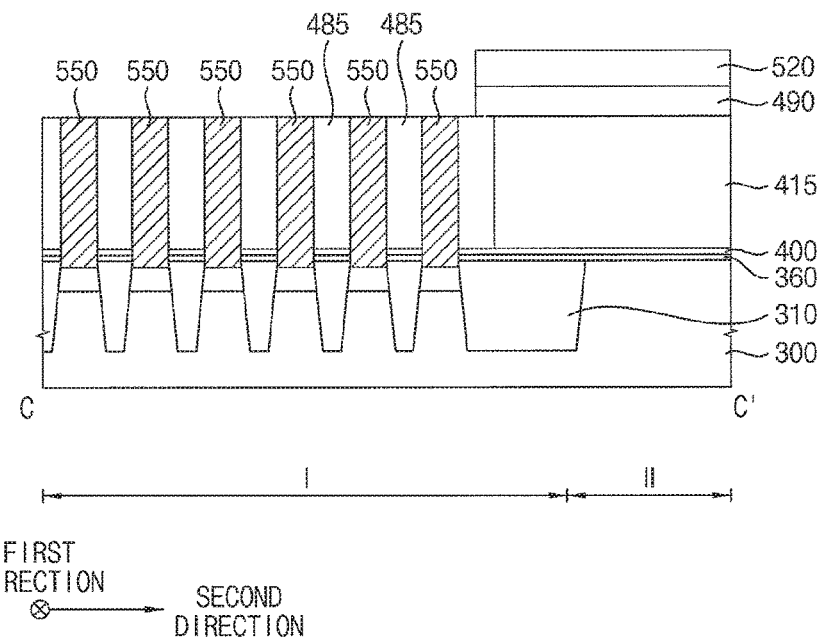

FIGS. 24-26, 29-30, 32-33, 35, 37, 39, 41-43, 46, 48-49, 52, 58, 62, 65, 67, 69, 71 and 73-74 are vertical cross-sectional views cut along lines A-A', respectively, FIGS. 54, 56, 59 and 63 are vertical cross-sectional views cut along lines B-B', respectively, FIGS. 60 and 64 are vertical cross-sectional views cut along lines C-C', respectively, FIG. 44 is a horizontal cross-sectional view cut along a line D-D', and FIG. 50 is a horizontal cross-sectional view cut along a line E-E'.

The method of manufacturing an MRAM device illustrated with reference to FIGS. 23-74 may include processes that are substantially the same as or similar to those illustrated with reference to FIGS. 1 to 7, and detailed descriptions thereon are omitted herein.

Figure 24:
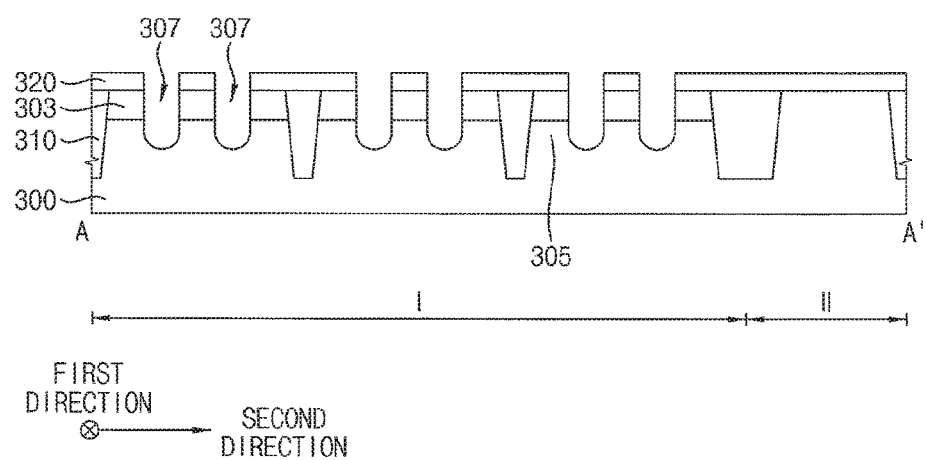

Referring to FIGS. 23 and 24, impurities may be implanted into an upper portion of a substrate 300 in a first region I to form an impurity region 303, and an isolation layer 310 may be formed on the substrate 300 to divide the substrate 300 into an active region 305 and a field region.

The substrate 300 may include a semiconductor material, e.g., silicon, germanium, silicon-germanium, or III-V semiconductor compounds, e.g., GaP, GaAs, GaSb, etc. In an example embodiment, the substrate 300 may be a SOI substrate or a GOI substrate. The substrate 300 may include the first region I in which memory cells may be formed and a second region II in which peripheral circuits may be formed.

The impurities may include n-type impurities, e.g., phosphorous, arsenic, etc., or p-type impurities, e.g., boron, gallium, etc. The impurity region 303 may serve as source/drain regions of the memory cells.

The isolation layer 310 may be formed by a shallow trench isolation (STI) process. Particularly, after forming a first trench (not shown) at an upper portion of the substrate 300, an insulation layer sufficiently filling the first trench may be formed on the substrate 300, and an upper portion of the insulation layer may be planarized until a top surface of the substrate 300 is exposed. The insulation layer may be formed by a chemical vapor deposition (CVD) process, a high density plasma chemical vapor deposition (HDP-CVD) process, etc. In an example embodiment, before forming the isolation layer 310, a nitride liner (not shown) may be formed on an inner wall of the first trench.

Instead of forming the impurity region 303 before forming the isolation layer 310, the impurity region 303 may be formed after forming the isolation layer 310.

The substrate 300 may be partially removed to form a plurality of second trenches 307.

In example embodiments, a first mask layer may be formed on the substrate 300, and the first mask layer may be patterned by a photolithography process to form a first mask 320. An upper portion of the substrate 300 may be etched using the first mask 320 as an etching mask to form the second trenches 307. In example embodiments, the second trenches 307 may extend in a first direction that is substantially parallel to a top surface of the substrate 300 and may be spaced apart from each other in a second direction that is substantially perpendicular to the first direction. In an example embodiment, two second trenches 307 may be formed within each active region 305 divided by the isolation layer 310.

The first mask layer may be formed of, e.g., silicon oxide.

Figure 25:
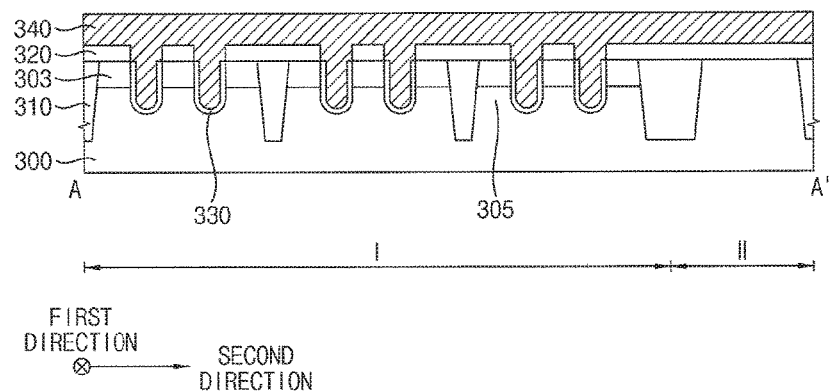

Referring to FIG. 25, a first gate insulation layer 330 may be formed on inner walls of the second trenches 307, and a first gate electrode layer 340 may be formed on the first gate insulation layer 330 and the first mask 320 to sufficiently fill the second trenches 307.

In some example embodiments, the first gate insulation layer 330 may be formed by a thermal oxidation process or a radical oxidation process on upper portions of the substrate 300 exposed by the second trenches 307. In other example embodiments, the first gate insulation layer 330 may be formed by depositing a silicon oxide layer or a metal oxide layer on inner walls of the second trenches 307 and the first mask 320 through, e.g., a chemical vapor deposition (CVD) process, and by then removing the portion of the silicon oxide layer or the metal oxide layer that is on the first mask 320. When a metal oxide layer is used, the metal oxide layer may be, e.g., hafnium oxide, tantalum oxide, zirconium oxide, etc.

The first gate electrode layer 340 may be a metal or a metal nitride layer, e.g., tungsten, titanium nitride, tantalum nitride, etc., and/or a metal silicide layer. The first gate electrode layer 340 may be formed by an atomic layer deposition (ALD) process, a physical vapor deposition (PVD) process, etc.

Figure 26:
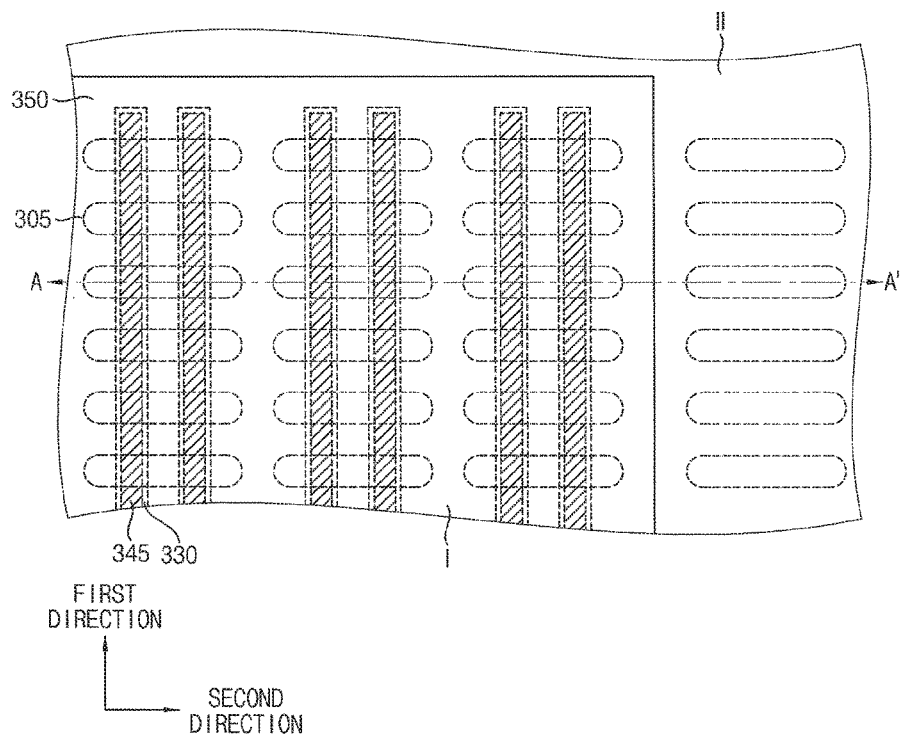
Figure 27:
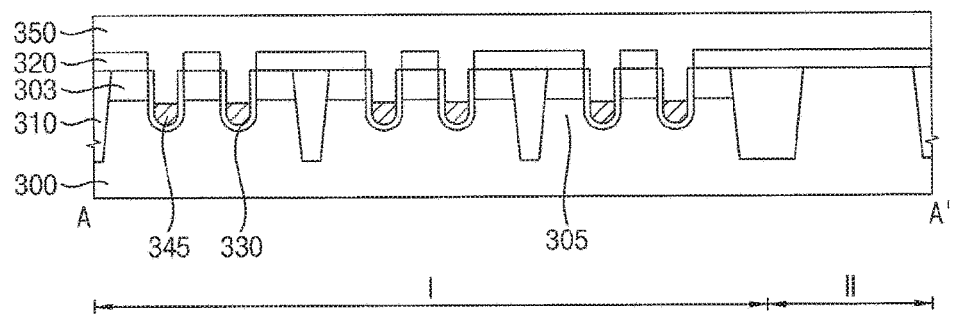

Referring to FIGS. 26 and 27, an upper portion of the first gate electrode layer 340 may be removed to form first gate electrodes 345 that partially fill the respective second trenches 307. A first capping layer 350 may fill the remaining portions of the second trenches 307. The first capping layer 350 is also formed on the first gate insulation layer 330 and the first mask 320.

In example embodiments, an upper portion of the first gate electrode layer 340 may be planarized by, e.g., a chemical mechanical polishing (CMP) process and/or an etch back process. Then, an upper portion of the remaining portion of the first gate electrode layer 340 that is on the second trenches 307 may be removed by an anisotropic etching process to form the first gate electrodes 345. Thus, the first gate electrodes 345 may fill lower portions of the respective second trenches 307. In example embodiments, each of the first gate electrodes 345 may extend in the first direction, and the first gate electrodes 345 may be spaced apart from other in the second direction.

The first capping layer 350 may be, e.g., silicon oxide, silicon nitride, etc.

Figure 28:
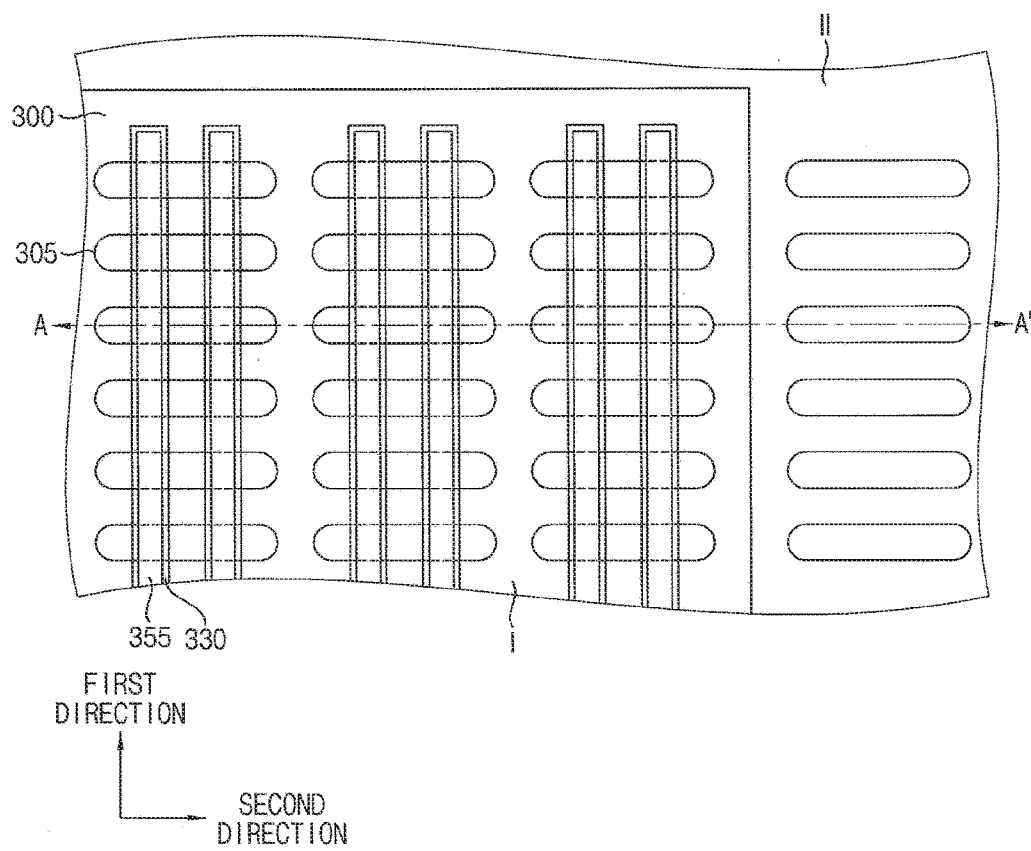
Figure 29:
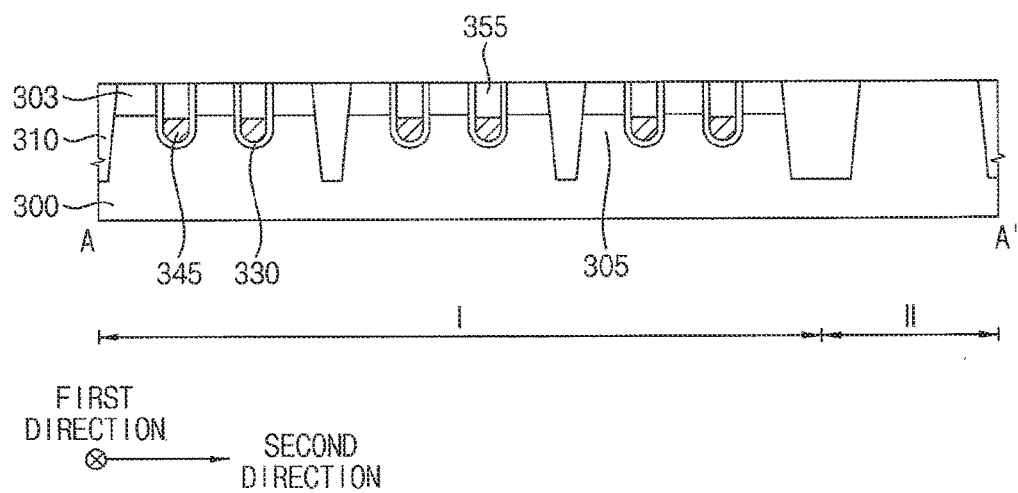

Referring to FIGS. 28 and 29, upper portions of the first capping layer 350 and the first mask 320 may be removed using, for example, a CMP process and/or an etch back process, to expose a top surface of the substrate 300. to convert the first capping layer 350 into a plurality of first capping patterns 355.

The first capping patterns 355 may fill upper portions of the respective second trenches 307. In example embodiments, the first capping patterns 355 may extend in the first direction and may be spaced apart from one another in the second direction.

Each combination of a first gate insulation layer 330, a first gate electrode 345 and a first capping pattern 355 may form a first gate structure. Each first gate structure may be a buried gate structure that fills a respective one of the second trenches 305. The first gate structure and the impurity region 303 may form a transistor.

Figure 30:
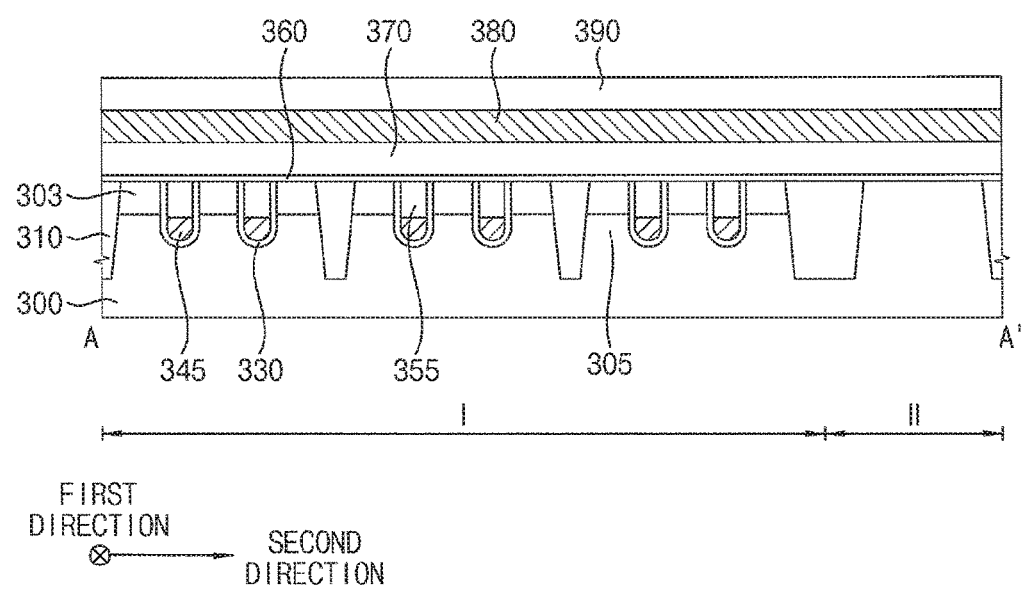

Referring to FIG. 30, a second gate insulation layer 360, a second gate electrode layer 370, a third gate electrode layer 380 and a second mask layer 390 may be sequentially formed on the first gate structures, the substrate 300 and the isolation layer 310.

The second gate insulation layer 360 may be, e.g., silicon oxide, the second gate electrode layer 370 may be, e.g., doped polysilicon, the third gate electrode layer 380 may be, e.g., a metal and/or a metal nitride, and the second mask layer 390 may be, e.g., silicon nitride.

Figure 31:
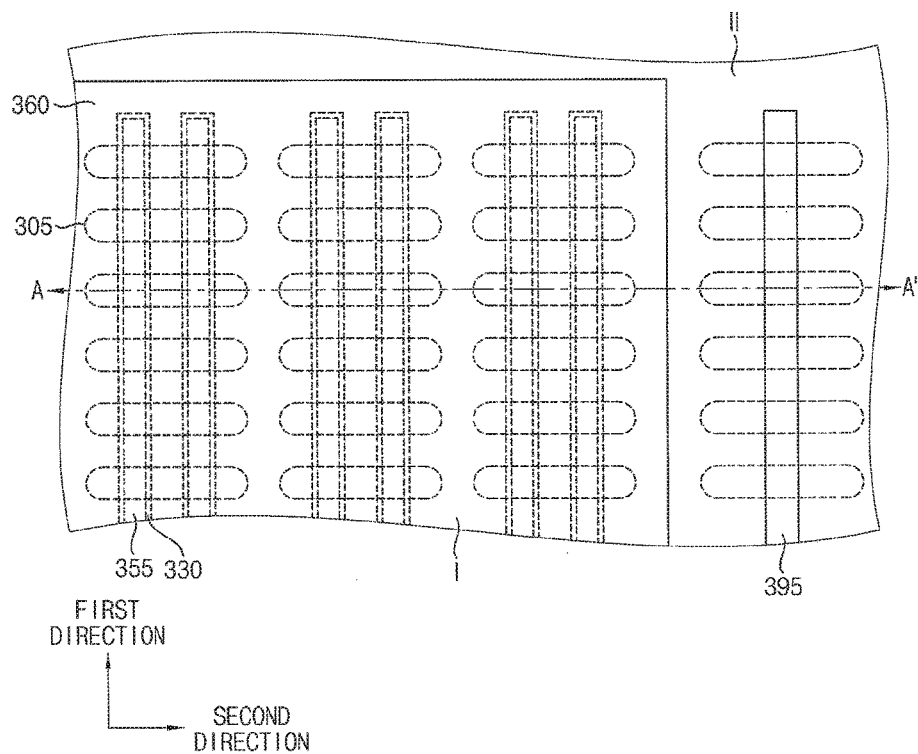
Figure 32:
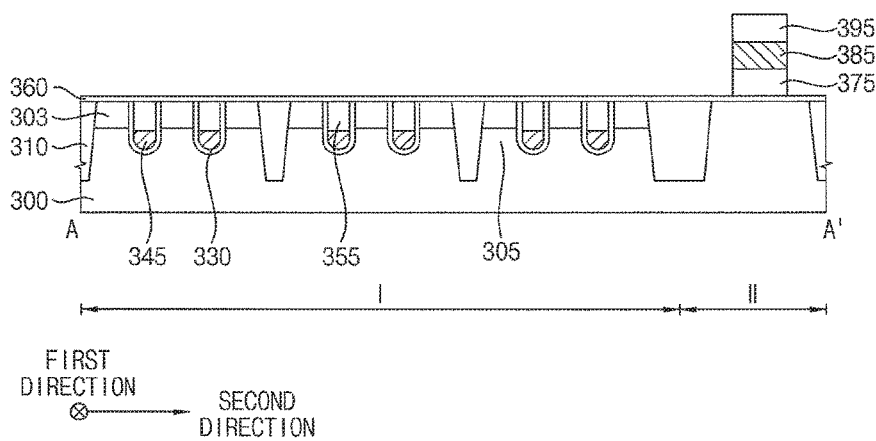

Referring to FIGS. 31 and 32, the second mask layer 390 may be patterned by a photolithography process to form a second mask 395 in the second region II, and the third and second gate electrode layers 380 and 370 may be etched using the second mask 395 as an etching mask to form a third gate electrode 385 and a second gate electrode 375, respectively, in the second region II.

When the second and third gate electrodes 375 and 385 are formed, in example embodiments, the second gate insulation layer 360 may not be patterned but may remain on the substrate 300, the isolation layer 310 and the first gate structures. Alternatively, the second gate insulation layer 360 may be patterned together with the second and third gate electrode layers 370 and 380 to be removed from the first region I of the substrate 300.

The second gate insulation layer 360, the second gate electrode 375, the third gate electrode 385 and the second mask 395 sequentially stacked on the substrate 300 in the second region II may form a second gate structure, and the second and third gate electrodes 375 and 385 and the second mask 395 may be referred to herein as a second gate electrode structure.

Figure 33:
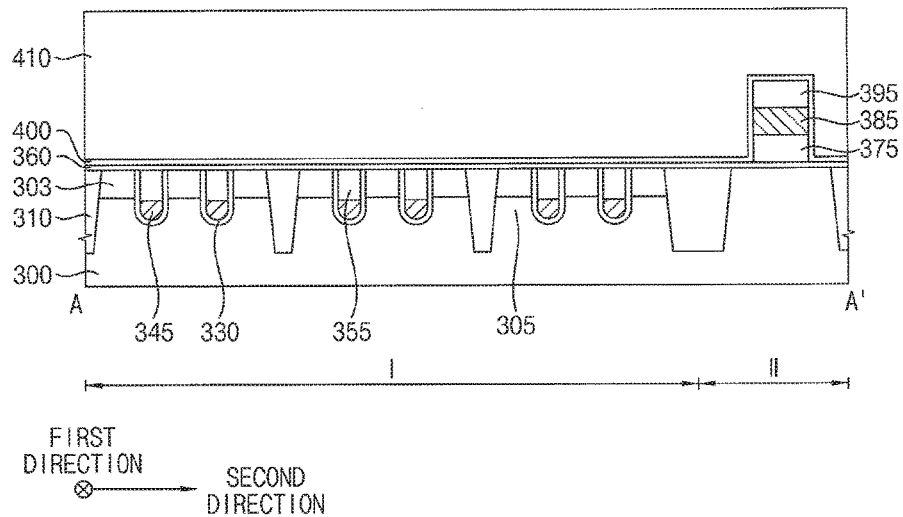

Referring to FIG. 33, a first etch stop layer 400 may be formed on the second gate insulation layer 360 and the second gate electrode structure, and a first insulating interlayer 410 may be formed on the first etch stop layer 400 to have a top surface higher than that of the second gate electrode structure so that the first insulating interlayer 410 may sufficiently cover the second gate electrode structure.

The first etch stop layer 400 may be, e.g., silicon nitride, and the first insulating interlayer 410 may be, e.g., silicon oxide. Thus, the first etch stop layer 400 may include a material substantially the same as that of the second mask 395, thereby to be merged thereto.

A portion of the first insulating interlayer 410 in the first region I may be removed in subsequent processes, and thus may serve as a sacrificial layer.

Figure 34:
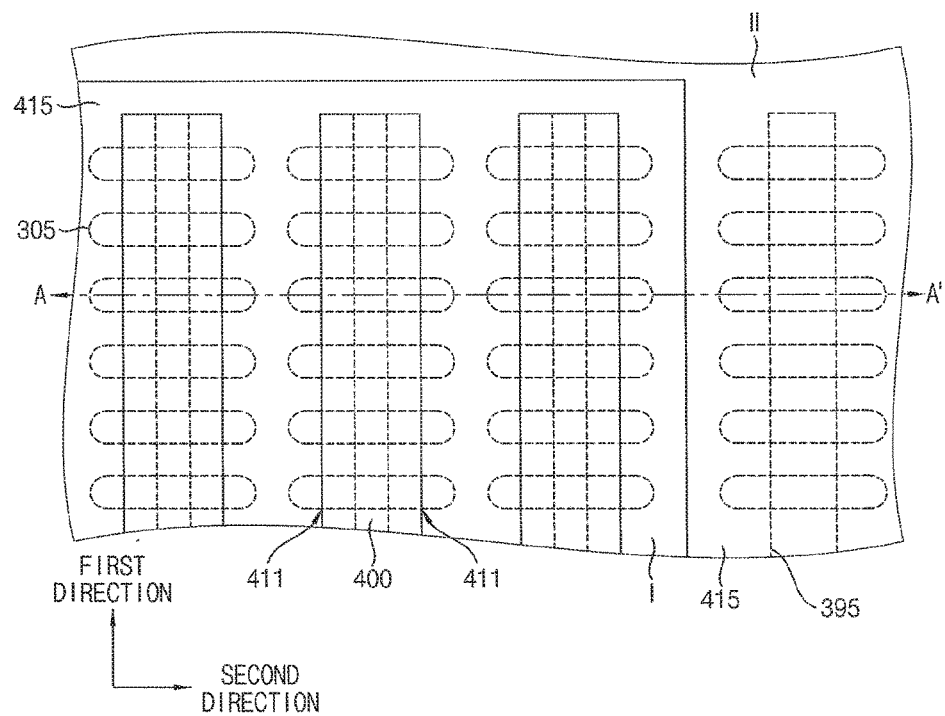
Figure 35:
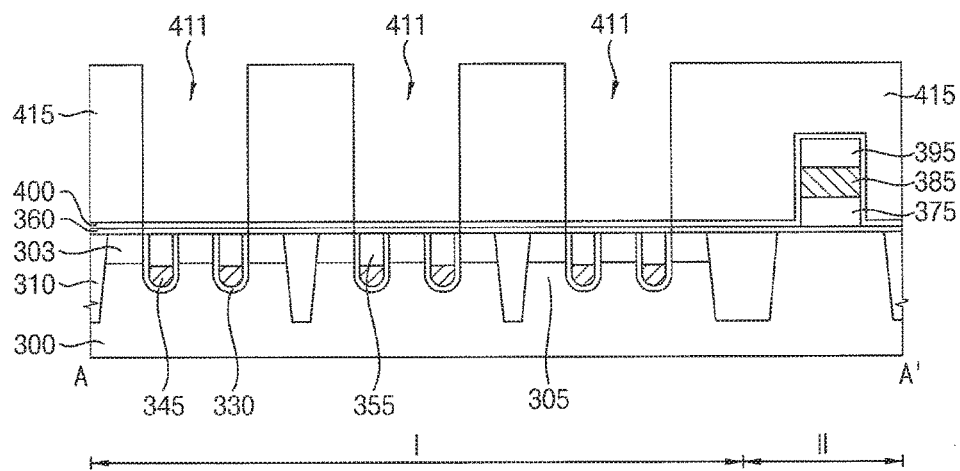

Referring to FIGS. 34 and 35, the first insulating interlayer 410 may be patterned by a photolithography process to form a first insulating interlayer pattern 415.

A plurality of fifth openings 411 may be formed in the first insulating interlayer pattern 415 to expose top surfaces of the first etch stop layer 400, and each of the fifth openings 411 may overlap two first gate structures that are adjacent to each other in each active region 305 and a portion of the substrate 300 therebetween.

As mentioned above, a portion of the first insulating interlayer pattern 415 in the first region I of the substrate 300 may be mostly removed by a subsequent process (refer to FIGS. 38 and 39), while a portion of the first insulating interlayer pattern 415 in the second region II of the substrate 300 may remain, and hereinafter the first insulating interlayer pattern 415 may be also referred to as a first sacrificial pattern 415.

Figure 36:
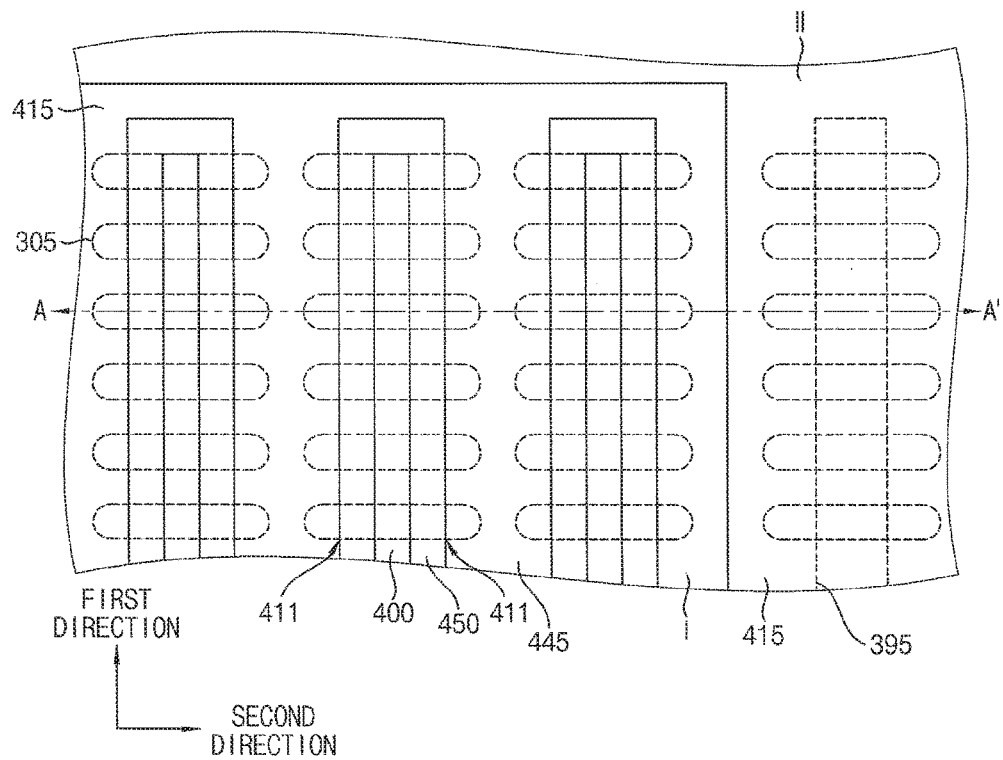
Figure 37:
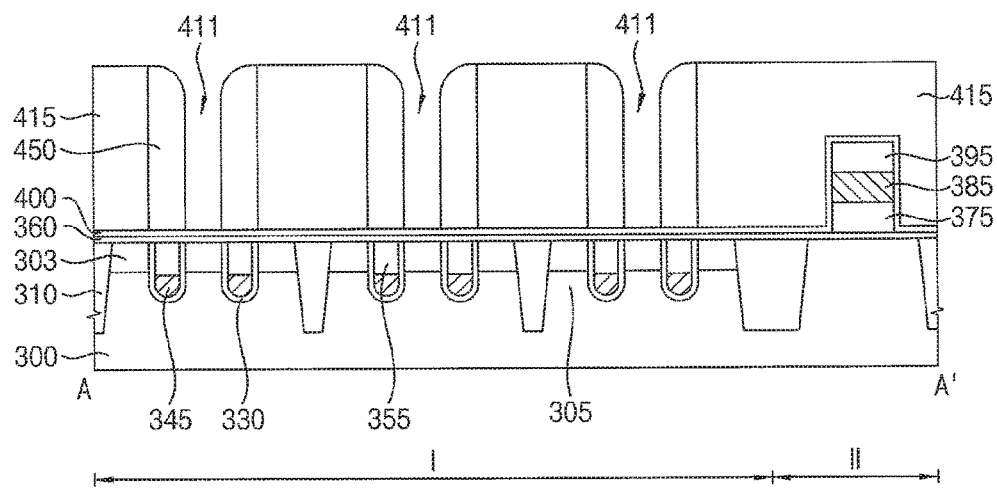

Referring to FIGS. 36 and 37, a first spacer 450 may be formed on a sidewall of each of the fifth openings 411.

The first spacers 450 may be formed by forming a first spacer layer on the sidewalls of the fifth openings 411, top surfaces of the etch stop layer 400 exposed by the fifth openings 411, and the top surface of the first sacrificial pattern 415. This first spacer layer may be anisotropically etched to form the first spacers 450.

The first spacer layer may be, e.g., silicon nitride, and may be formed by an ALD process.

In example embodiments, each first spacer 450 may vertically overlap the first gate structure. The pair of first spacers 450 that are opposite each other in each fifth opening 411 may be spaced apart from one another by a first distance in the second direction. In an example embodiment, the first distance may be similar to the width of the first gate structures in the second direction.

When viewed from above, one first spacer 450 of a loop shape (e.g., a U-shape) may be formed in each fifth opening 411, as shown in FIG. 36. That is, each first spacer 450 may have a pair of first portions which extend in the first direction, and a second portion that connects the two first portions to each other. Hereinafter, the pair of first portions of the first spacer 450 may be simply referred to as independent first spacers 450 for the convenience of explanation. Thus, the first spacers 450 in each fifth opening 411 may be spaced apart from each other by the first distance in the second direction.

Figure 38:
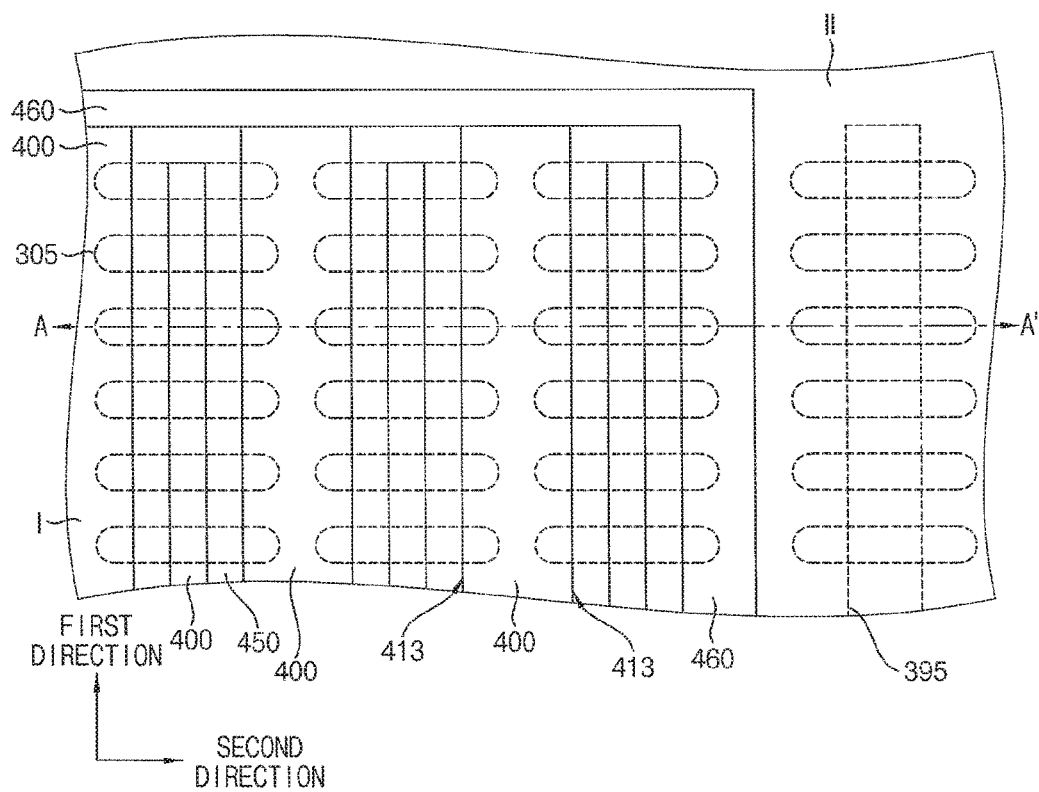
Figure 39:
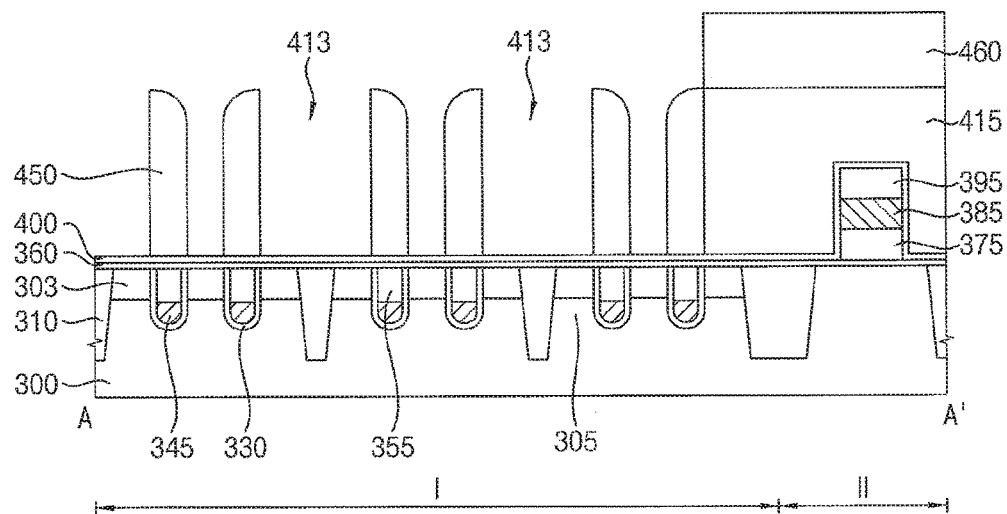

Referring to FIGS. 38 and 39, a third mask 460 may be formed on a portion of the first sacrificial pattern 415, and the portion of the first sacrificial pattern 415 that is not covered by the third mask 460 may be removed to form a plurality of sixth openings 413 that expose top surfaces of the first etch stop layer 400.

In example embodiments, the third mask 460 may cover the entirety of the portion of the first sacrificial pattern 415 that is in the second region II and may also cover a portion of the first sacrificial pattern 415 that is in the first region I adjacent to the second region II, and may expose a central portion of the first sacrificial pattern 415 in the first region I. In an example embodiment, the third mask 460 may cover the second region II and portions of the first sacrificial pattern 415 in the first region I that are formed at outsides of outermost ones of the first spacers 450.

In example embodiments, the portion of the first sacrificial pattern 415 not covered by the third mask 460 may be removed by a wet etching process using, for example, hydrofluoric acid as an etching solution.

As the portion of the first sacrificial pattern 415 in the first region I is removed, the first spacers 450 may be spaced apart from each other by a second distance, which may correspond to a width of the first sacrificial pattern 415 in the second direction. That is, the first spacers 450 may be spaced apart from each other by the second distance through the sixth opening 413. In an example embodiment, the second distance may be larger than the first distance.

As a result, adjacent ones of the first spacers 450 may be spaced apart from one another in the second direction by either the first distance or by the second distance. Particularly, when counted from the outermost one of the first spacers 450, a distance from odd numbered first spacers 450 to neighboring even numbered first spacers 450 may be the first distance, and a distance from the even numbered first spacers 450 to the neighboring odd numbered first spacers 450 may be the second distance.

Figure 40:
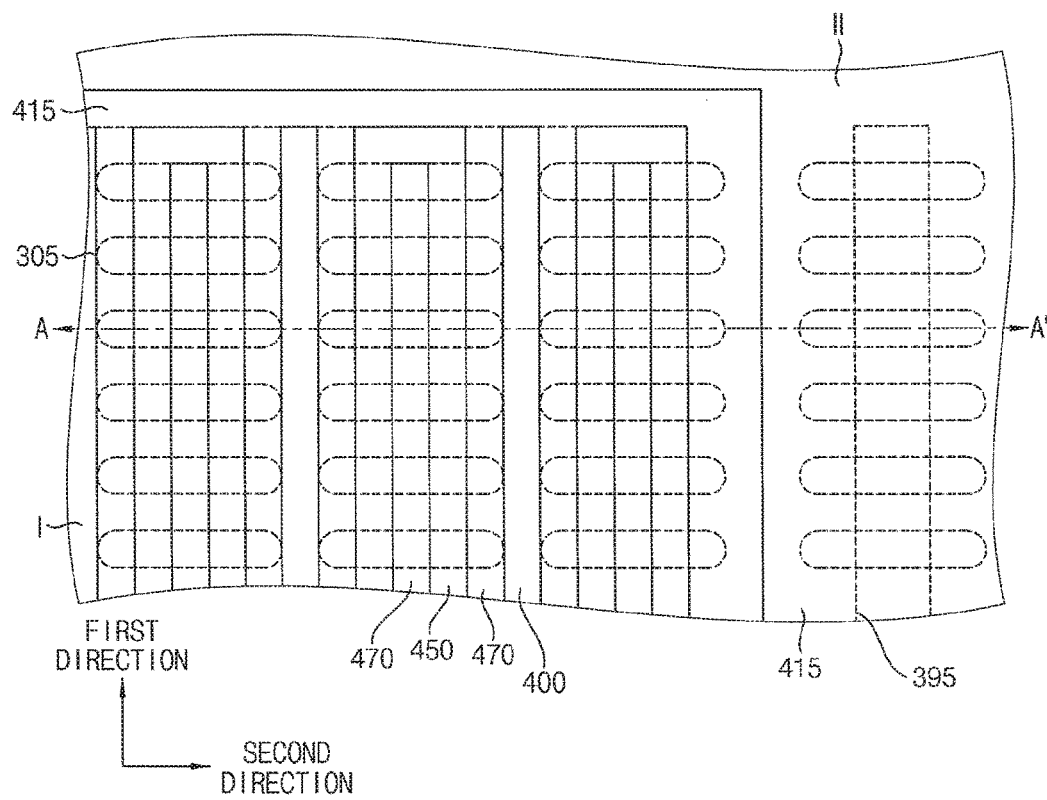
Figure 41:
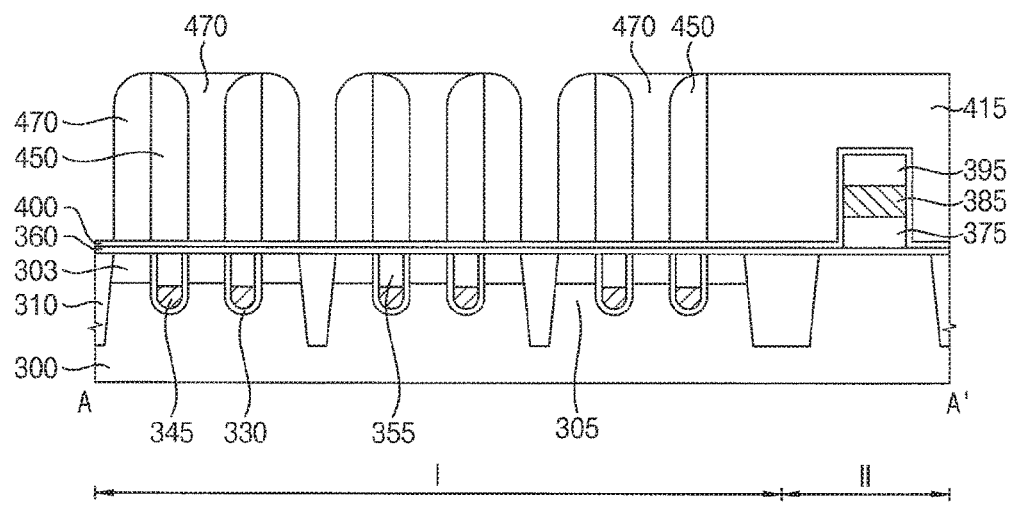

Referring to FIGS. 40 and 41, after removing the third mask 460, second spacers 470 may be formed on the substrate 300. Each second spacer 470 may contact a first spacer 450.

In example embodiments, the second spacers 470 may be formed by forming a second spacer layer covering the first spacers 450 on the first etch stop layer 400 and the first sacrificial pattern 415, and anisotropically etching the second spacer layer.

The second spacer layer may be, e.g., silicon oxide, and thus a portion of the second spacer layer contacting the first sacrificial pattern 415 may be merged thereto. In example embodiments, the second spacer layer may be formed by an ALD process.

In example embodiments, the second spacer layer may fill spaces between the first spacers 450 that are spaced apart from each other by the first distance, and may partially fill spaces and partially cover a portion of the first etch stop layer 400 between the first spacers 450 that are spaced apart from each other by the second distance.

Figure 42:
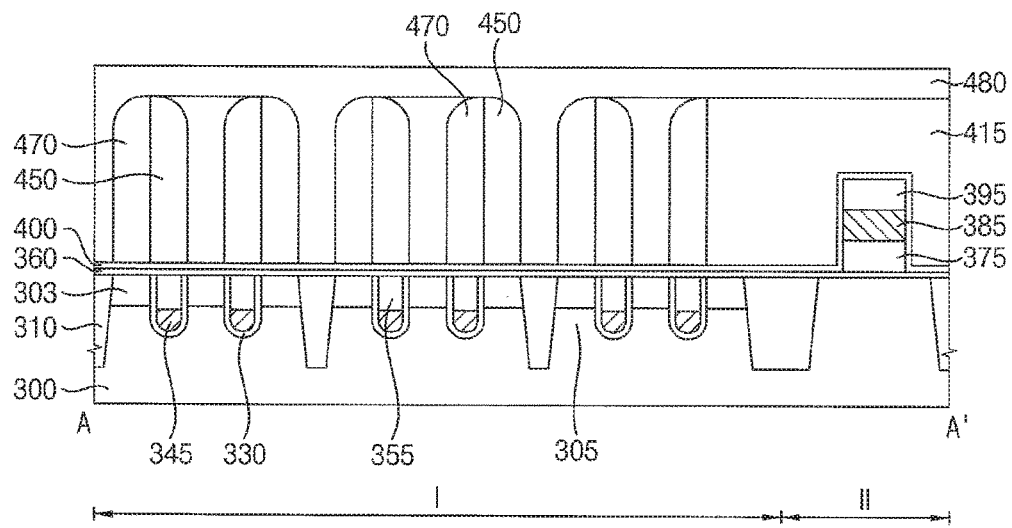

Referring to FIG. 42, a filling layer 480 may be formed on the first etch stop layer 400, the first and second spacers 450 and 470 and the first sacrificial pattern 415 to sufficiently fill the spaces between the second spacers 470, i.e., remaining portions of the sixth openings 413.

In example embodiments, the filling layer 480 may be formed of a material substantially the same as that of the first spacers 450, e.g., silicon nitride by an ALD process or a CVD process.

Referring to FIGS. 43 and 44, upper portions of the filling layer 480, the first and second spacers 450 and 470 and the first sacrificial pattern 415 may be planarized to form first and second patterns 485 and 475, and a second capping layer 490 may be formed on the first and second patterns 485 and 475 and the first sacrificial pattern 415.

In example embodiments, the planarization process may be a CMP process and/or an etch back process.

By the planarization process, the first spacers 450 and the filling layer 480 may be converted into the first patterns 485, and the second spacers 470 may be converted into the second patterns 475. Thus, each of the first and second patterns 485 and 475 may extend in the first direction, and the first and second patterns 485 and 475 may be alternately and repeatedly formed in the second direction. The first and second patterns 485 and 475 may contact each other. In example embodiments, ones of the first patterns 485 may overlap the first gate structure, and others of the first patterns 485 may overlap the isolation layer 310. In example embodiments, the second patterns 475 may overlap the respective impurity regions 303 that are adjacent to the first gate structure.

The first patterns 485 may include, e.g., silicon nitride, and the second patterns 475 may include, e.g., silicon oxide. The second capping layer 490 may be formed of, e.g., silicon nitride, thereby being merged into the first patterns 485.

Figure 45:
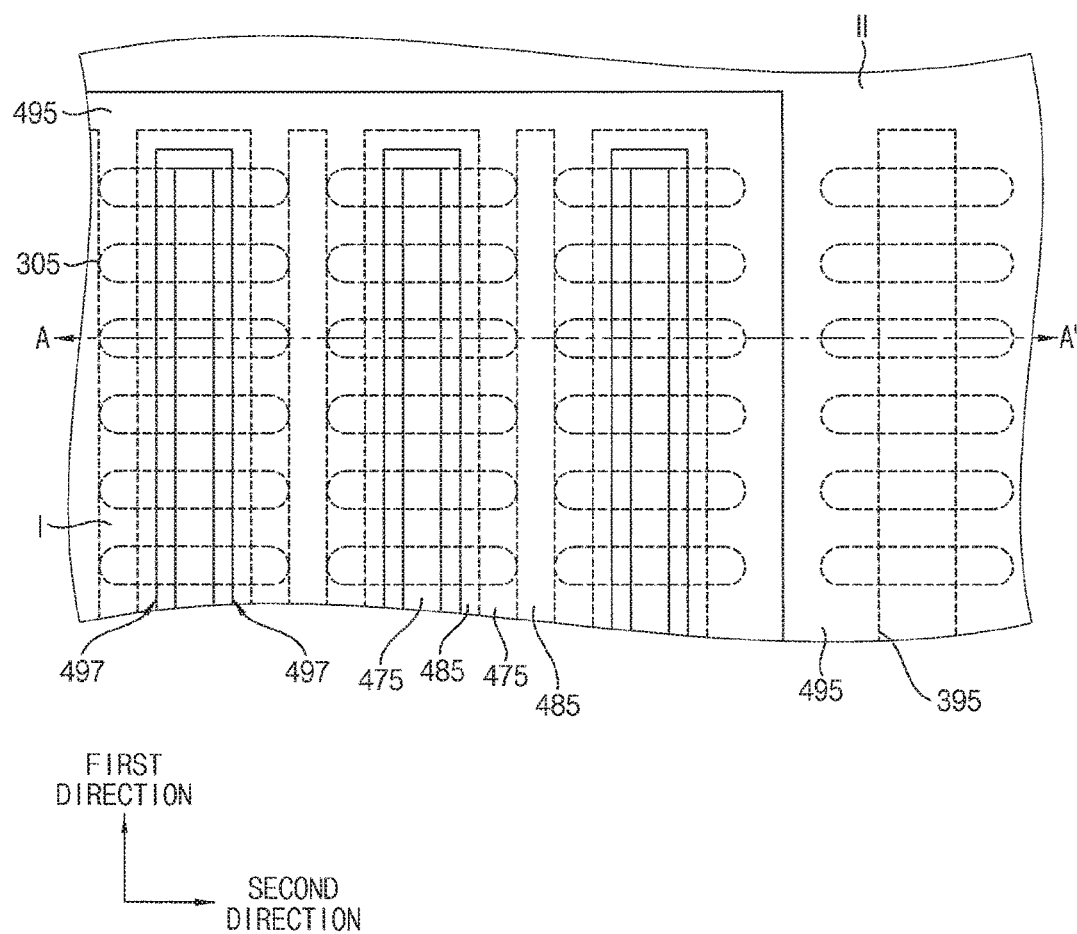
Figure 46:
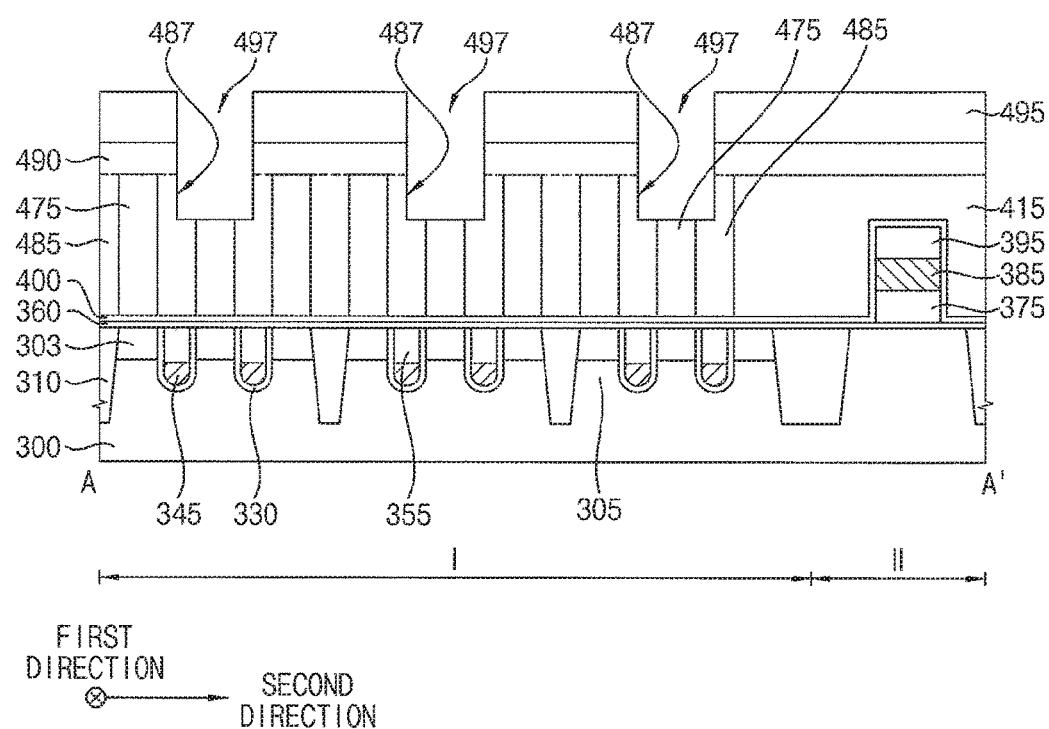

Referring to FIGS. 45 and 46, a second photoresist pattern 495 may be formed on the second capping layer 490, and the second capping layer 490 and upper portions of the first and second patterns 485 and 475 thereunder may be etched using the second photoresist pattern 505 as an etching mask to form recesses 487.

In example embodiments, the second photoresist pattern 505 may include a plurality of seventh openings 497, each of which may extend in the first direction. The second openings 497 may be spaced apart from one another in the second direction. Each seventh opening 497 may vertically overlap the second pattern 475 on a portion of the substrate 300 between adjacent first gate structures and a portion of the first patterns 485 adjacent to the second pattern 475 in each active region 305. Thus, (3n−2)th second patterns 475, e.g., first, fourth and seventh second patterns 475 may be exposed by the recesses 487 when counted from an outermost one of the second patterns 475. Here, n indicates a positive integer. In example embodiments, the etching process may be a dry etching process.

Figure 47:
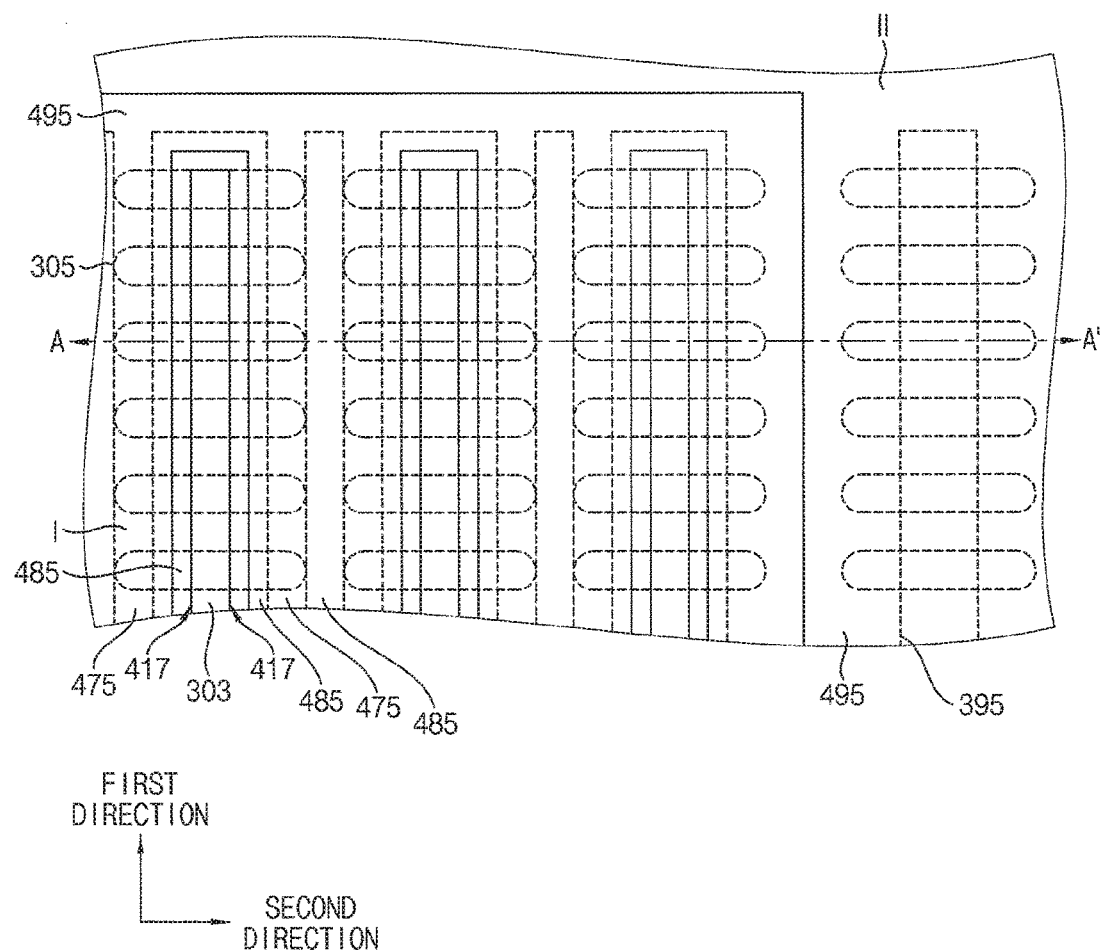
Figure 48:
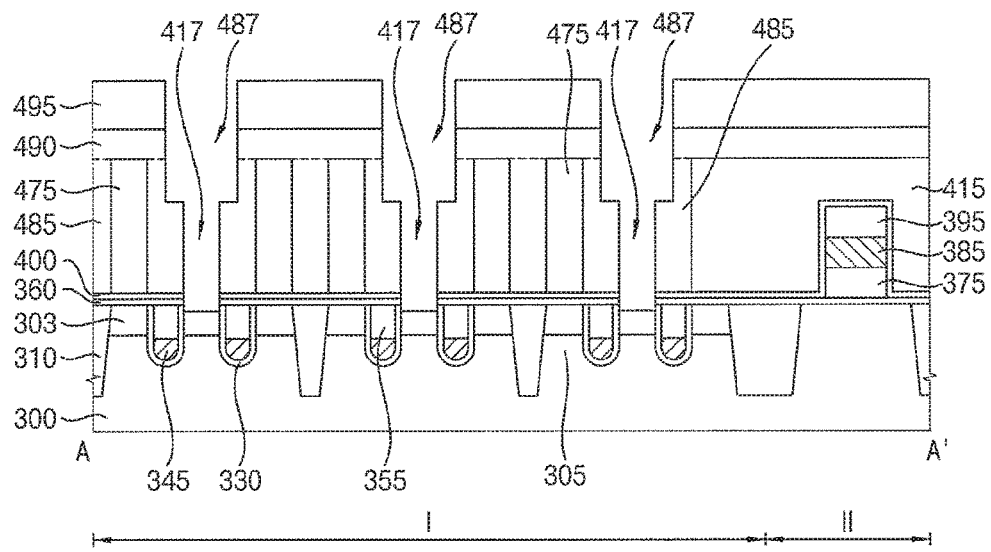

Referring to FIGS. 47 and 48, after removing the second patterns 475 that are exposed by the recesses 487, portions of the first etch stop layer 400 and the second gate insulation layer 360 thereunder may be removed to form eighth openings 417 exposing upper portions of the substrate 300 and being in communication with the recesses 487, respectively.

In example embodiments, the exposed second patterns 475 may be removed by a wet etching process using hydrofluoric acid as an etching solution, and the portions of the first etch stop layer 400 and the second gate insulation layer 360 may be removed by a dry etching process.

Each eighth opening 417 may extend in the first direction.

Referring to FIGS. 49 and 50, after removing the second photoresist pattern 495, a source line 500 may be formed to fill each of the eighth openings 417, and a plurality of third capping patterns 510 may be formed to fill each of the recesses 487.

The source lines 500 may be formed by forming a first conductive layer on the exposed upper portions of the substrate 300 to fill the eighth openings 417 and the recesses 487, and then removing an upper portion of the first conductive layer. In example embodiments, portions of the first conductive layer in the recesses 487 may be completely removed so that each source line 500 may only fill each eighth opening 417. Alternatively, the portions of the first conductive layer in the recesses 487 may be partially removed so that each source line 500 may fill a respective one of the eighth openings 417 and a lower portion of each recess 487. The first conductive layer may be formed of a metal, e.g., tungsten, titanium, tantalum, etc., and/or a metal nitride, e.g., tungsten nitride, titanium nitride, tantalum nitride, etc.

Each source line 500 may extend in the first direction, and the source lines 500 may be spaced apart from one another in the second direction. In example embodiments, each source line 500 may be formed on portions of the substrate 300 and the isolation layer 310 between neighboring first gate structures.

The third capping patterns 510 may be formed by forming a third capping layer on the source lines 500 and the second capping layer 490 to fill the recesses 487, and planarizing an upper portion of the third capping layer.

In example embodiments, the planarization process may be performed until a top surface of the second capping layer 490 may be exposed. The third capping layer may be formed of, e.g., silicon nitride, thereby being merged into the first patterns 485 and/or the second capping layer 490.

Figure 51:
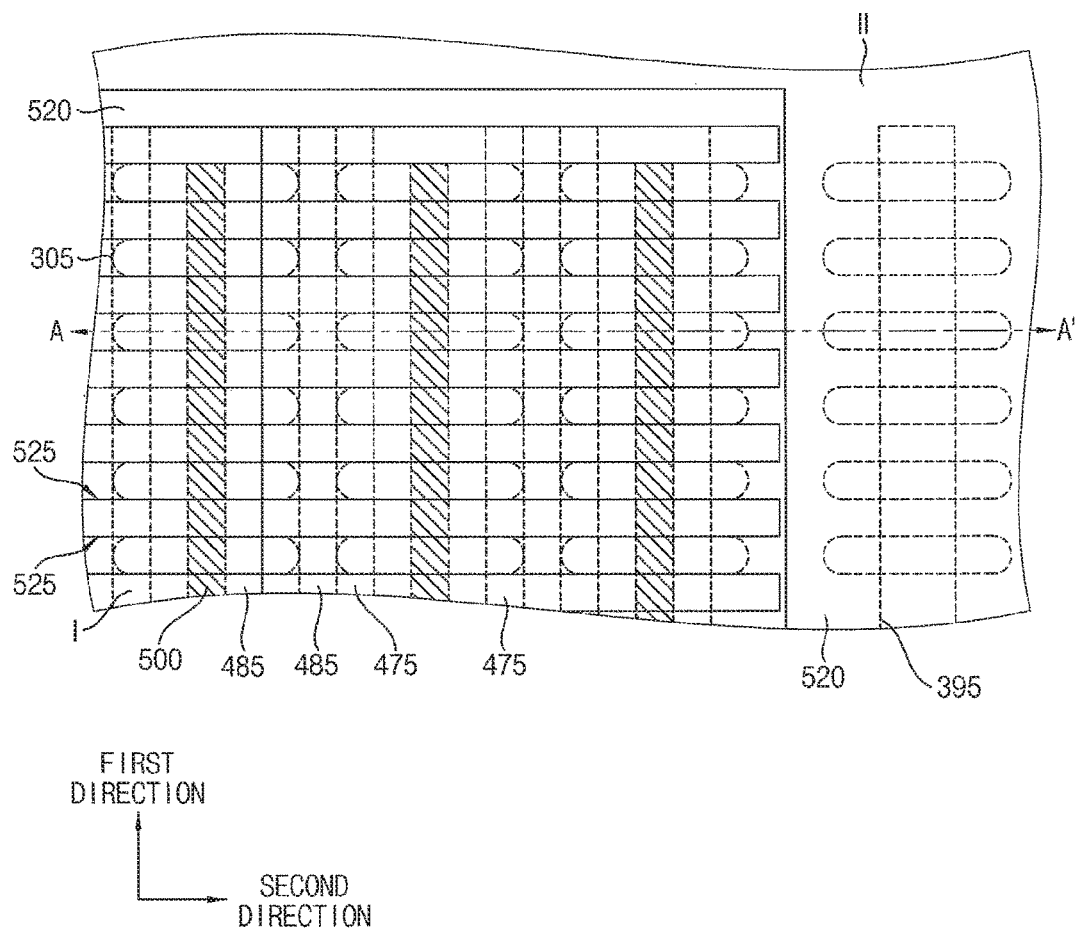
Figure 52:
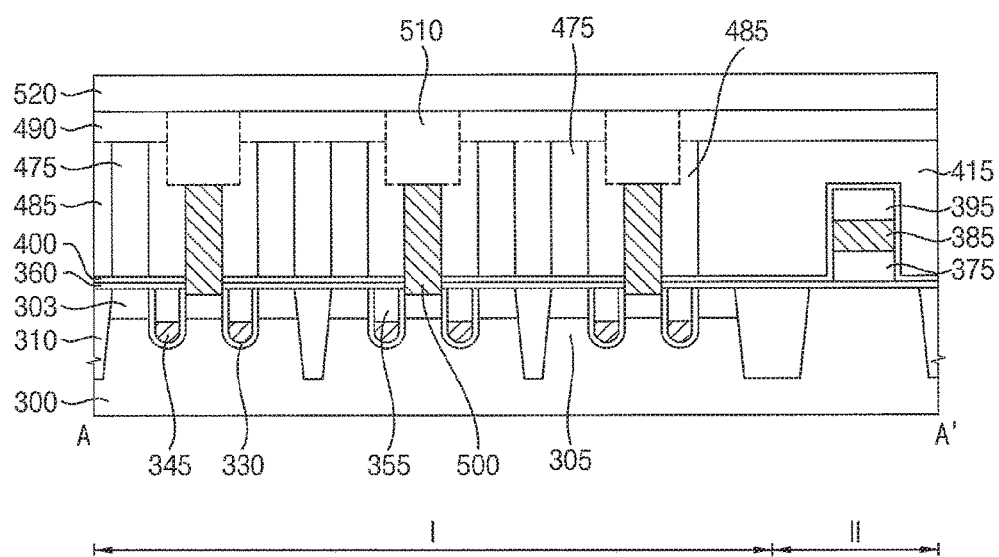

Referring to FIGS. 51 and 52, a fourth mask 520 may be formed on the second capping layer 490, the third capping pattern 510, and the first sacrificial pattern 415.

In example embodiments, the fourth mask 520 may include a plurality of ninth openings 525, each of which may extend in the second direction and which are spaced apart from one another in the first direction. Each ninth opening 525 may be formed in the first region I, and may partially expose the second capping layer 490, the third capping patterns 510, and the first sacrificial pattern 415. In example embodiments, each ninth opening 525 may be vertically overlap the field region of the substrate 300, i.e., overlap the isolation layer 310.

In example embodiments, the fourth mask 520 including the ninth openings 525 having minute widths, respectively, may be formed by double patterning technology (DPT). The fourth mask 520 may be formed of a material having an etching selectivity with respect to both silicon nitride and silicon oxide, e.g., polysilicon.

Figure 53:
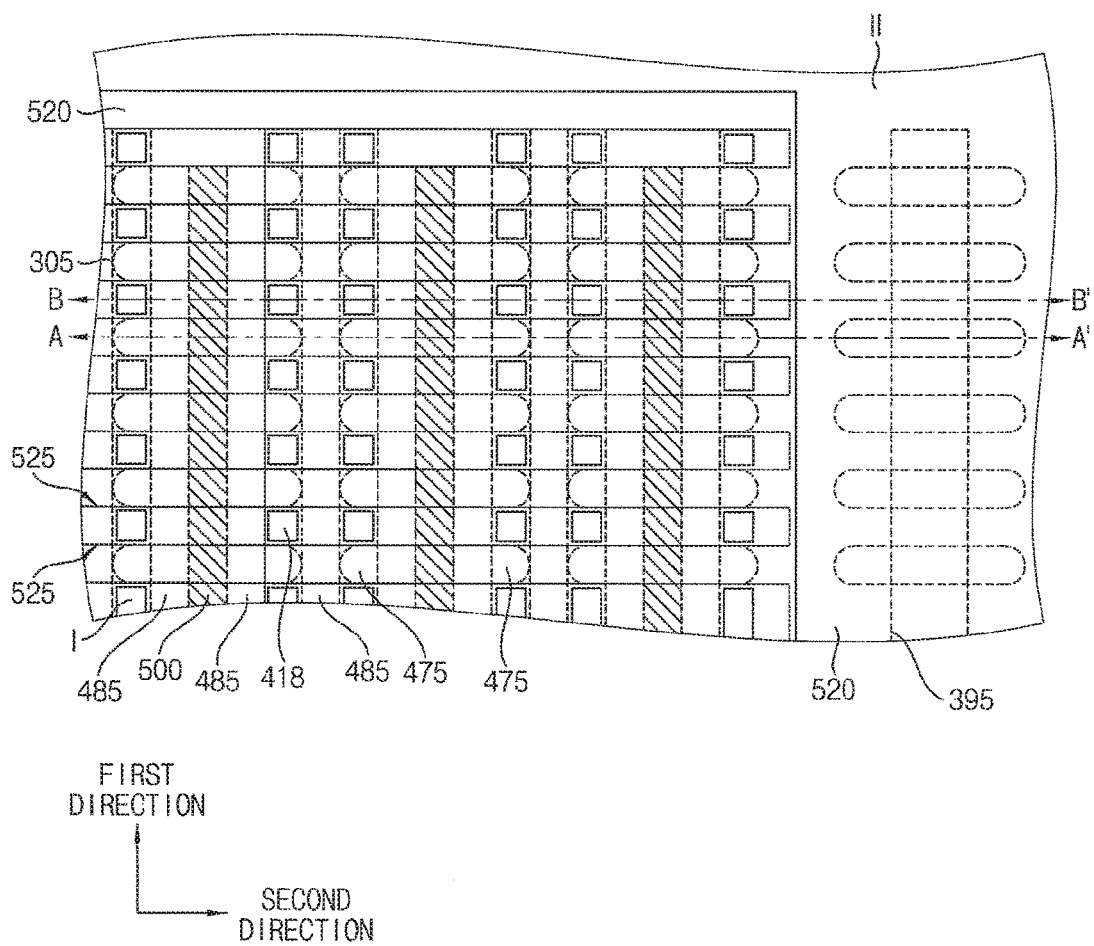
Figure 54:
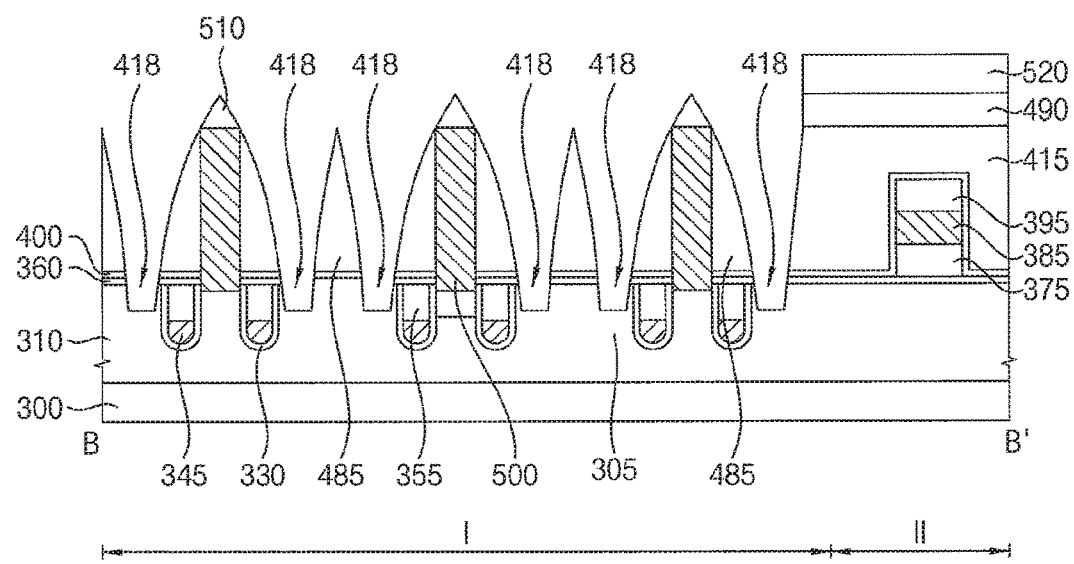
Figure 54:

Referring to FIGS. 53 and 54, the second capping layer 490 and the second patterns 475 may be etched using the fourth mask 520 as an etching mask.

In example embodiments, the etching process may be performed by a dry etching process. When the dry etching process is performed, portions of the first patterns 485 and the third capping patterns 510 adjacent to the second patterns 475 may be removed, however, the source lines 500 may be protected by the third capping patterns 510, and hence may not be removed.

During the dry etching process, portions of the first etch stop layer 400, the second gate insulation layer 360 and the isolation layer 310 under the second patterns 475 may also be removed to form tenth openings 418 that expose upper portions of the isolation layer 310.

Figure 55:
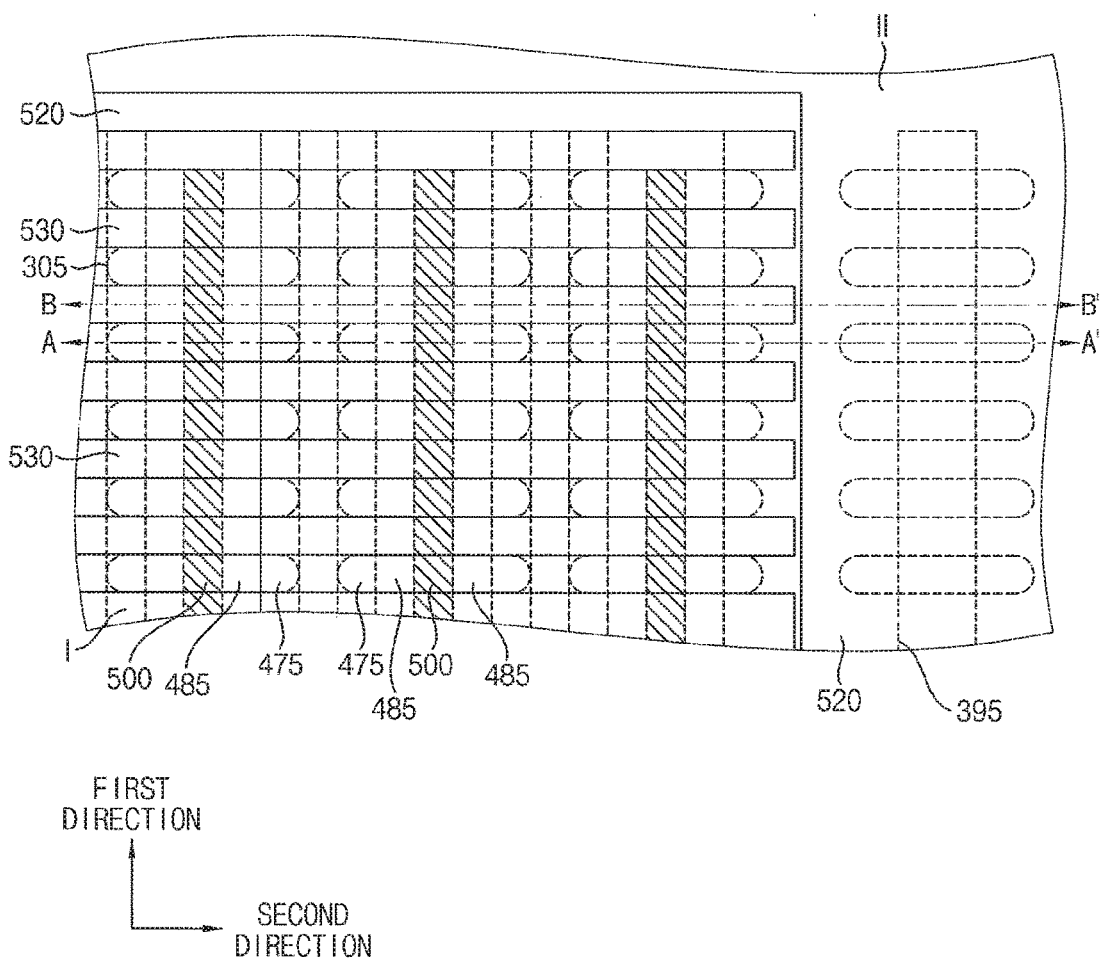
Figure 56:
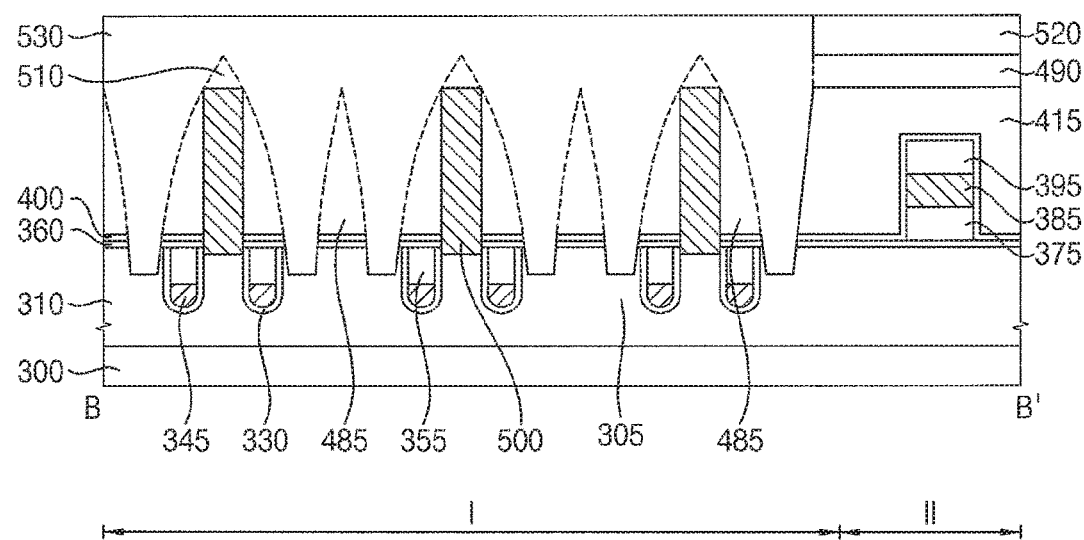
Figure 57:
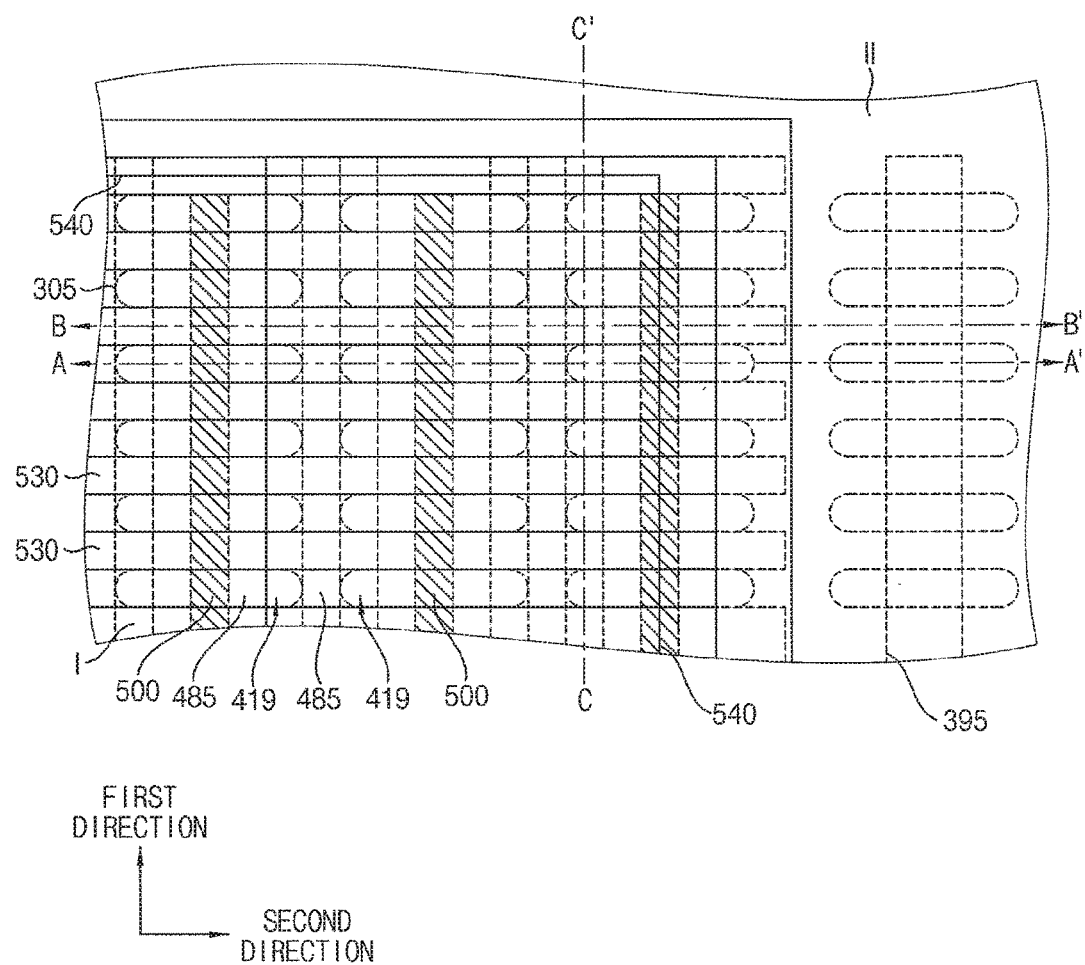
Figure 58:
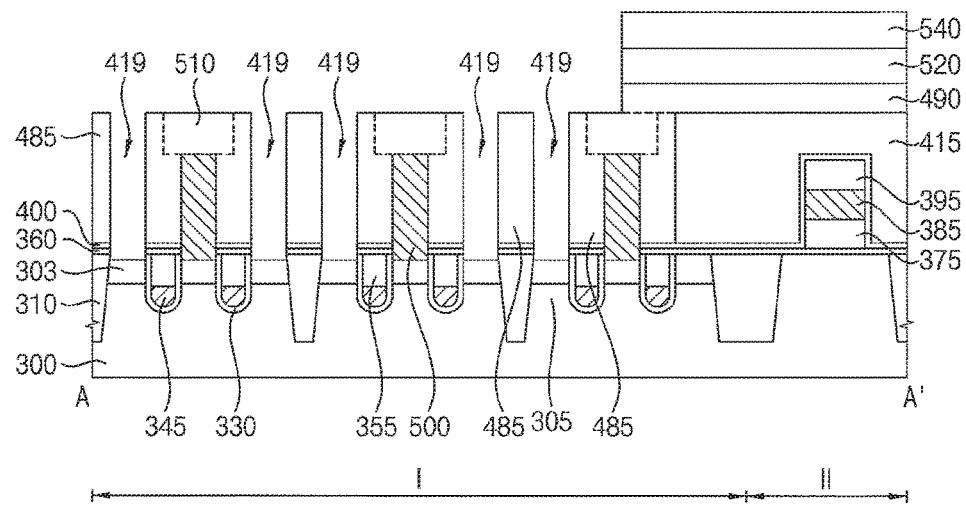
Figure 59:
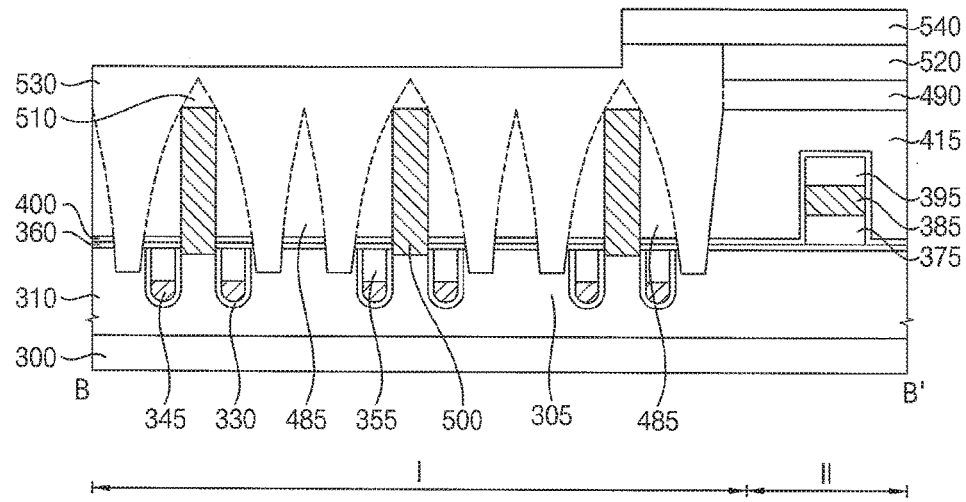

Referring to FIGS. 55 and 56, third patterns 530 filling the tenth openings 418 may be formed.

The third patterns 530 may be formed by forming a first insulation layer on the isolation layer 310, the first patterns 485, the third capping patterns 510 and the fourth mask 520 to sufficiently fill the tenth openings 418, and planarizing an upper portion of the first insulation layer. In an example embodiment, the planarization process may be performed until an upper portion of the fourth mask 520 is removed. The first insulation layer may be, e.g., silicon nitride, thereby being merged into the first patterns 485, the third capping patterns 510, and the second capping layer 490.

In example embodiments, each third pattern 530 may extend in the second direction, and the third patterns 530 may be spaced apart from one another in the first direction.

Thus, sidewalls of the second patterns 475 may be surrounded by the first and third patterns 485 and 530.

Referring to FIGS. 57 to 60, after a third photoresist pattern 540 is formed on the second capping layer 490, the third patterns 530 and the fourth mask 520, the second capping layer 490, the third patterns 530, the third capping patterns 510 and the fourth mask 520 may be etched using the third photoresist pattern 540 as an etching mask.

The third photoresist pattern 540 may cover the second region II and a portion of the first region I adjacent thereto. In example embodiments, the third photoresist pattern 540 may cover the second region II, portions of closest ones of the source lines 500 to the second region II in the second direction, and portions of closest ones of the third patterns 530 to the second region II in the first direction. Thus, the first sacrificial pattern 415 in the second region II may be protected during the etching process. The etching process may be a dry etching process.

By the dry etching process using the third photoresist pattern 540 as an etching mask, the second patterns 475 surrounded by the first and third patterns 485 and 530 may be exposed in the first region I. During the dry etching process, an upper portion of the third capping pattern 510 may be removed so that a top surface of the third capping pattern 510 may be substantially coplanar with top surfaces of the first to third patterns 485, 475 and 530.

The exposed second patterns 475, and the first etch stop layer 400 and the second gate insulation layer 360 thereunder may be removed to form eleventh openings 419 exposing upper portions of the substrate 300.

In example embodiments, the exposed second patterns 475 may be removed by a wet etching process using, e.g., hydrofluoric acid as an etching solution, and the first etch stop layer 400 and the second gate insulation layer 360 may be removed by a dry etching process.

Referring to FIGS. 61 to 64, contact plugs 550 may be formed in each respective eleventh opening 419.

The contact plugs 550 may be formed by forming a second conductive layer on the substrate 300, the first and third patterns 485 and 530, the third capping patterns 510, and the fourth mask 520, and planarizing an upper portion of the second conductive layer. In example embodiments, top surfaces of the contact plugs 550 may be substantially coplanar with top surfaces of the first and third patterns 485 and 530 and the third capping pattern 510.

The second conductive layer may a metal, e.g., tungsten, titanium, tantalum, etc., and/or a metal nitride, e.g., tungsten nitride, titanium nitride, tantalum nitride, etc.

The contact plugs 550 may be formed in both the first and second directions, and each contact plug 550 may contact a respective impurity region 303 of the substrate 300. In example embodiments, two contact plugs 550 may be formed in the second direction between two source lines 500.

Figure 65:
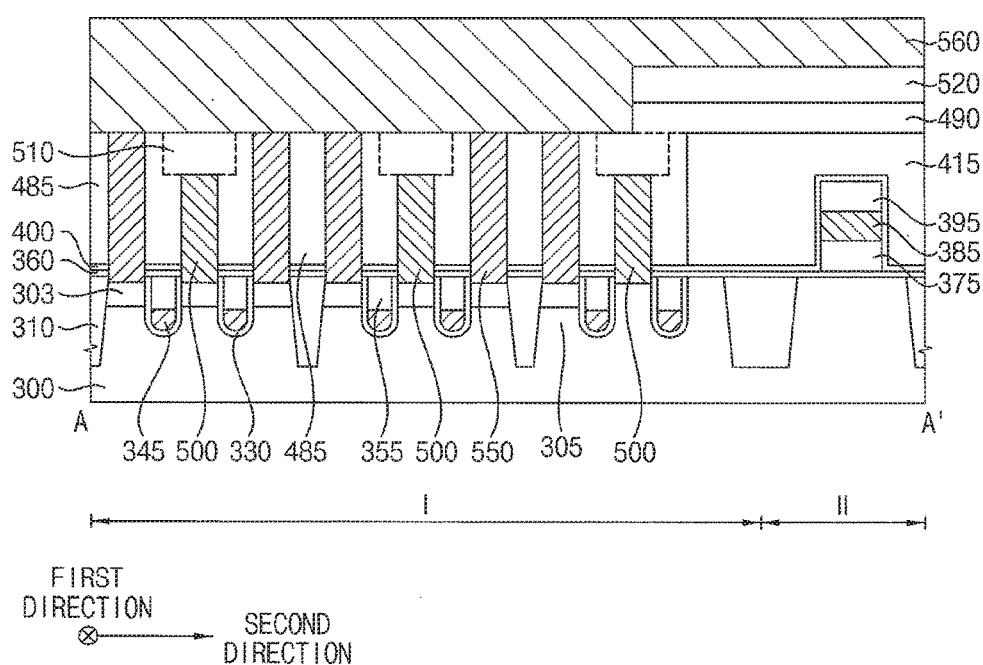

Referring to FIG. 65, a conductive pad layer 560 may be formed on the first and third patterns 485 and 530, the third capping pattern 510, the contact plugs 550 and the fourth mask 520.

The conductive pad layer 560 may be a metal, e.g., tungsten, titanium, tantalum, etc., and/or a metal nitride, e.g., tungsten nitride, titanium nitride, tantalum nitride, etc.

Figure 66:
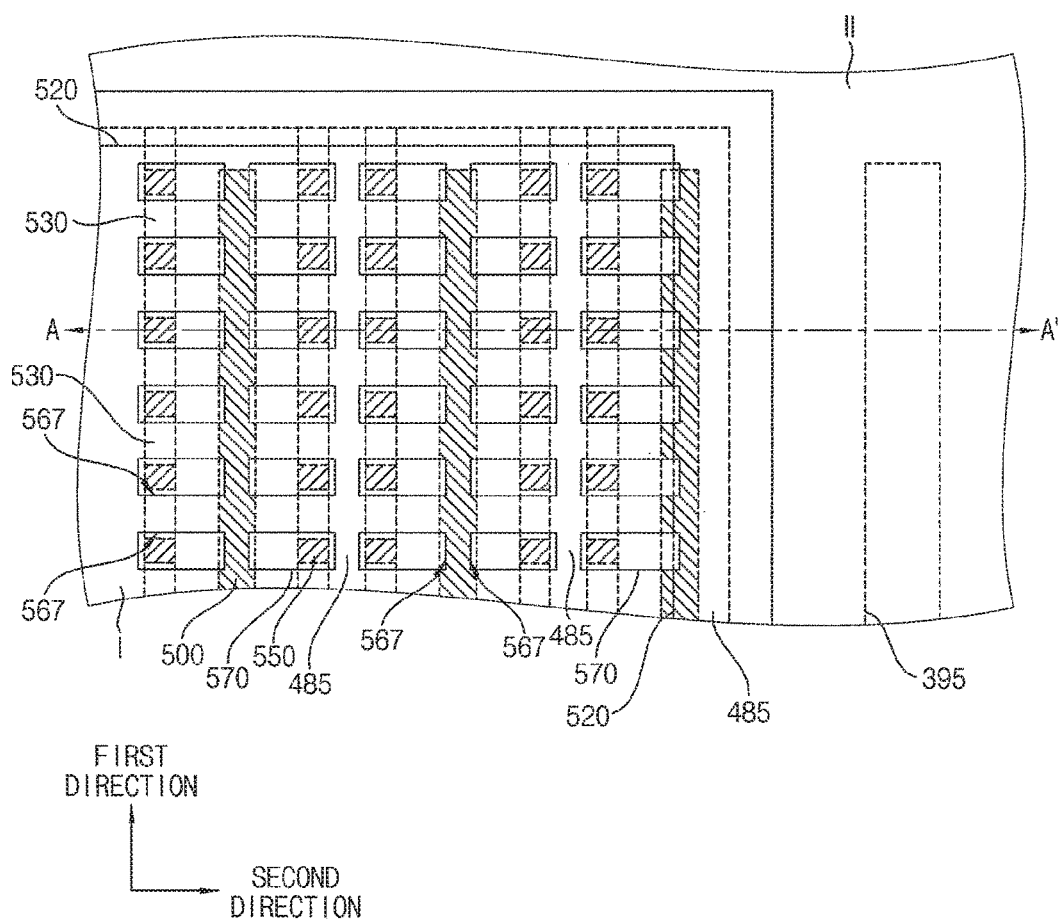
Figure 67:
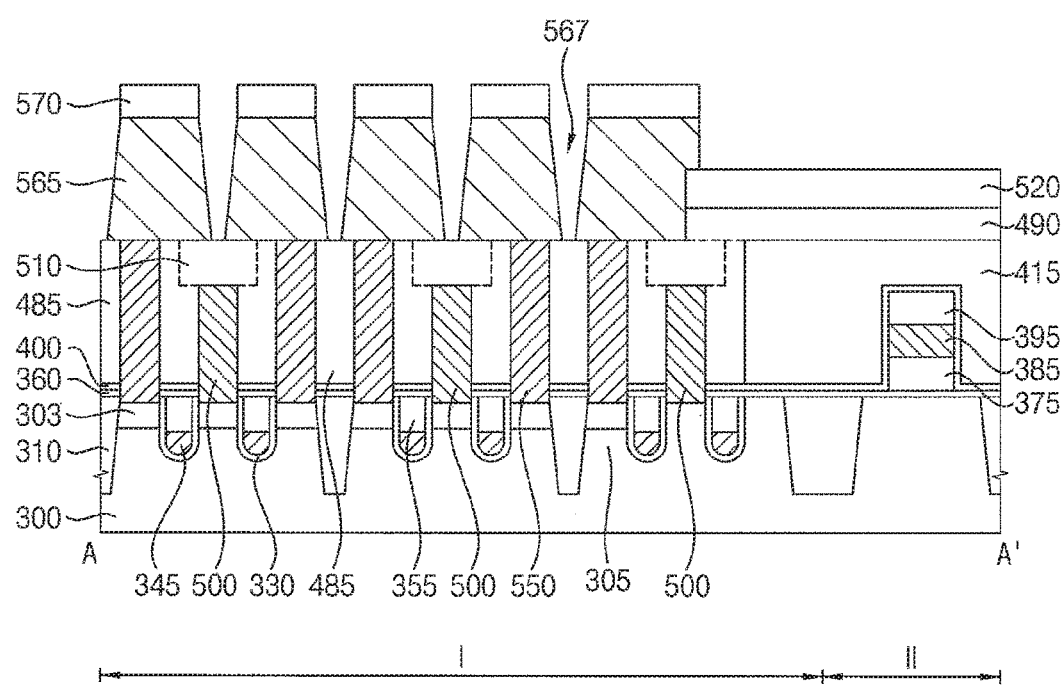

Referring to FIGS. 66 and 67, a fifth mask 570 may be formed on the conductive pad layer 560, and the conductive pad layer 560 may be patterned using the fifth mask 570 as an etching mask to form conductive pads 565.

In example embodiments, the conductive pads 565 may cover the respective contact plugs 550, respectively, and each of the conductive pads 565 may have a width in the second direction that may be greater than a width of its corresponding contact plug 550.

The spaces between the contact plugs 550 may be referred to as twelfth openings 567.

Figure 68:
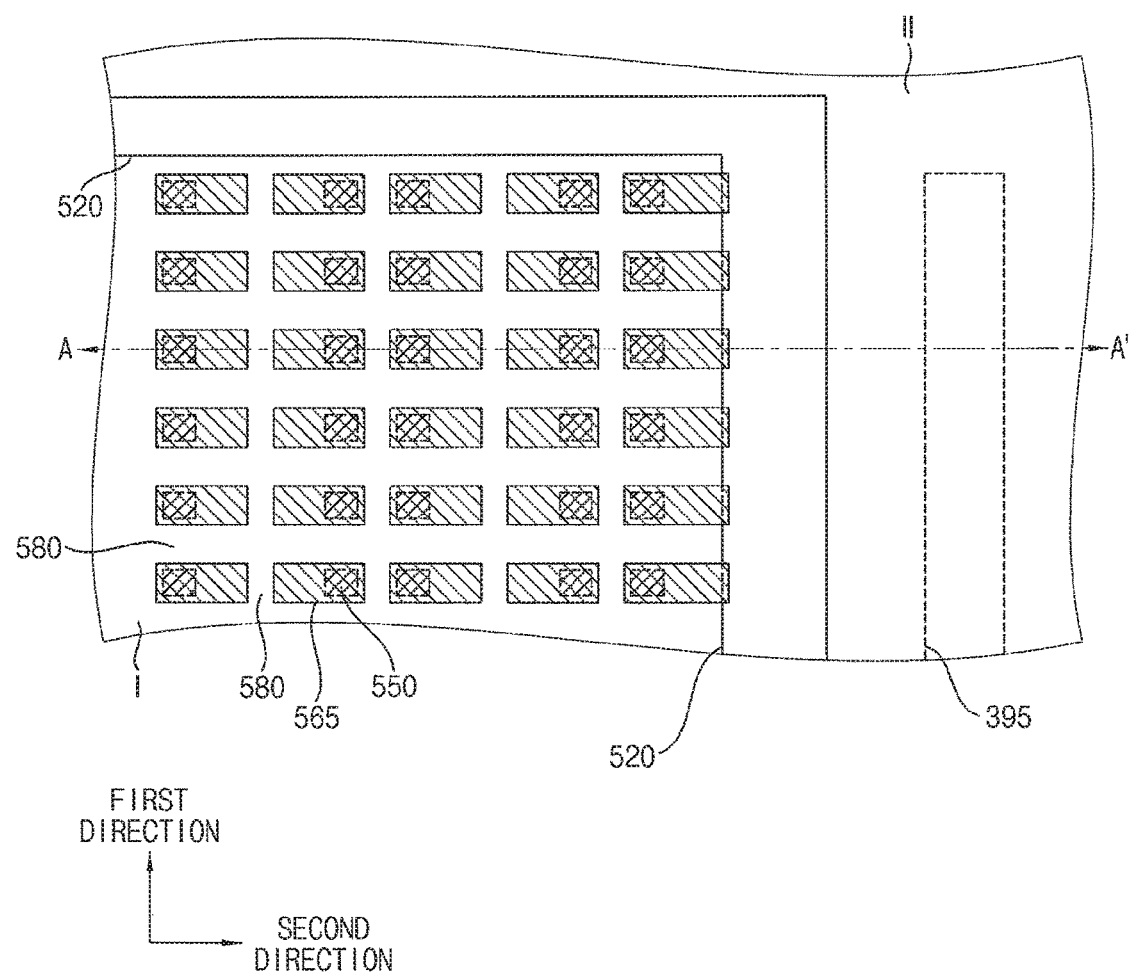
Figure 69:
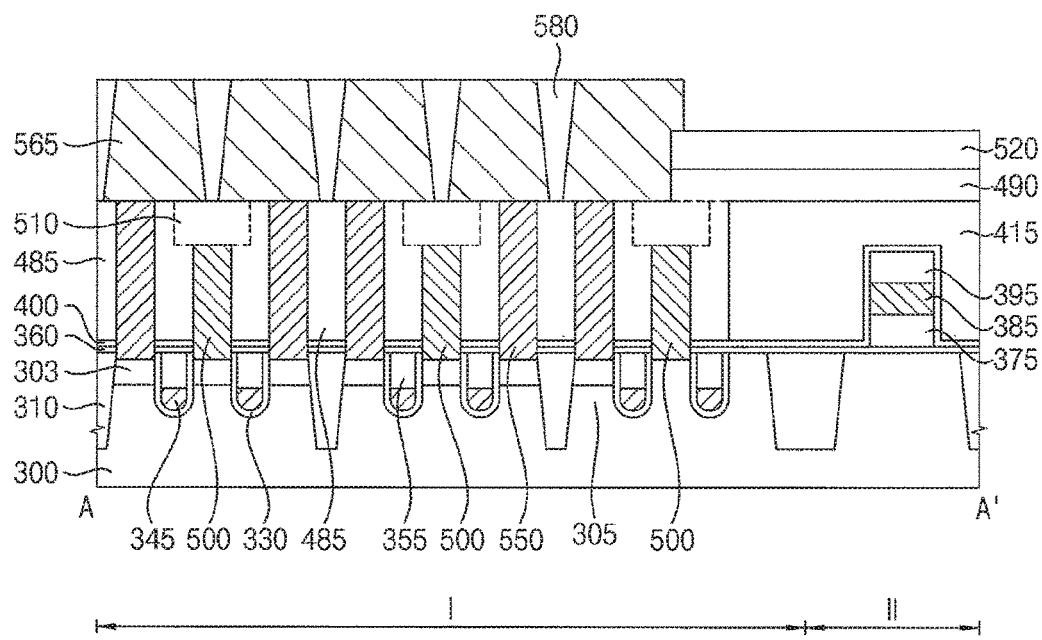

Referring to FIGS. 68 and 69, a second insulation layer 580 may be formed to fill the twelfth openings 567.

The second insulation layer 580 may be, e.g., silicon nitride.

Figure 70:
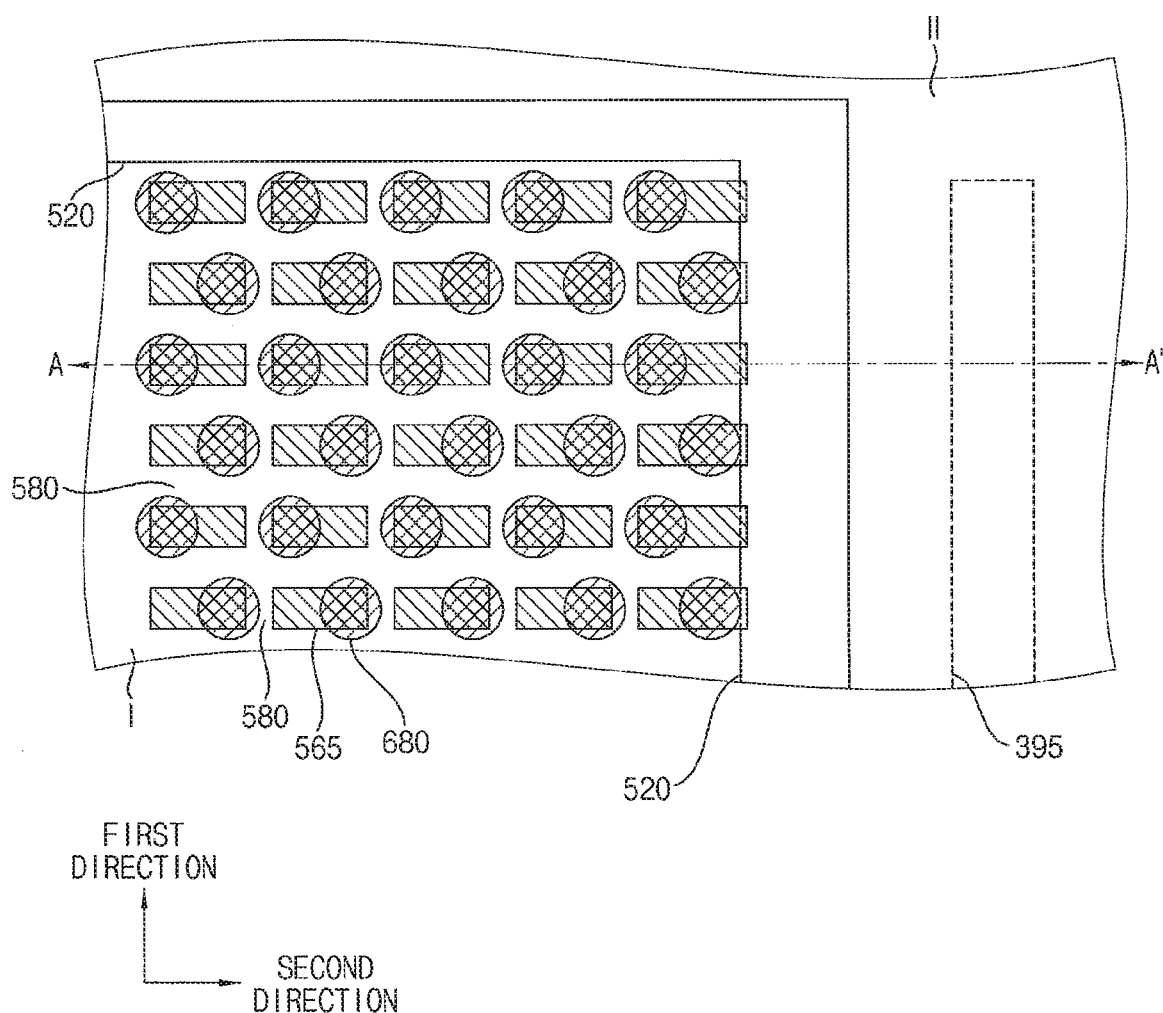
Figure 71:
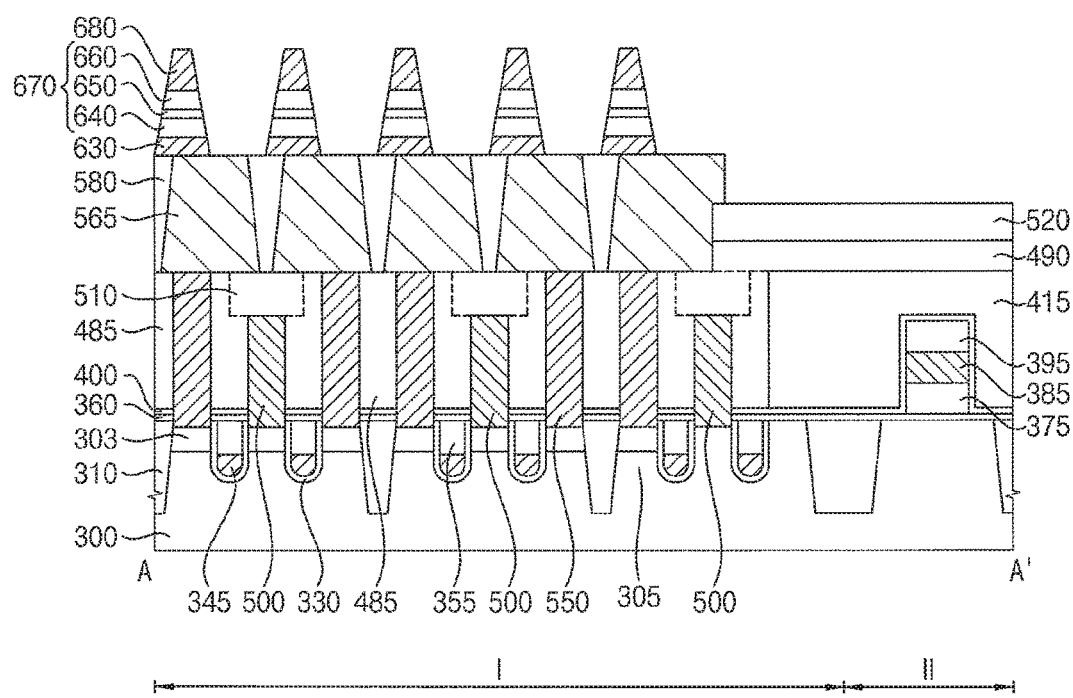

Referring to FIGS. 70 to 71, a process substantially the same as or similar to that illustrated with reference to FIG. 1 may be performed.

Thus, a memory unit including a lower electrode 630, an MTJ structure 670 and an upper electrode 680 sequentially stacked and contacting each conductive pad 565 may be formed on each conductive pad 565 and the second insulation layer 580. In an example embodiment, the MTJ structure 670 may include a fixed layer structure pattern 640, a tunnel barrier layer pattern 650 and a free layer pattern 660 that are sequentially stacked.

Figure 72:
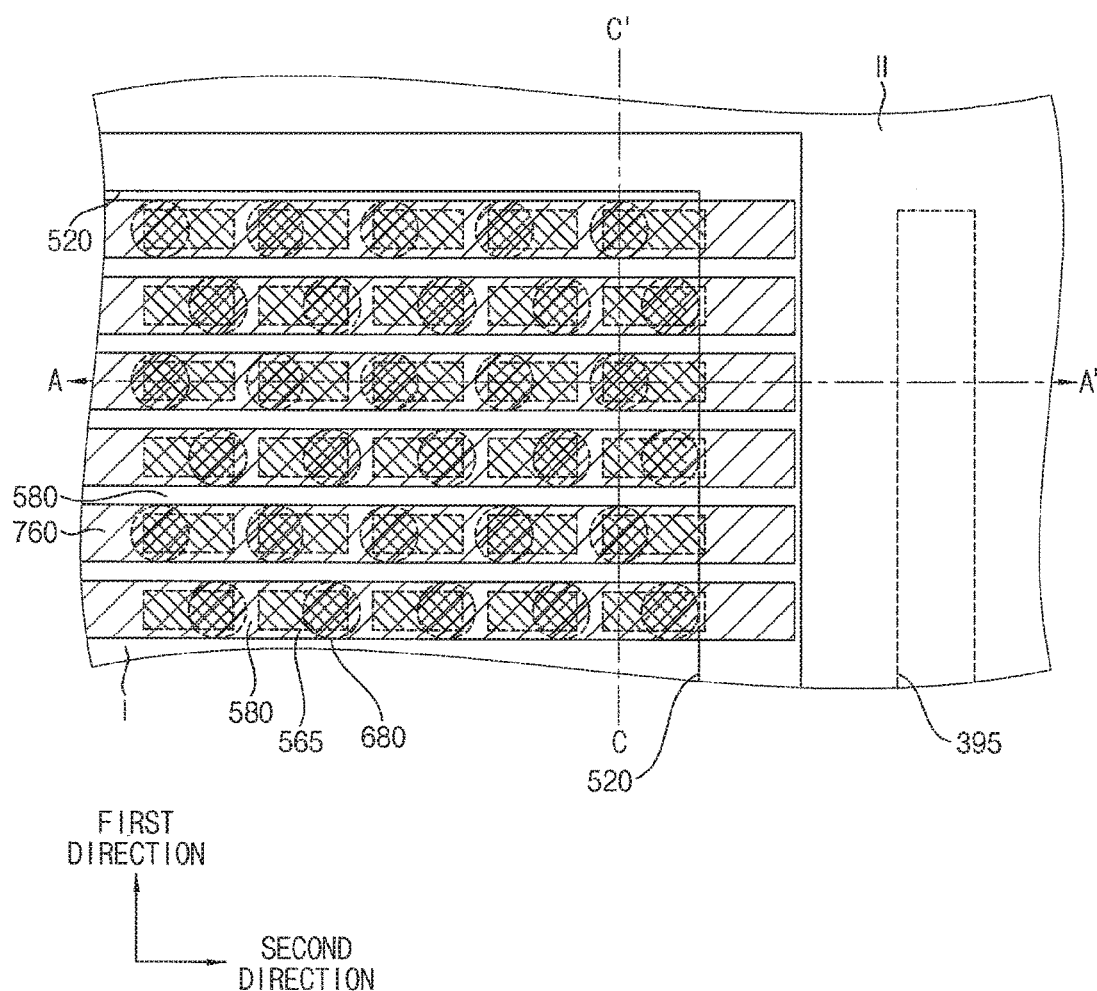
Figure 73:
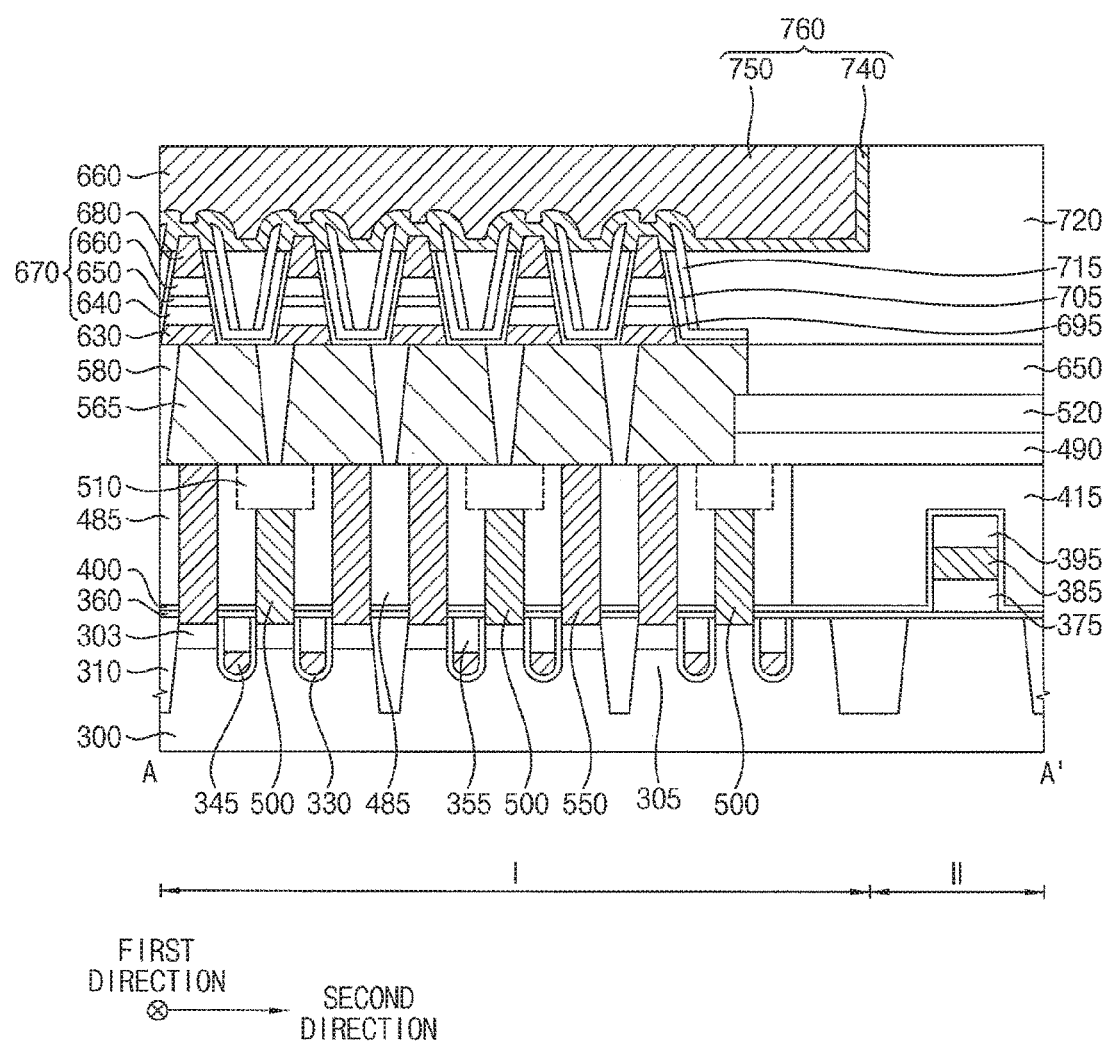

Referring to FIGS. 72 to 74, processes substantially the same as or similar to those illustrated with reference to FIGS. 2 to 7 may be performed to complete the MRAM device.

Particularly, a protective layer structure including a fourth capping layer, a second sacrificial layer and a second etch stop layer that are sequentially stacked may be formed on the conductive pads 565 and the second insulation layer 580 to cover the memory units, a portion of the second etch stop layer of the protective layer structure may be removed to expose a portion of the sacrificial layer, and a second insulating interlayer 720 may be formed on the protective layer structure. The second insulating interlayer 720 and portions of the sacrificial layer on top surfaces of the memory units may be removed to form an opening that exposes a portion of the capping layer, and the exposed portion of the capping layer may be removed to expose the upper electrode 680. A wiring 760 may be formed on the upper electrode 680 to fill the opening.

Thus, a protective pattern structure including a sequentially stacked fourth capping pattern 695, a second sacrificial pattern 705 and a second etch stop pattern 715 may be formed on sidewalls of the memory units, and the wiring 760 extending in the second direction and contacting the top surfaces of the memory units may be formed to include a metal pattern 750 and a barrier pattern 740 that covers a bottom and a sidewall of the metal pattern 750. In example embodiments, a plurality of wirings 760 may be formed in the first direction, and each of the wirings 760 may serve as a bit line of the MRAM device.

The MRAM device may include a plurality of memory units, and a planarization process, e.g., a CMP process may not be performed in order to form the wiring 760 that commonly contacts the memory units. Thus, a portion of the memory units, e.g., the upper electrodes 680 of ones of the memory units disposed at outermost positions may not be etched to be damaged. Accordingly, the MTJ structures 670 under the upper electrodes 680, respectively, may not be electrically short-circuited.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concepts. Accordingly, all such modifications are intended to be included within the scope of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a magnetoresistive random access memory (MRAM) device, comprising:

forming a memory unit on a substrate, the memory unit including a lower electrode, a magnetic tunnel junction (MTJ) structure and an upper electrode that are sequentially stacked;

forming a protective layer structure on the substrate to cover the memory unit, the protective layer structure including a capping layer, a sacrificial layer and an etch stop layer that are sequentially stacked;

partially removing the etch stop layer to expose a portion of the sacrificial layer;

forming an insulating interlayer on the protective layer structure, wherein forming the insulating interlayer on the protective layer structure includes forming the insulating interlayer on the exposed portion of the sacrificial layer;

partially removing the insulating interlayer to form an opening exposing the protective layer structure, wherein the opening is formed to expose the exposed portion of the sacrificial layer;

at least partially removing the exposed protective layer structure to expose the upper electrode; and forming a wiring in the opening on the exposed upper electrode.

2. The method of claim 1, wherein partially removing the etch stop layer to expose the portion of the sacrificial layer includes performing an anisotropic etching process on the etch stop layer, so that portions of the etch stop layer except for a portion of the etch stop layer on a sidewall of the memory unit are removed to expose the portion of the sacrificial layer, the exposed portion of the sacrificial layer being on a top surface of the memory unit.

3. The method of claim 1, wherein at least partially removing the exposed protective layer structure to expose the upper electrode includes:

removing the exposed portion of the sacrificial layer to expose a portion of the capping layer; and removing the exposed portion of the capping layer to expose the upper electrode.

4. The method of claim 3, wherein the sacrificial layer includes a material having etching selectivity with respect to both the capping layer and the etch stop layer, and wherein when the exposed portion of the sacrificial layer is removed to expose the portion of the capping layer, the etch stop layer and the capping layer are not removed.

5. The method of claim 3, wherein partially removing the insulating interlayer to form the opening exposing the protective layer structure is performed by a dry etching process, wherein removing the exposed portion of the sacrificial layer to expose the portion of the capping layer is performed by a wet etching process, and wherein removing the exposed portion of the capping layer to expose the upper electrode is performed by a wet etching process.

6. The method of claim 3, wherein removing the exposed portion of the sacrificial layer to expose the portion of the capping layer includes removing a portion of the sacrificial layer on a sidewall of the memory unit to expose a portion of the capping layer on the sidewall of the memory unit.

7. The method of claim 1, wherein partially removing the insulating interlayer to form the opening exposing the protective layer structure includes forming the opening to expose the exposed portion of the sacrificial layer and at least a portion of the etch stop layer on a sidewall of the memory unit.

8. The method of claim 1, wherein partially removing the insulating interlayer to form the opening exposing the protective layer structure includes forming the opening to expose a portion of the etch stop layer on a top surface of the memory unit.

9. The method of claim 1, wherein the capping layer has a thickness less than that of the etch stop layer.

10. The method of claim 1, wherein the capping layer and the etch stop layer have substantially the same material.

11. The method of claim 10, wherein the capping layer and the etch stop layer include silicon nitride.

12. A method of manufacturing a magnetoresistive random access memory (MRAM) device, comprising:
forming a first structure on a substrate, the first structure including a magnetic tunnel junction (MTJ) structure and an upper electrode on top of the MTJ structure;
forming a layer structure on the substrate to cover the first structure, the layer structure including first, second and third layers sequentially stacked;
partially removing the third layer of the layer structure to form a third layer pattern exposing a portion of the second layer;
forming an insulating interlayer on the layer structure;
partially removing the insulating interlayer to form an opening exposing at least the exposed portion of the second layer;
removing the exposed portion of the second layer to expose a portion of the first layer;
at least partially removing the exposed portion of the first layer to expose the upper electrode; and
forming a bit line on the exposed upper electrode.

13. The method of claim 12, wherein an etching selectivity of the second layer with respect to the first layer is greater than an etching selectivity of the second layer with respect to the insulating interlayer.

14. The method of claim 13, wherein the first and third layers include silicon nitride, and the second layer and the insulating interlayer include silicon oxide.

15. The method of claim 12, wherein an etching selectivity of the second layer with respect to the third layer is greater than an etching selectivity of the second layer with respect to the insulating interlayer.

16. The method of claim 15, wherein partially removing the insulating interlayer to form the opening exposing at least the exposed portion of the second layer includes forming the opening to expose a sidewall of the third layer pattern.

17. A method of manufacturing a magnetoresistive random access memory (MRAM) device, comprising:
forming a first insulating interlayer on a substrate;
forming a contact plug that penetrates the first insulating interlayer;
forming a memory unit on the contact plug, the memory unit comprising a lower electrode, a magnetic tunnel junction (MTJ) on top of the lower electrode, and an upper electrode on top of the MTJ;
forming a capping layer on top of the memory unit;
forming a sacrificial layer on top of the capping layer;
forming an etch stop layer on top of the sacrificial layer;
removing a portion of the etch stop layer that is on top of the memory unit to expose a portion of the sacrificial layer;
forming an insulating interlayer on the exposed portion of the sacrificial layer;
partially removing the insulating interlayer to expose the exposed portion of the sacrificial layer;
removing the exposed portion of the sacrificial layer that is on top of the memory unit;
removing a portion of the capping layer that is on top of the memory unit; and
forming a wiring structure on the upper electrode.

18. The method of claim 17, wherein a top surface of the etch stop layer extends higher above the substrate than does a top surface of the capping layer and a top surface of the sacrificial layer.

19. The method of claim 17, further comprising removing a portion of the sacrificial layer that extends along a first sidewall of the memory unit to form an air gap between a portion of the capping layer that extends along the first sidewall of the memory unit and a portion of the etch stop layer that extends along the first sidewall of the memory unit.

* * * * *